United States Patent [19]

Inoue et al.

[11] Patent Number: 5,707,501
[45] Date of Patent: Jan. 13, 1998

[54] FILTER MANUFACTURING APPARATUS

[75] Inventors: Soichi Inoue, Yokohama; Tadahito Fujisawa, Tokyo; Shin-ichi Ito; Takashi Sato, both of Yokohama; Shuichi Tamamushi, Kawasaki; Keiji Horioka, Yokohama, all of Japan

[73] Assignee: Kabushiki Kaisha Toshiba, Kawasaki, Japan

[21] Appl. No.: 467,600

[22] Filed: Jun. 6, 1995

Related U.S. Application Data

[62] Division of Ser. No. 411,844, Mar. 28, 1995, Pat. No. 5,621,498, which is a continuation of Ser. No. 961,540, Oct. 15, 1992.

[30] Foreign Application Priority Data

| Oct. 15, 1991 | [JP] | Japan | 3-295199 |
| Jan. 20, 1992 | [JP] | Japan | 4-7674 |
| Jan. 20, 1992 | [JP] | Japan | 4-7675 |
| Jan. 20, 1992 | [JP] | Japan | 4-7676 |
| Jan. 20, 1992 | [JP] | Japan | 4-7764 |
| Jan. 20, 1992 | [JP] | Japan | 4-7834 |
| Jan. 20, 1992 | [JP] | Japan | 4-7835 |
| Mar. 27, 1992 | [JP] | Japan | 4-70617 |
| Jul. 14, 1992 | [JP] | Japan | 4-186673 |

[51] Int. Cl.⁶ .................................................. C23C 14/34
[52] U.S. Cl. .............. 204/298.11; 204/298.03; 204/298.28; 204/298.15; 204/298.32; 204/192.26; 204/298.36
[58] Field of Search .................. 204/192.26, 192.27, 204/192.28, 298.03, 298.11, 298.15, 298.23, 298.28, 298.32, 298.36

[56] References Cited

U.S. PATENT DOCUMENTS

| 4,562,093 | 12/1985 | Marino et al. | 204/192.27 X |
| 5,380,558 | 1/1995 | Fujino | 204/192.26 X |
| 5,405,652 | 4/1995 | Kashiwagi et al. | 204/298.11 X |
| 5,482,604 | 1/1996 | Ahonen | 204/298.11 |
| 5,589,042 | 12/1996 | Robinson et al. | 204/192.26 X |

*Primary Examiner*—Nam Nguyen
*Attorney, Agent, or Firm*—Oblon, Spivak, McClelland, Maier & Neustadt, P.C.

[57] ABSTRACT

A projection exposure apparatus is constituted by a first focusing optical system for focusing light from a mercury-vapor lamp as a light source, a uniforming optical system for uniforming the focused light, a second focusing optical system for focusing the uniformed light and radiating the light onto a reticle mask, and a projection optical system for projecting the light, transmitted through the reticle, onto a wafer. The apparatus is designed to project/expose a predetermined mask pattern, formed on the mask, onto the wafer through the projection optical system. A special stop (i.e., a four-eye filter) is arranged as a secondary source for uniformly illuminating the mask. The special stop serves to set an intensity distribution within the exit plane of the secondary source such that intensities in four regions quadruple-symmetrical about the optical axis of the secondary source and decentered therefrom are higher than intensities in other regions. A translucent pattern is formed as the mask on a light-transmitting substrate. The phase difference between light passing through the translucent film and light passing through the light-transmitting substrate is represented by $180 \times (2n+1) \pm 30$ (degree) (where n is an integer). In addition, the apparatus includes a halftone mask which allows an amplitude transmittance T of the translucent film and an amplitude transmittance T0 of the light-transmitting substrate to satisfy $0.01 \times T0 \leq T \leq 0.30 \times T0$. Furthermore, a projection exposure apparatus is provided, in which a light source and a secondary source is coupled to each other through fibers, and an optical modulator is inserted therebetween so that the spatial distribution of light amounts can be electrically and optically controlled.

5 Claims, 65 Drawing Sheets

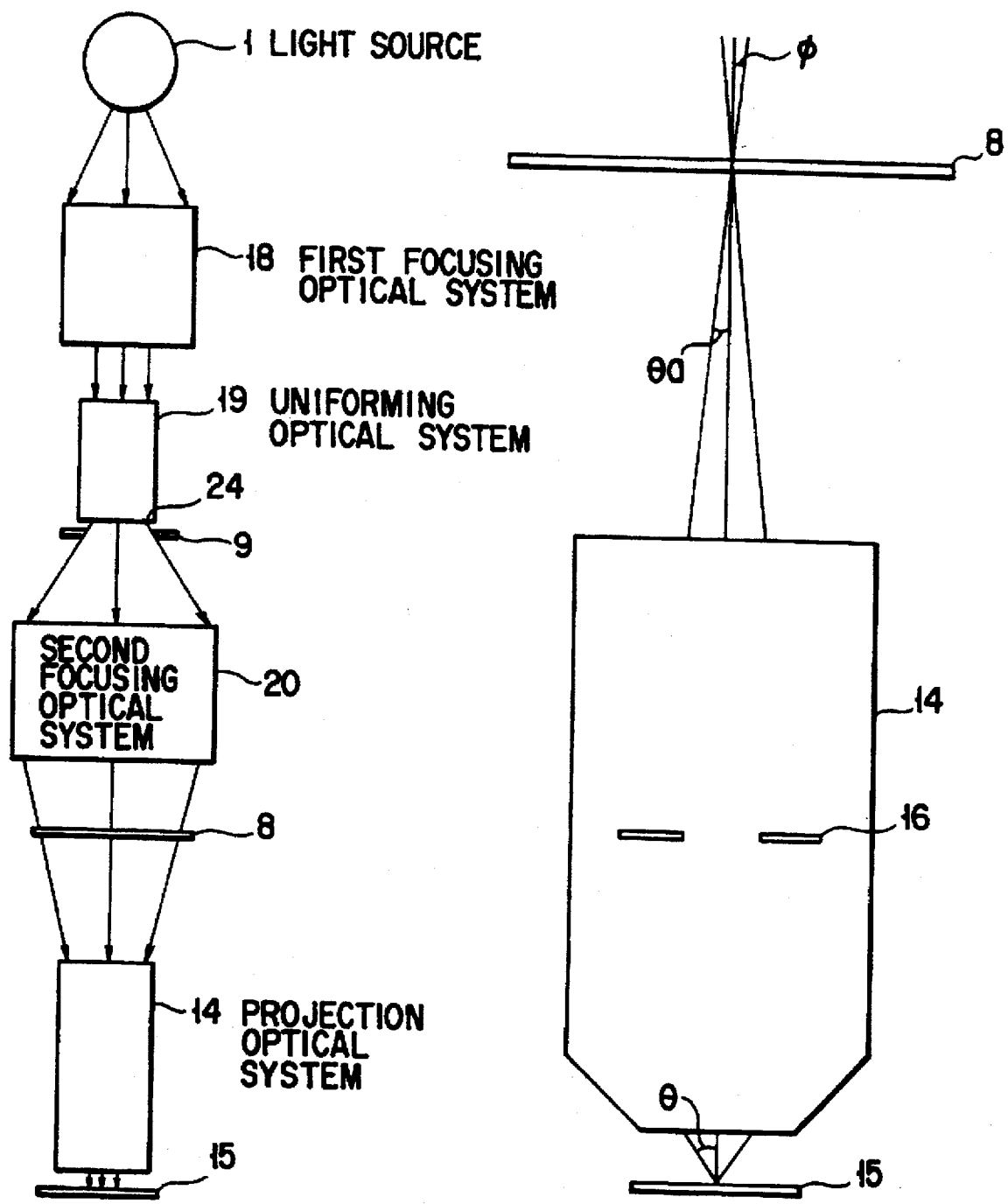
(PRIOR ART) FIG. 2(a)
(PRIOR ART) FIG. 2(b)

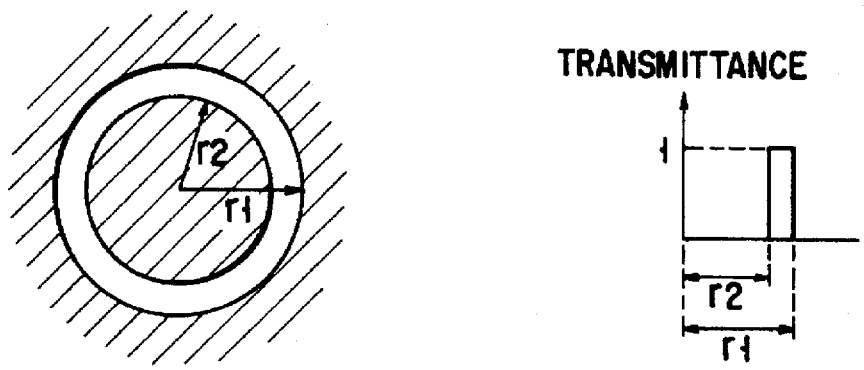
(PRIOR ART)
FIG. 5(a)
(PRIOR ART)
FIG. 5(b)
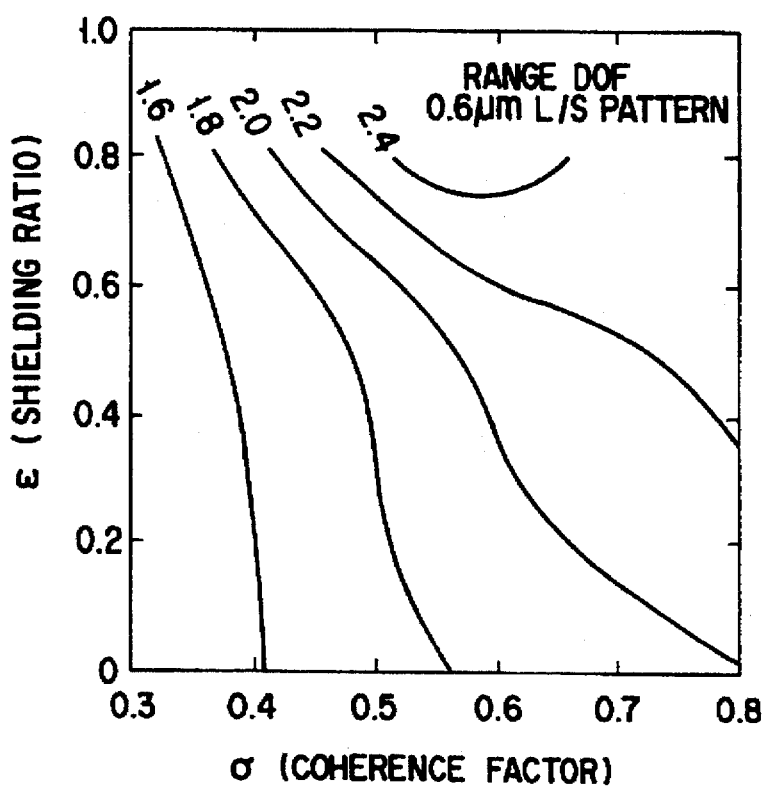
(PRIOR ART)
FIG. 6

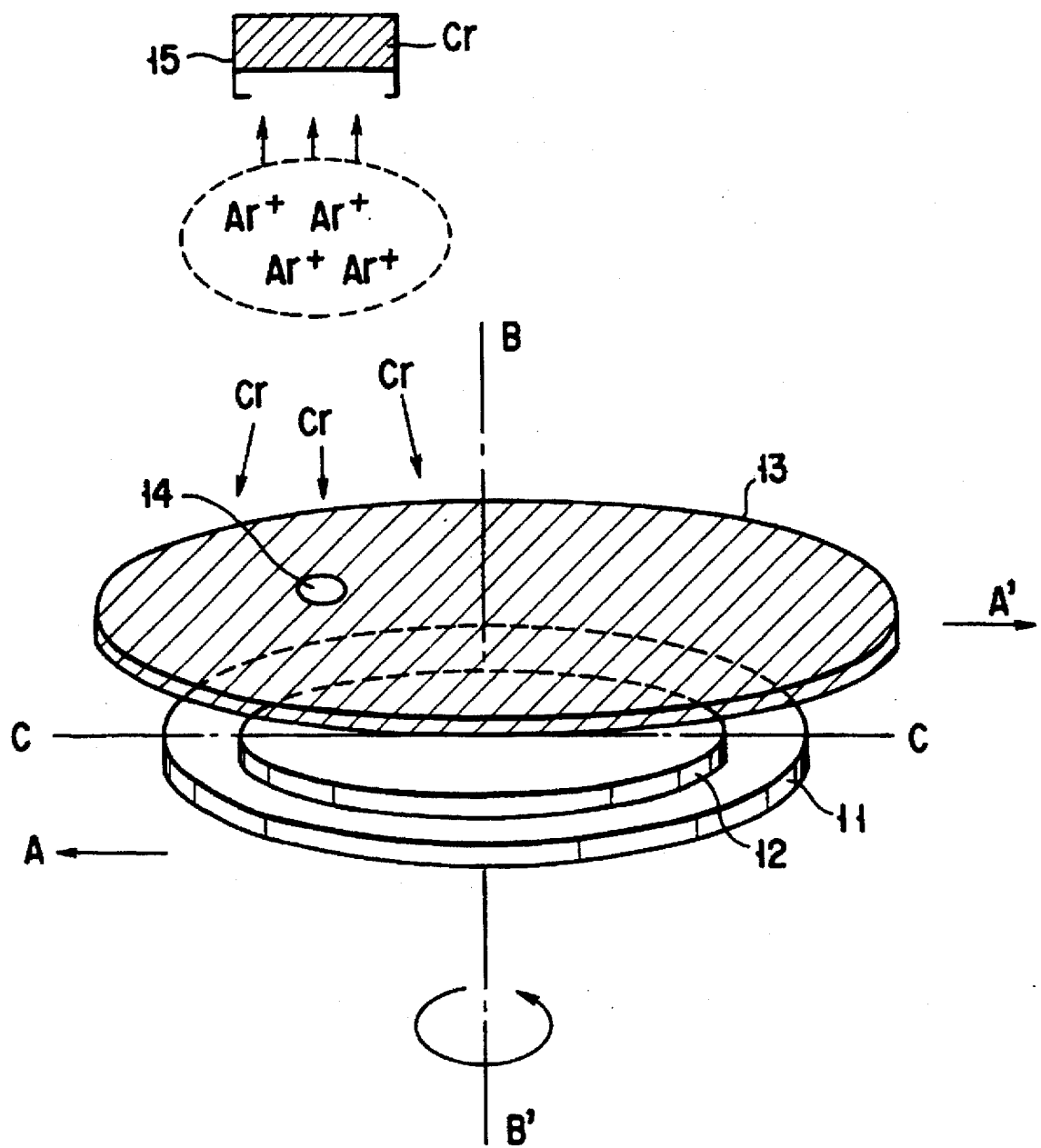
F I G. 15

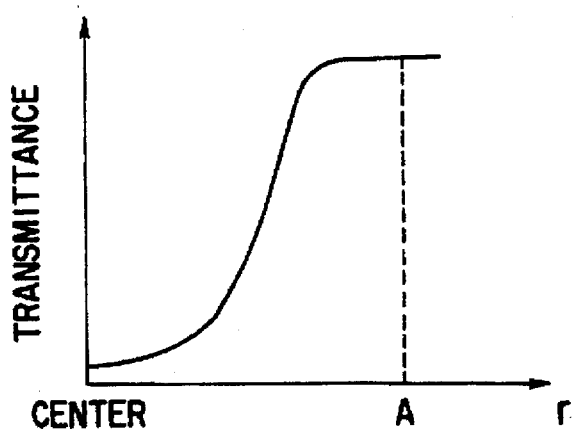
F I G. 16(a)
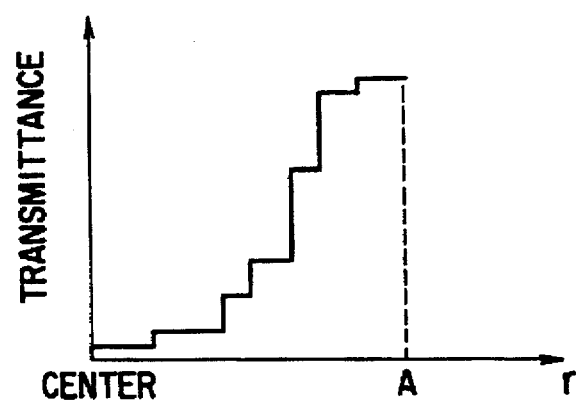
F I G. 16(b)
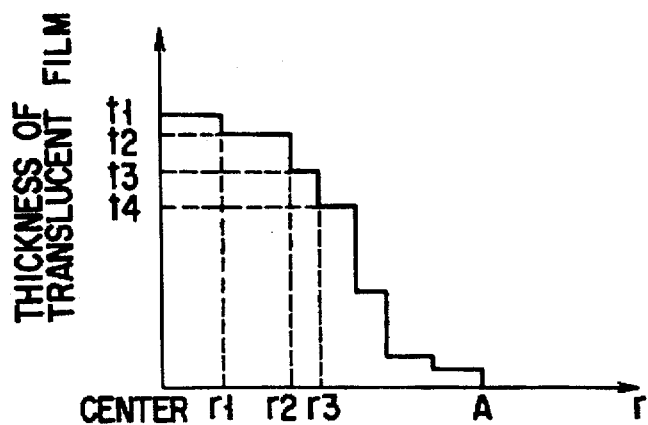
F I G. 16(c)

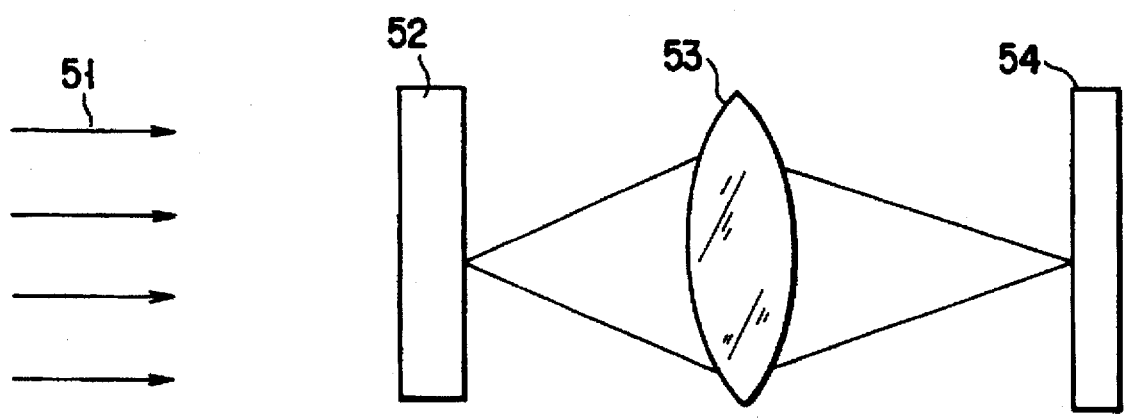
F I G. 20

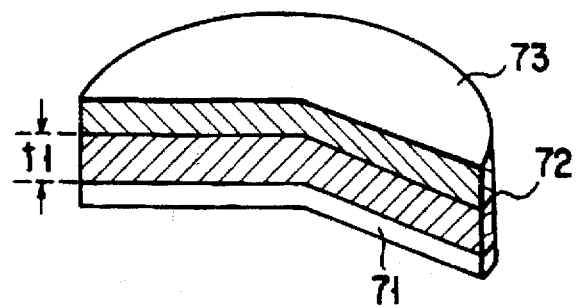
F I G. 22(a)
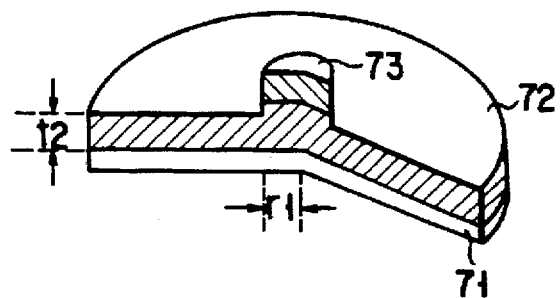
F I G. 22(b)
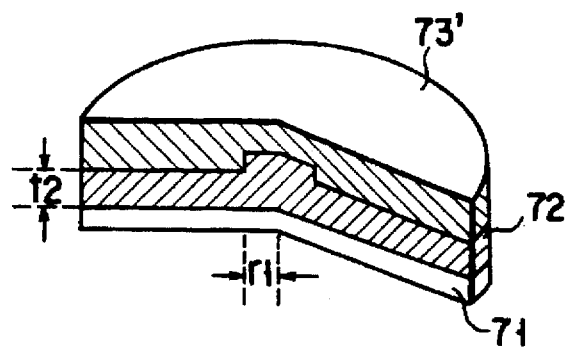
F I G. 22(c)
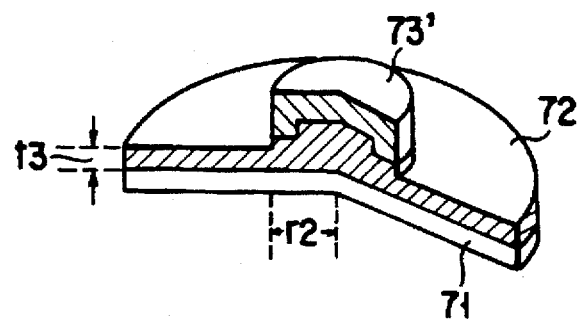
F I G. 22(d)

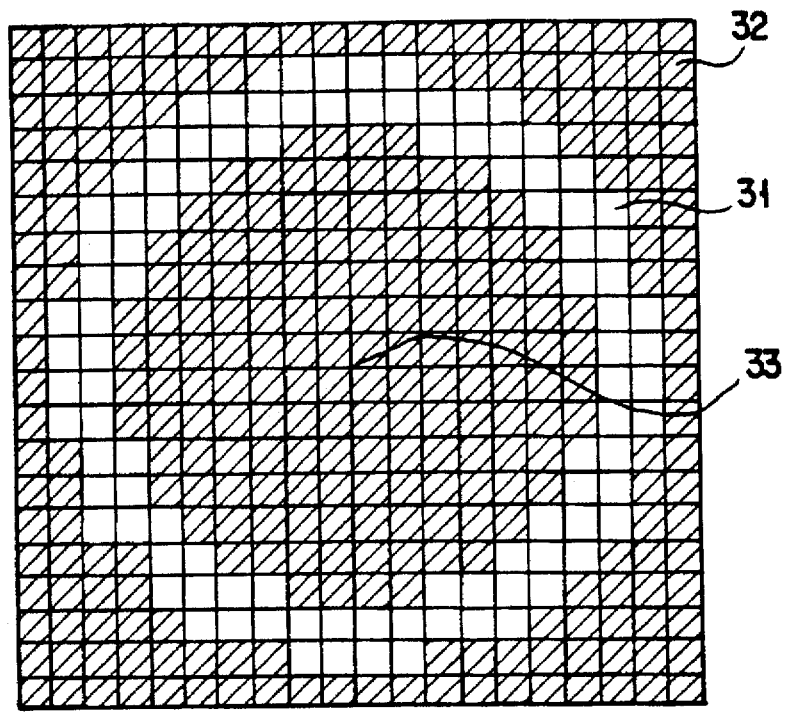
F I G. 24(a)
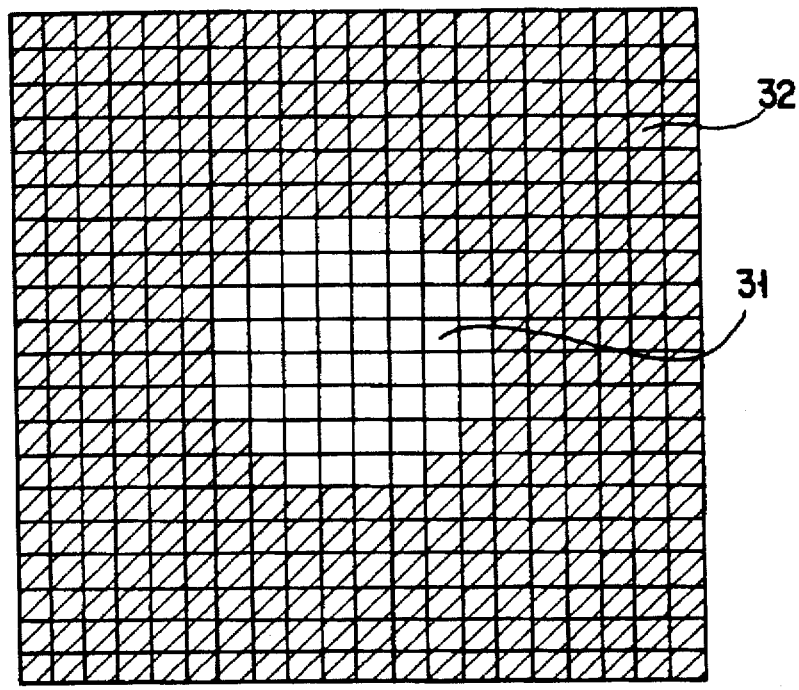
F I G. 24(b)

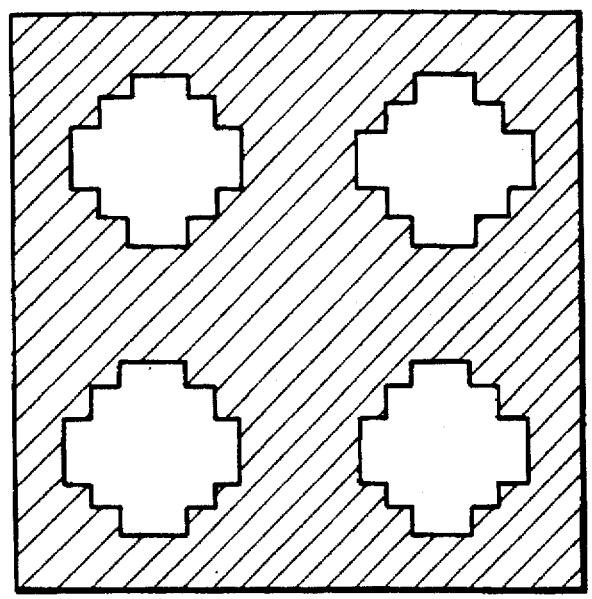
F I G. 26
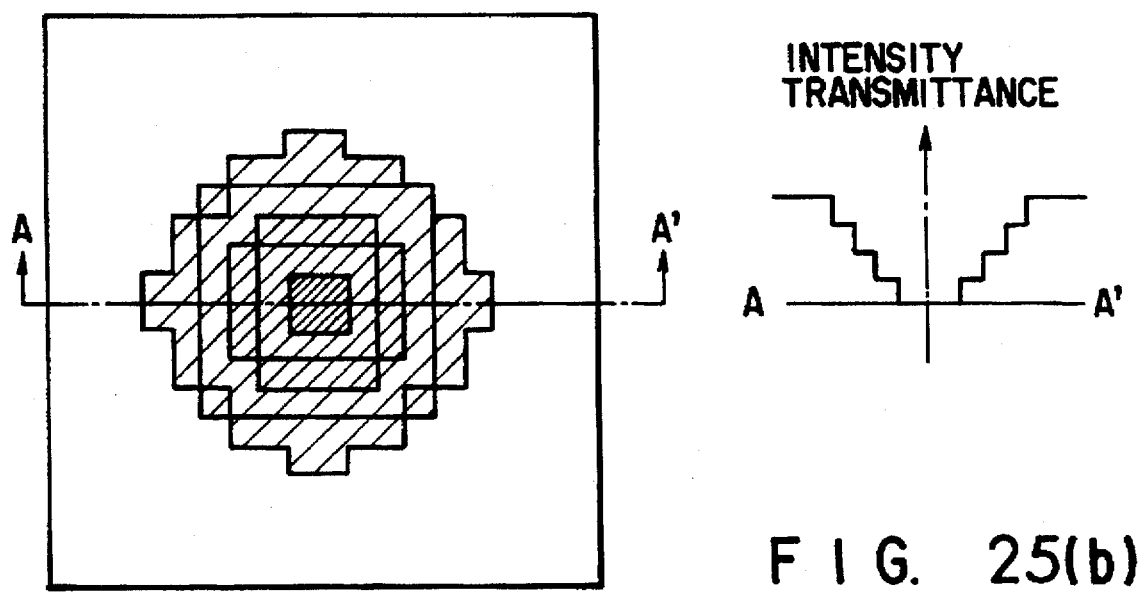
F I G. 25(b)
F I G. 25(a)

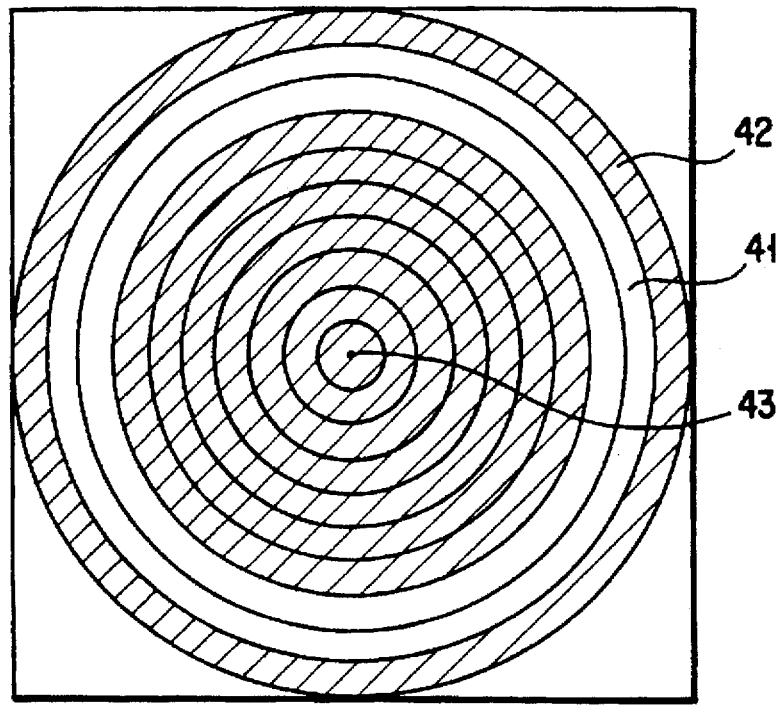
F I G. 27(a)
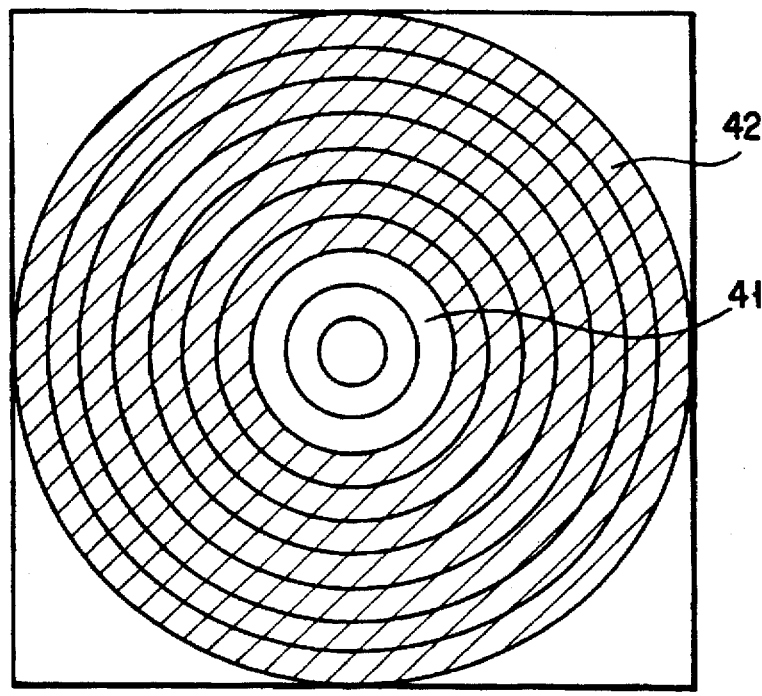
F I G. 27(b)

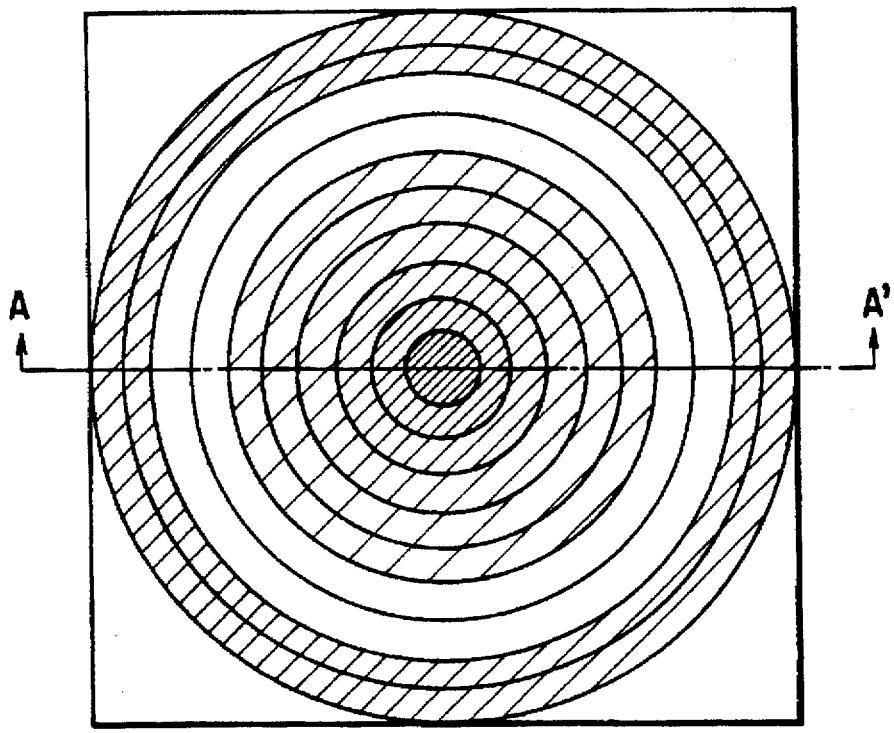
F I G. 28(a)
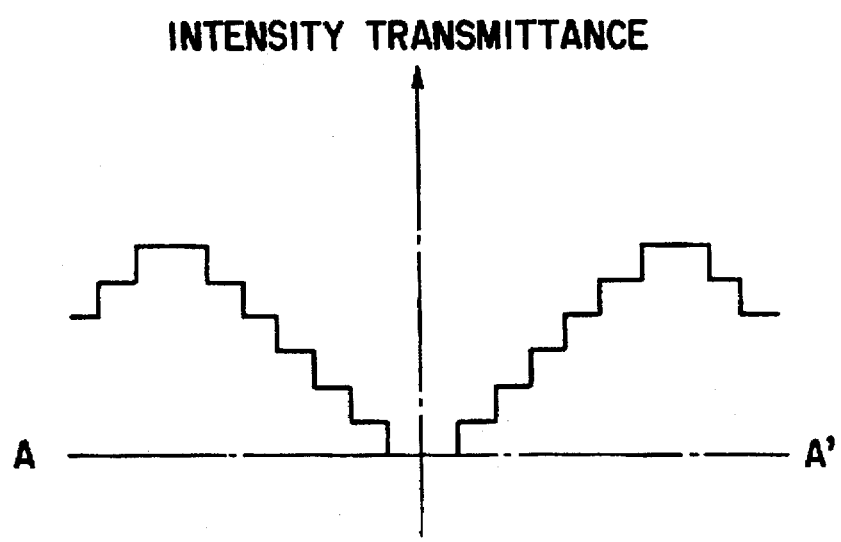
F I G. 28(b)

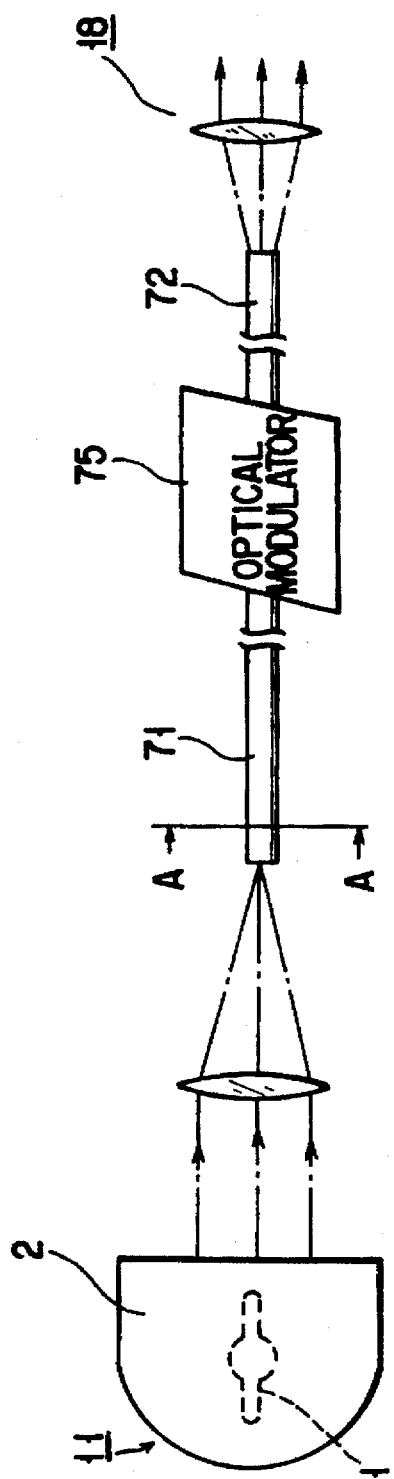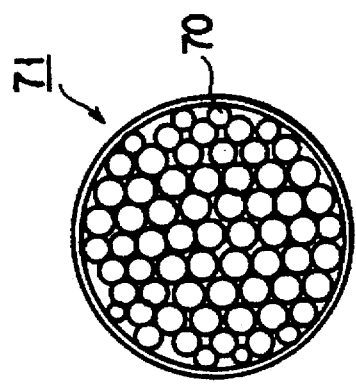
FIG. 29(a)
FIG. 29(b)

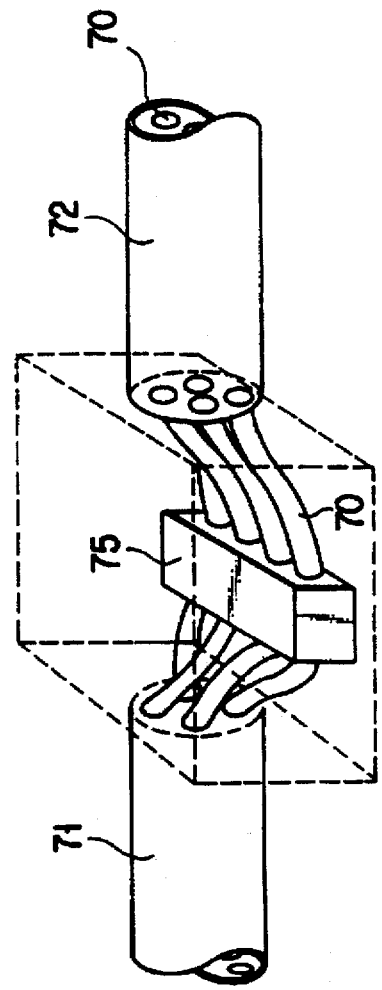
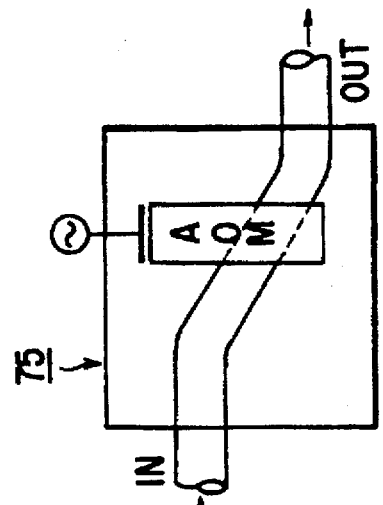
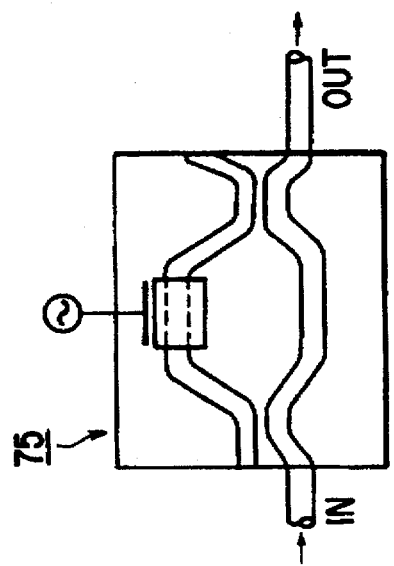
FIG. 30(a)
FIG. 30(b)
FIG. 30(c)

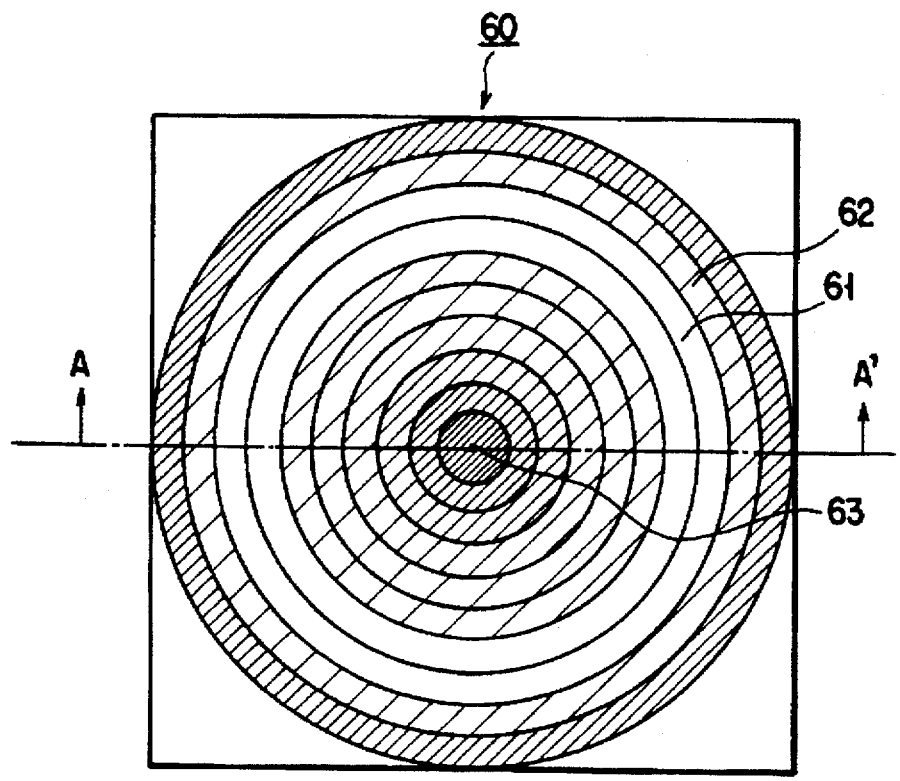
F I G. 33(a)
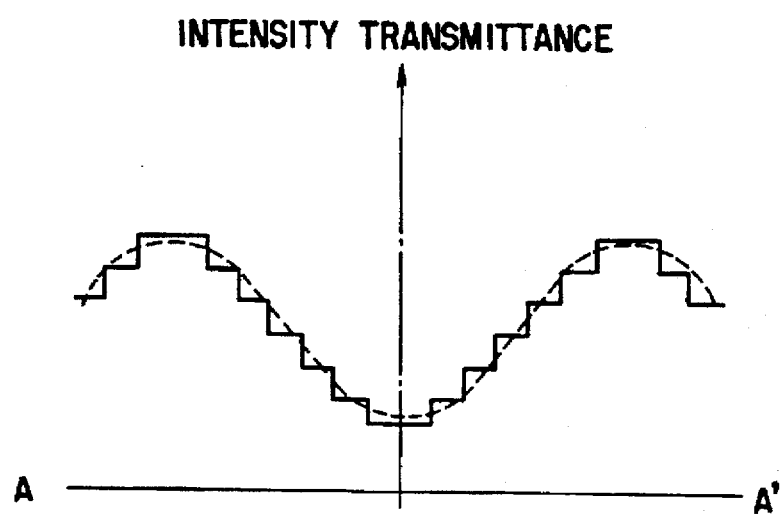
F I G. 33(b)

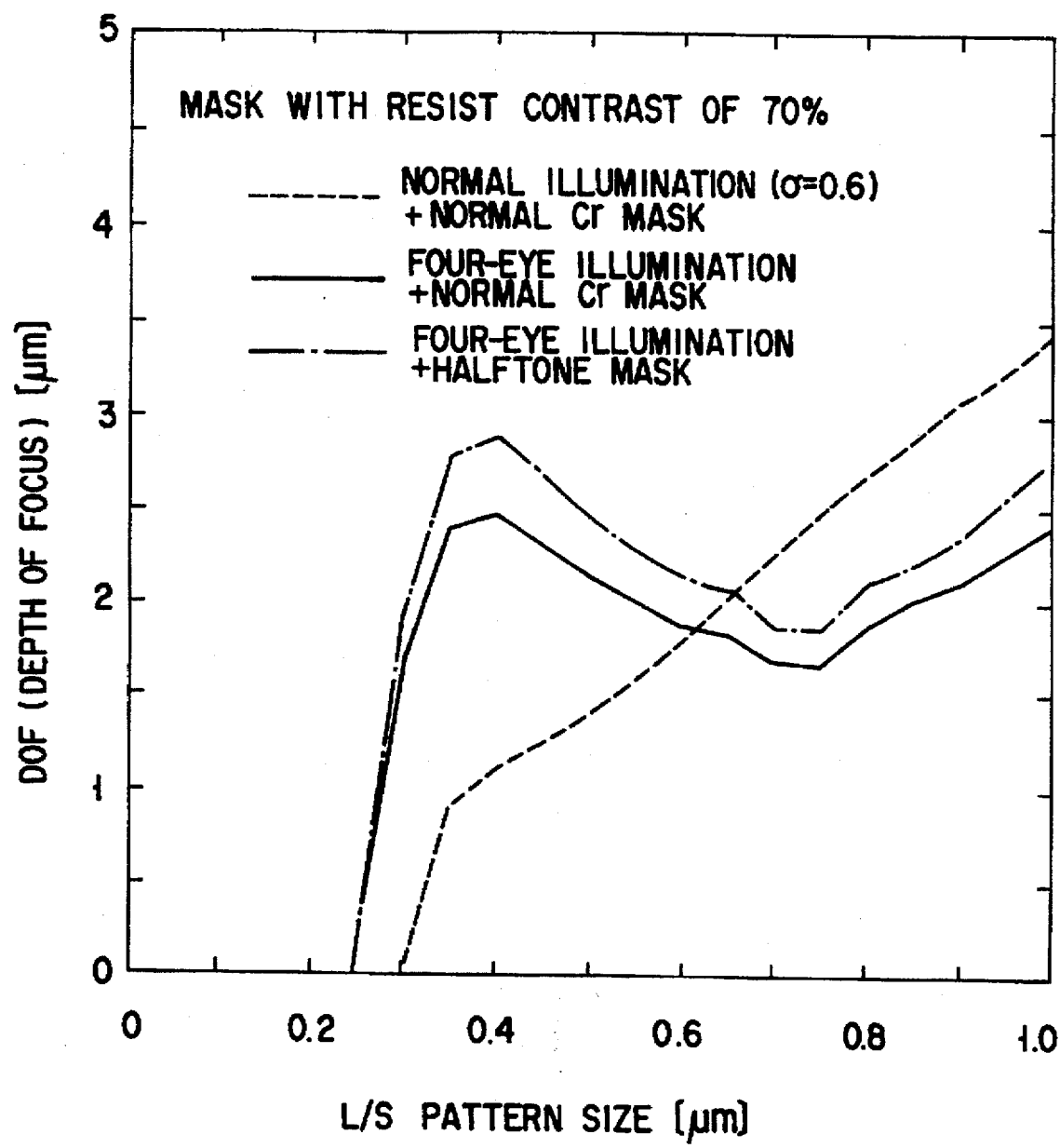
F I G. 35

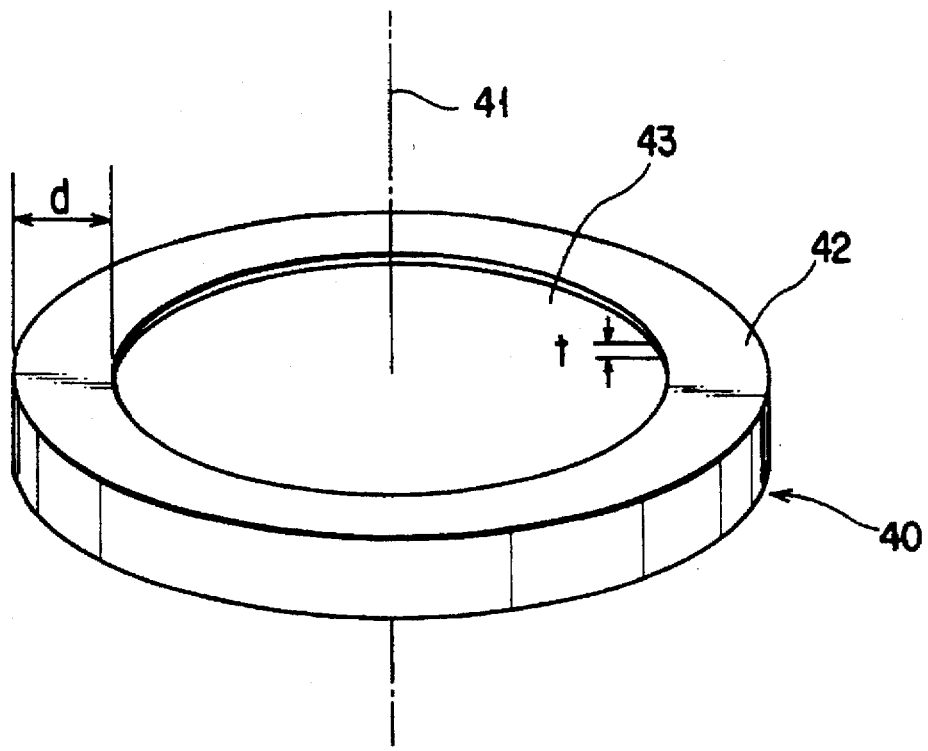
F I G. 39(a)
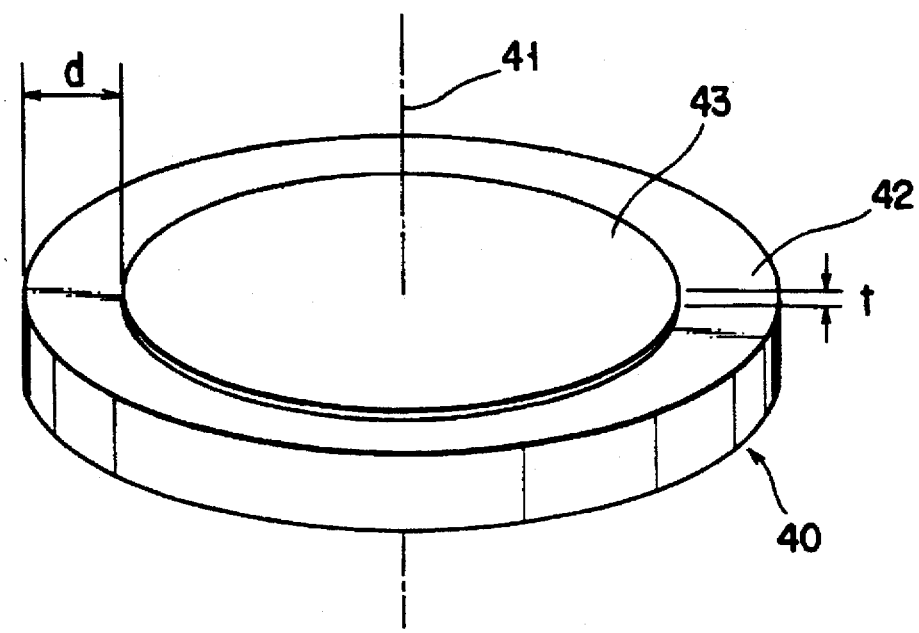
F I G. 39(b)

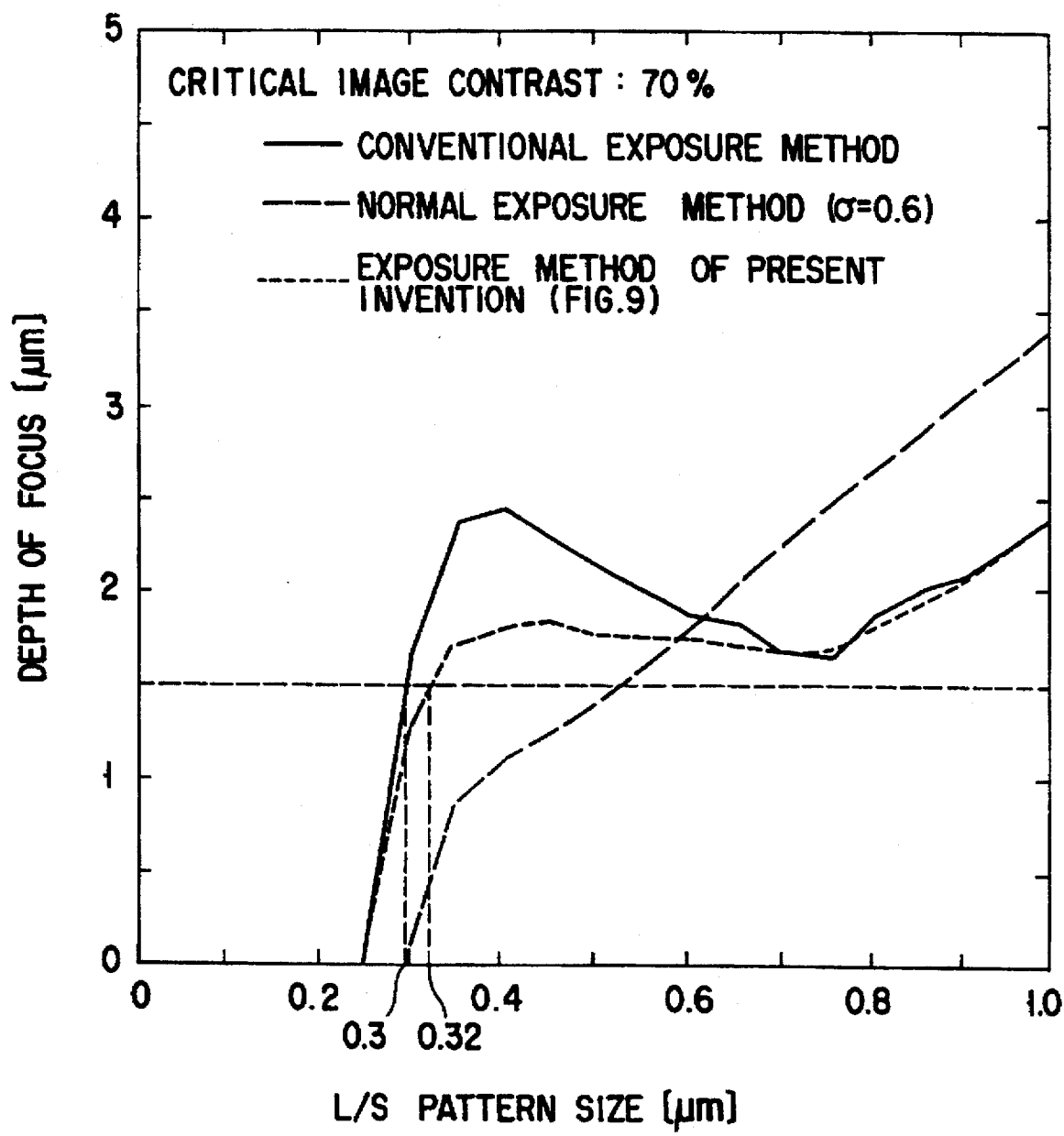
F I G. 44

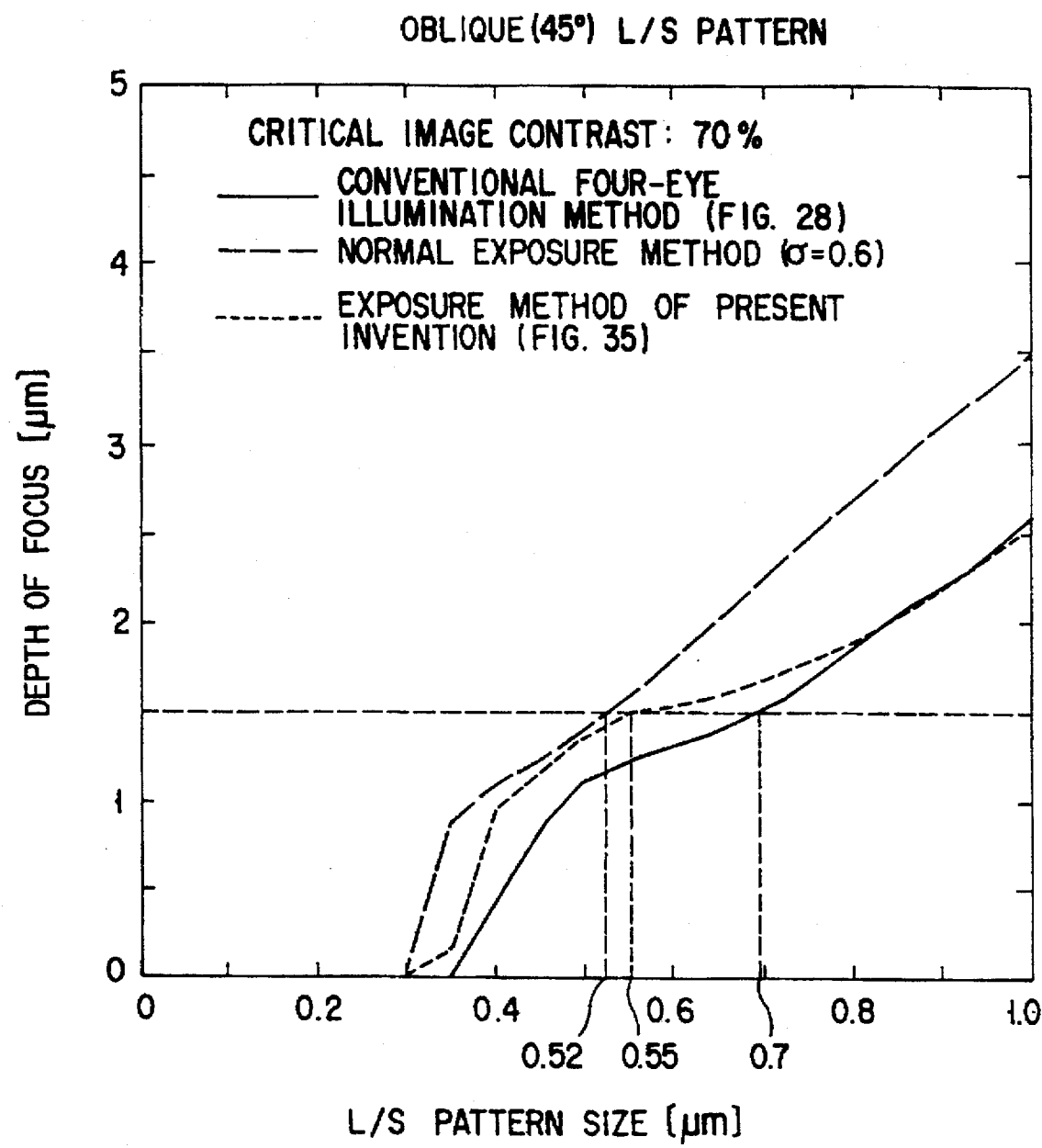
F I G. 45

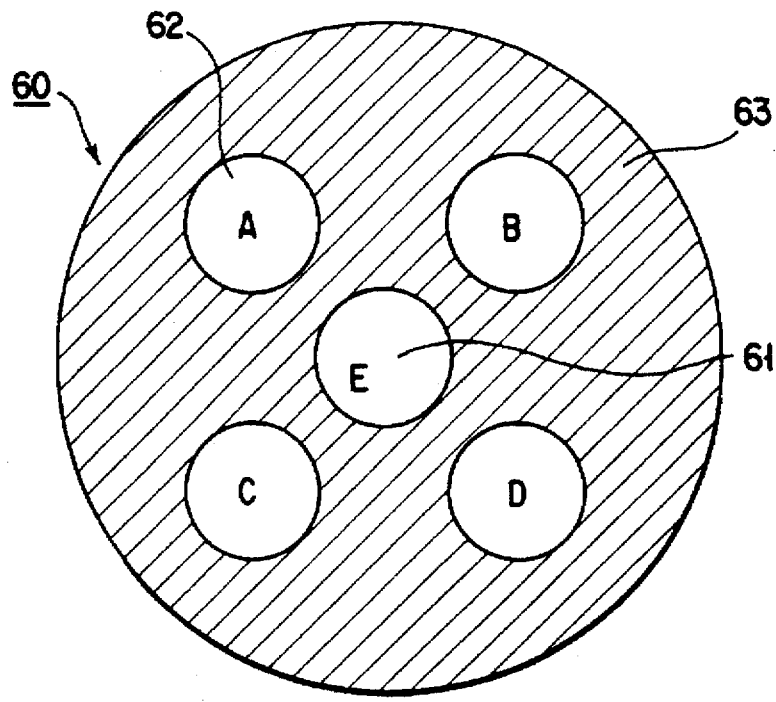
F I G. 46(a)
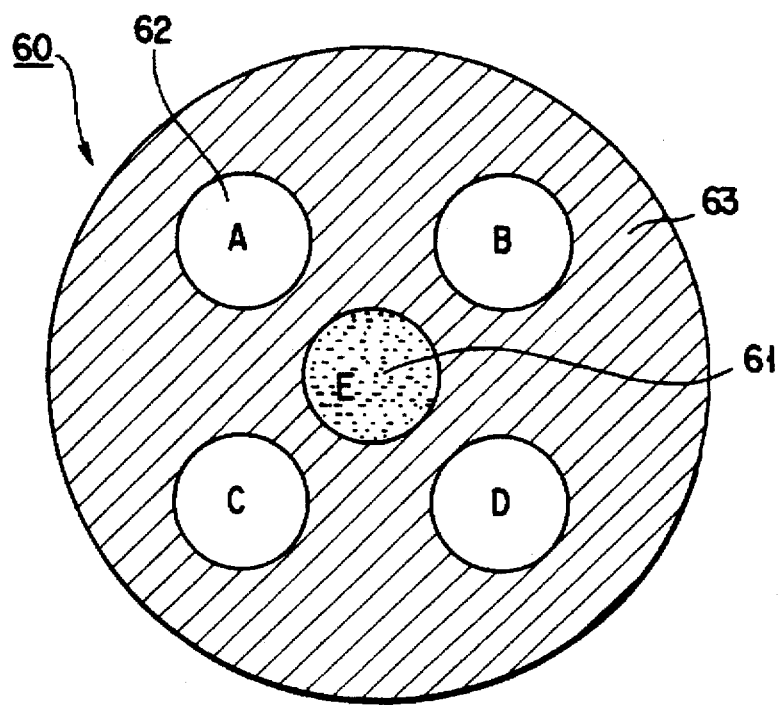
F I G. 46(b)

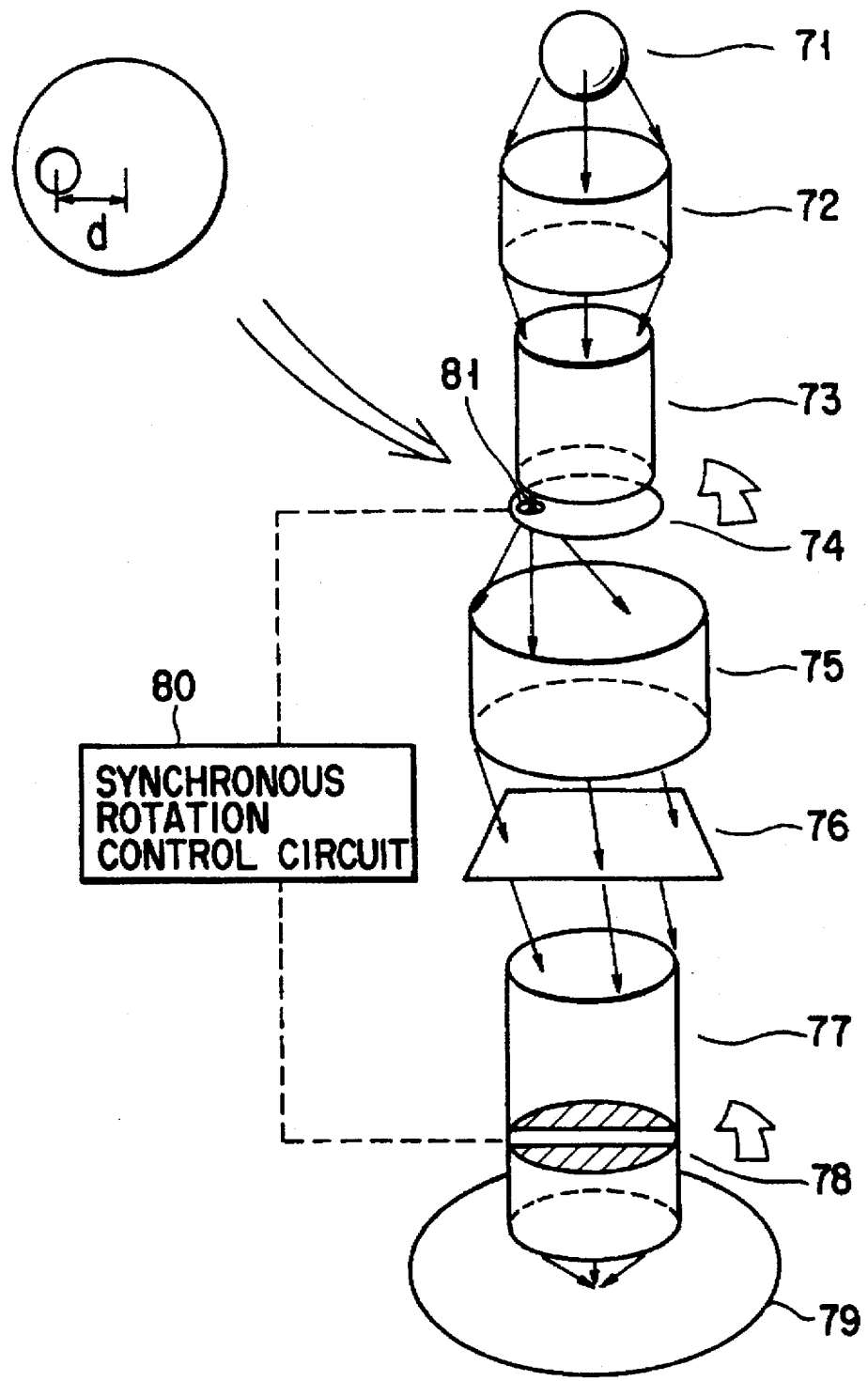
F I G. 49

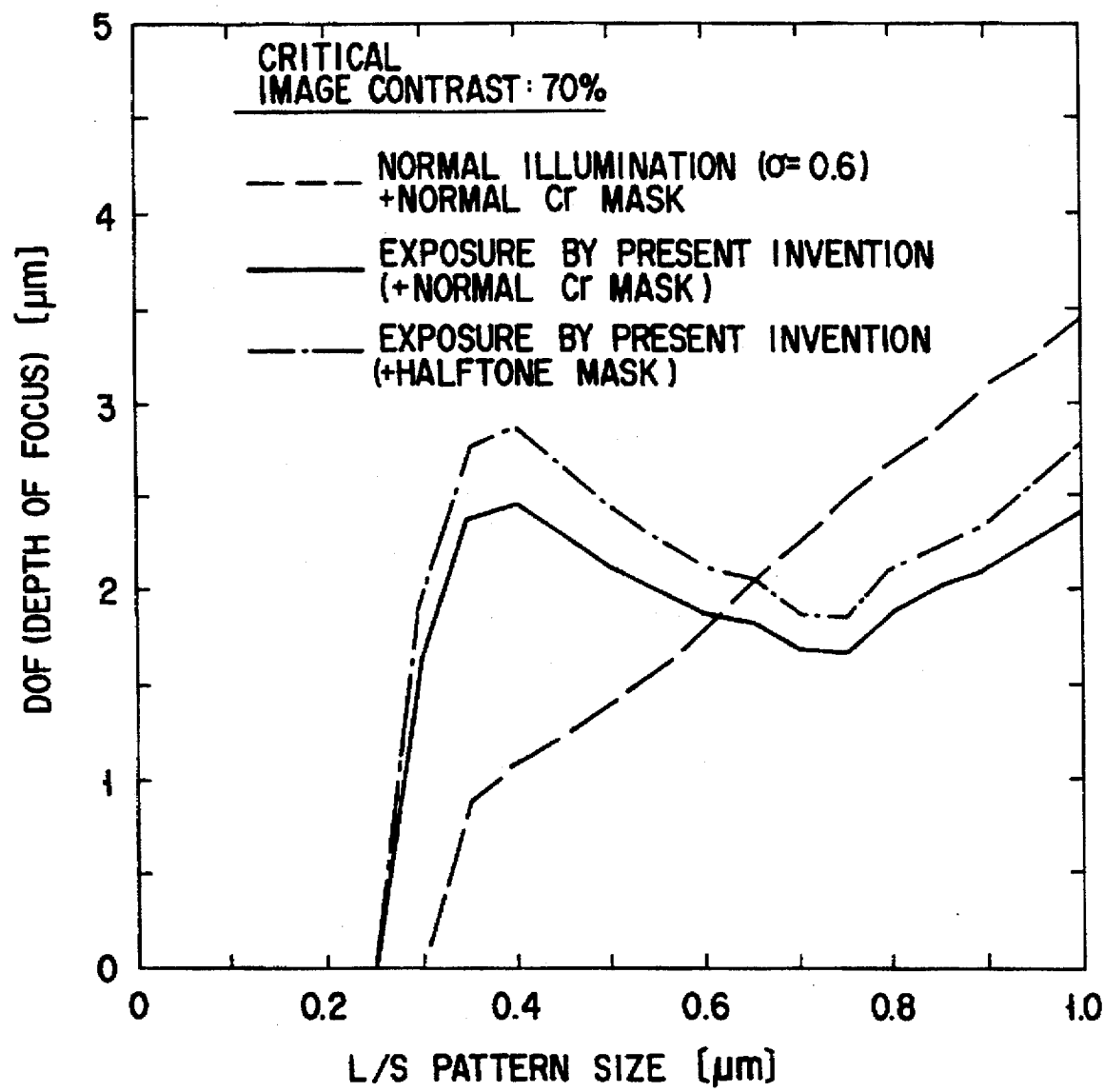
F I G. 50

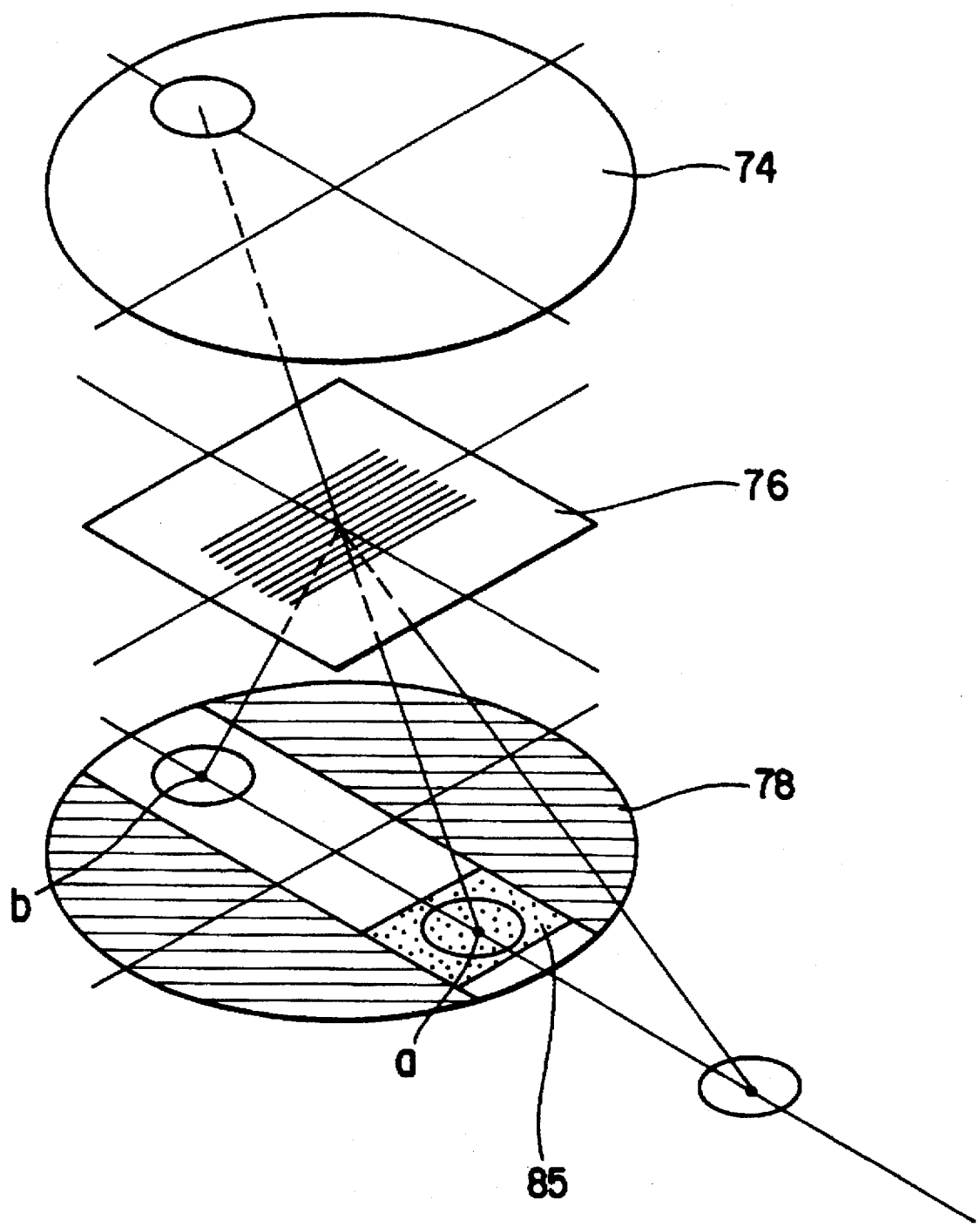
F I G. 51

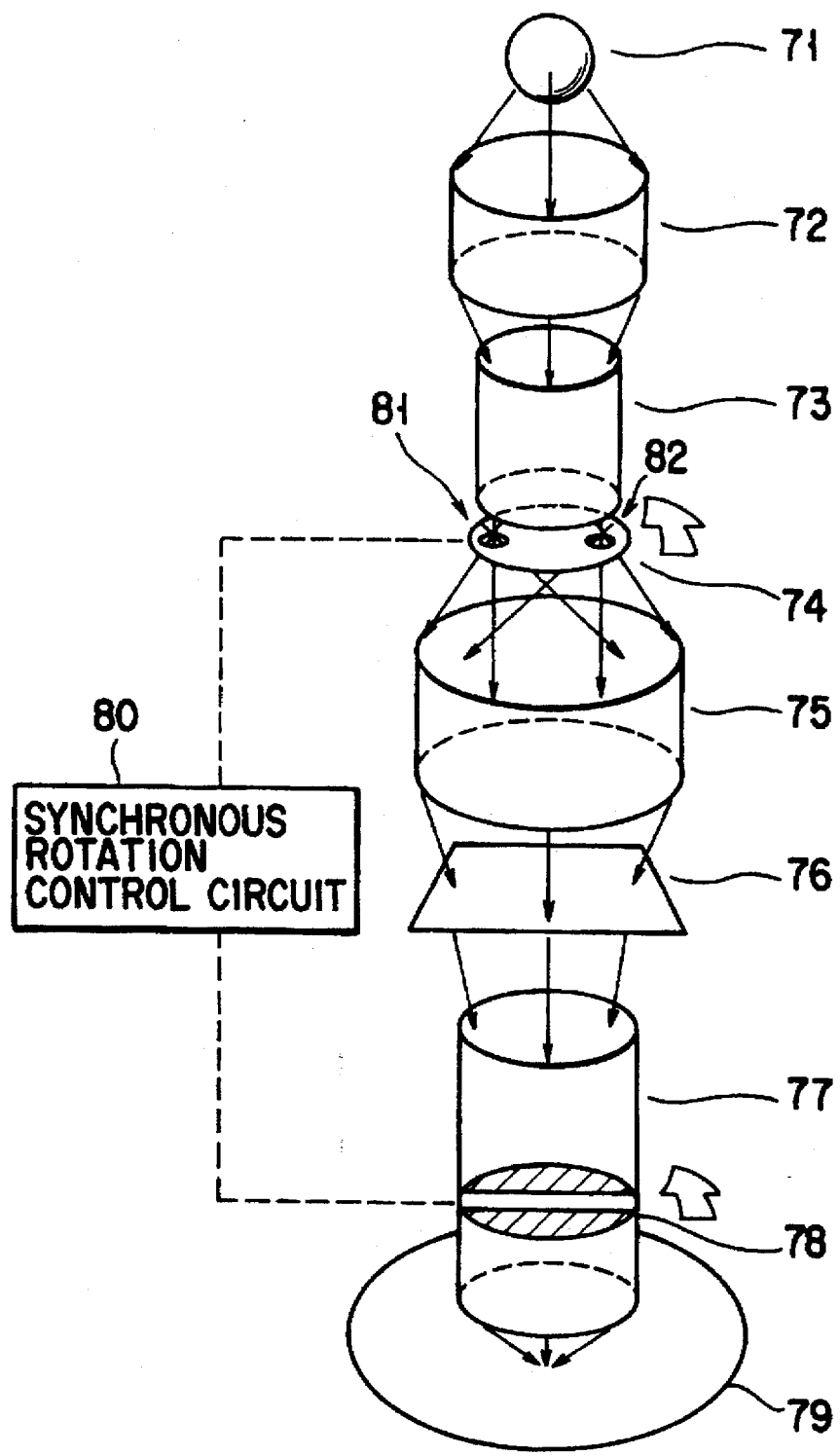
F I G. 52

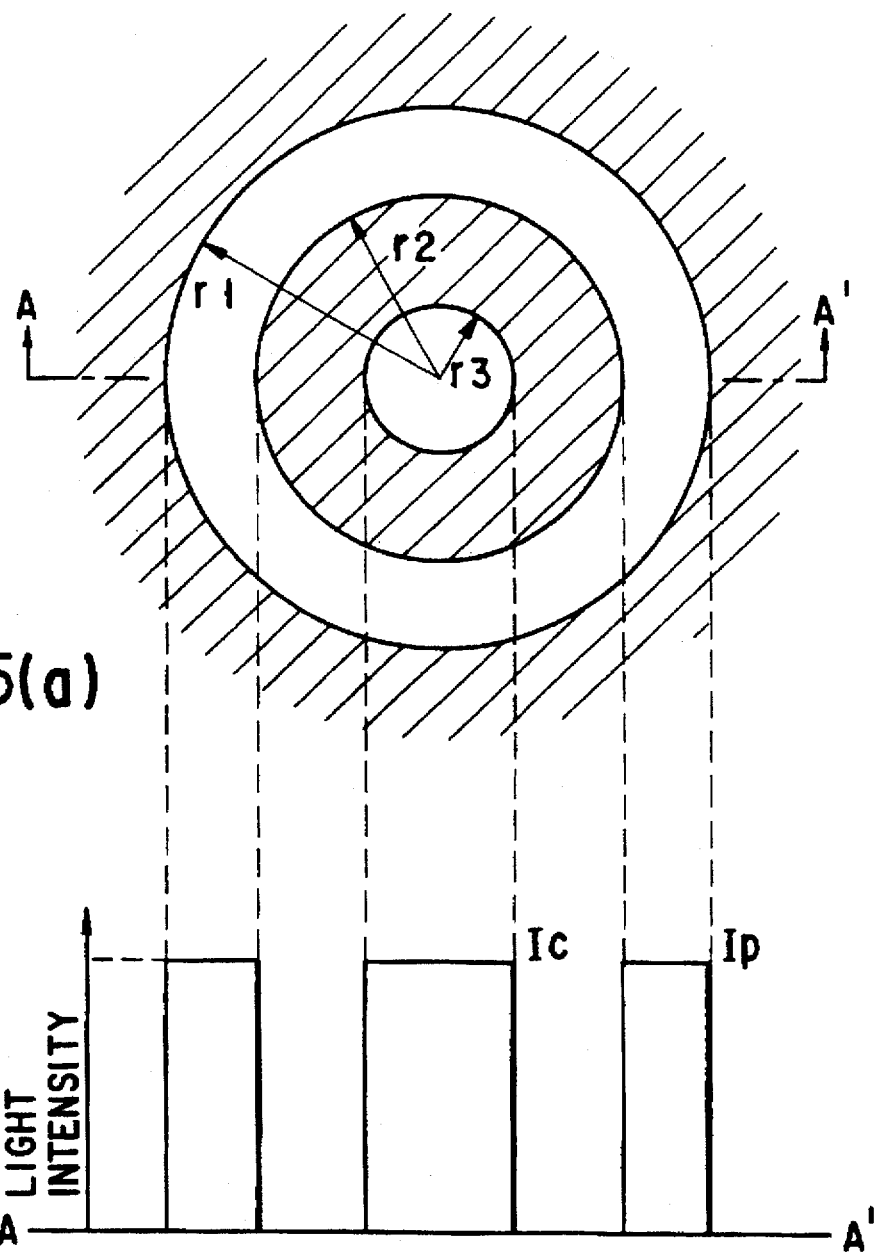
F I G. 55(a)
F I G. 55(b)

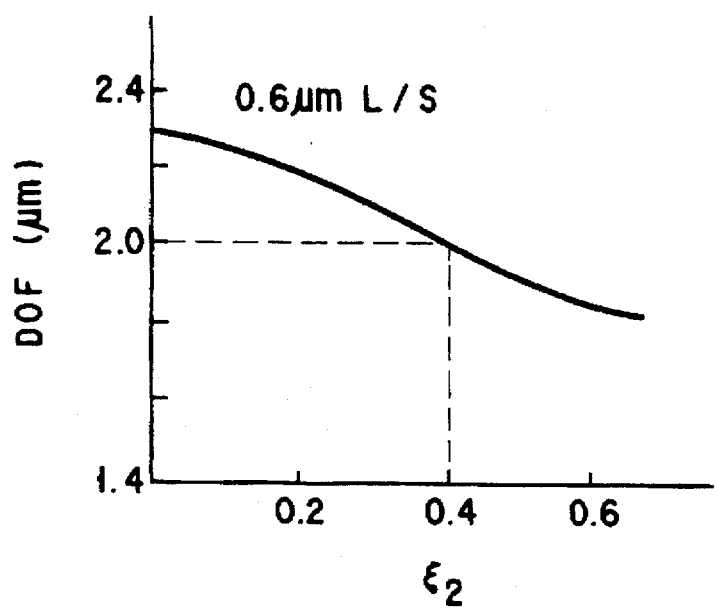
F I G. 56(a)
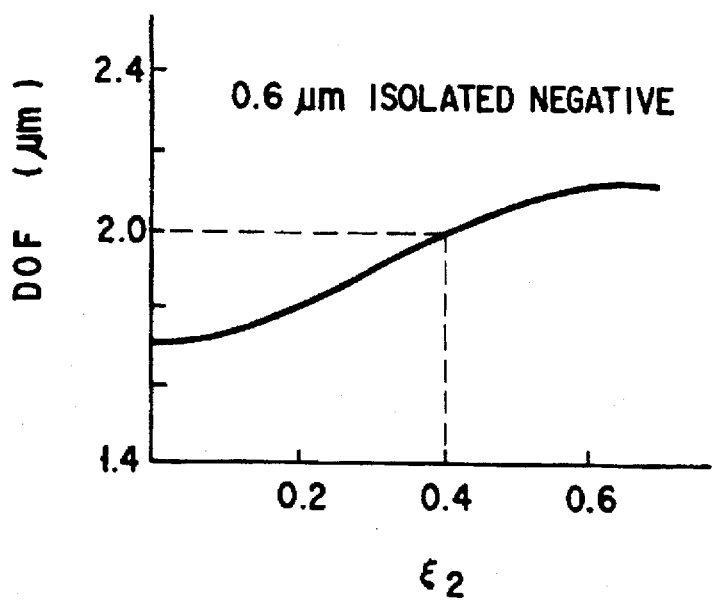
F I G. 56(b)

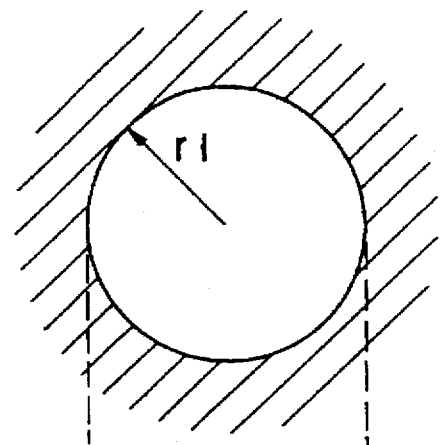
F I G. 57(a)
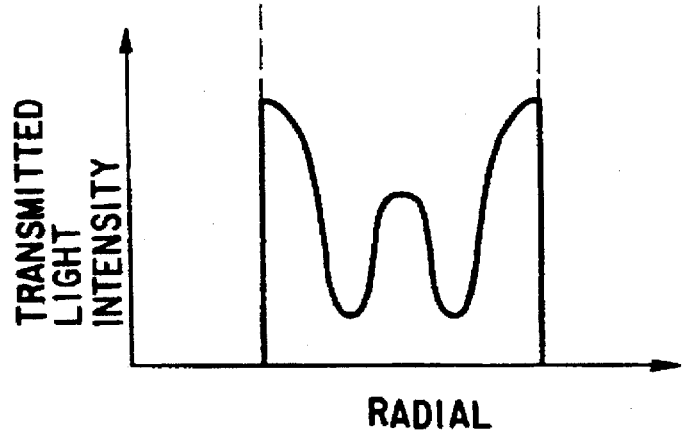
F I G. 57(b)

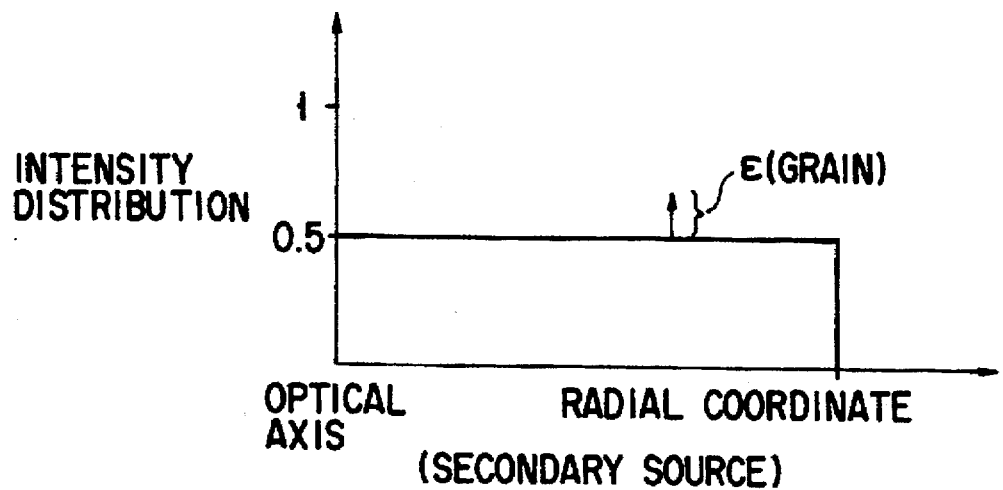
F I G. 60(a)
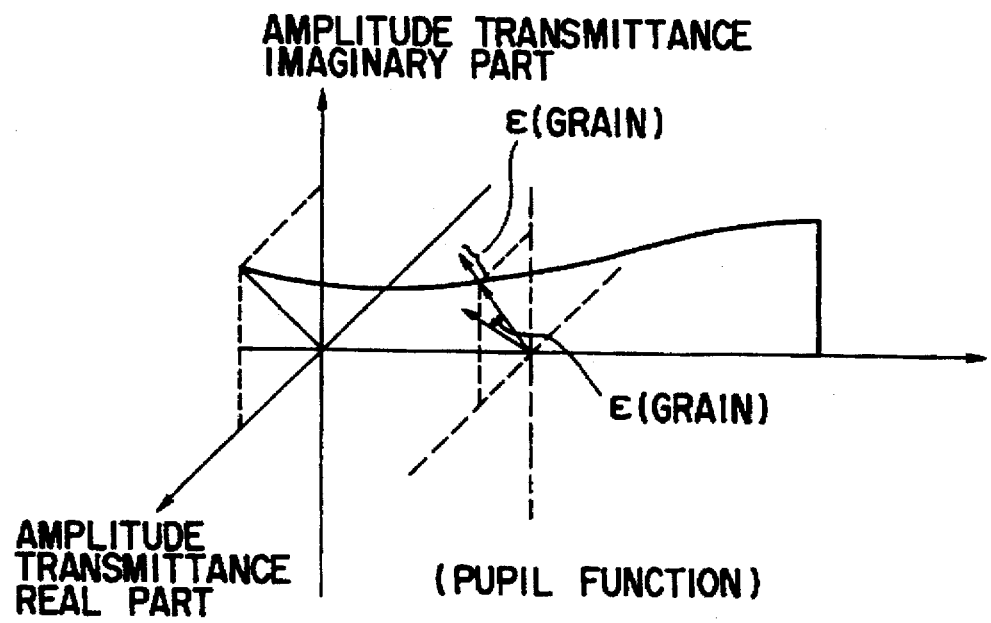
F I G. 60(b)

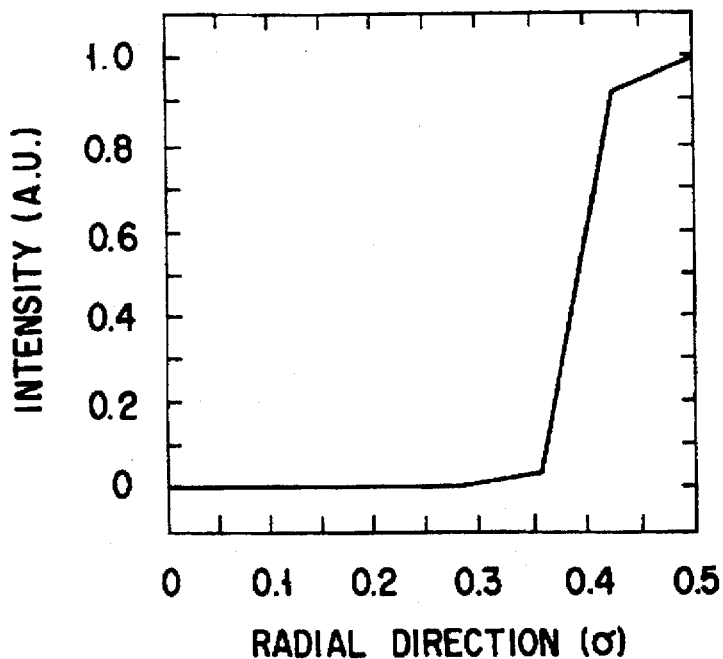
F I G. 61(a)
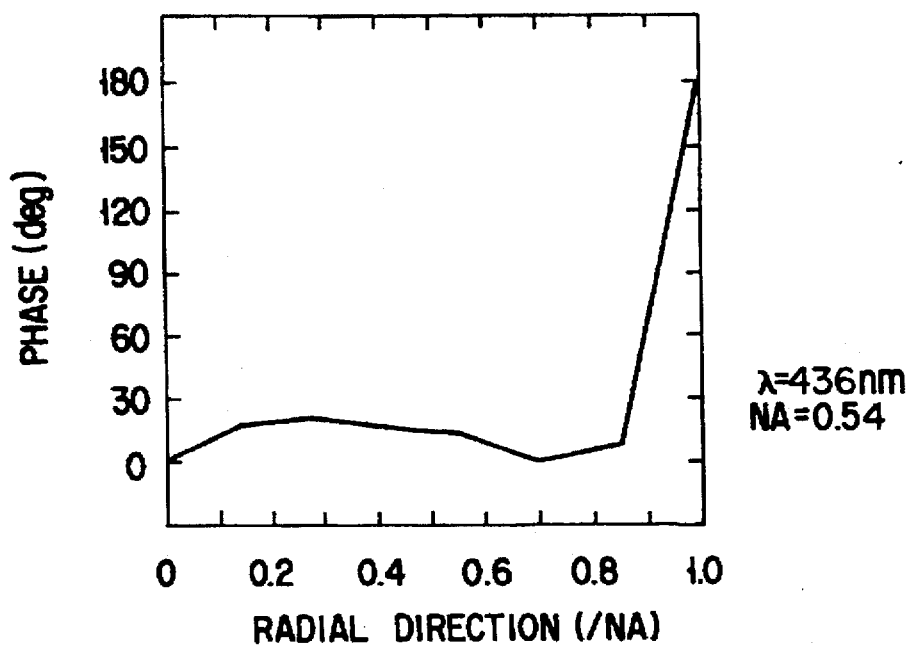
λ=436nm
NA=0.54
F I G. 61(b)

λ=248nm
NA=0.5

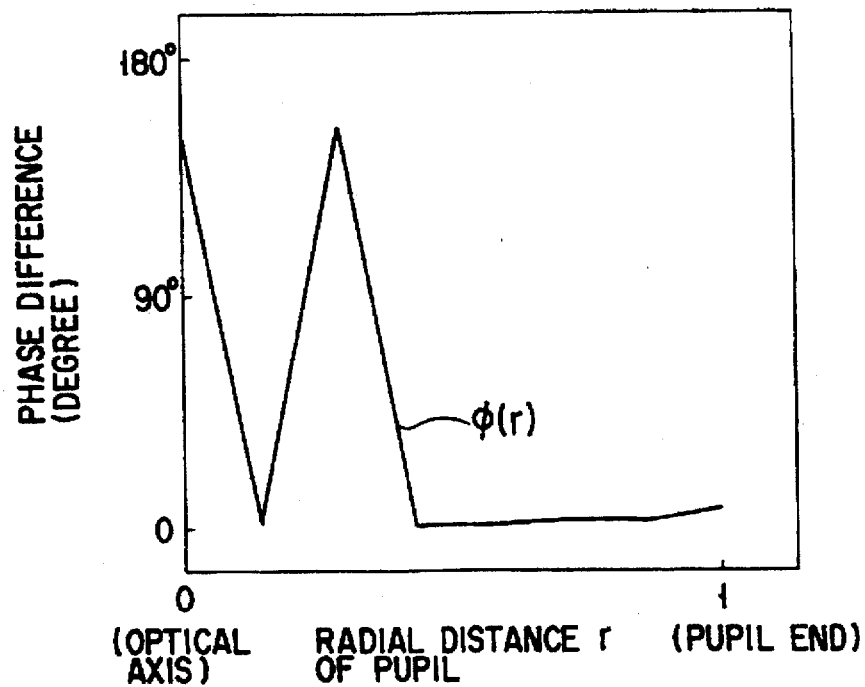
F I G. 69
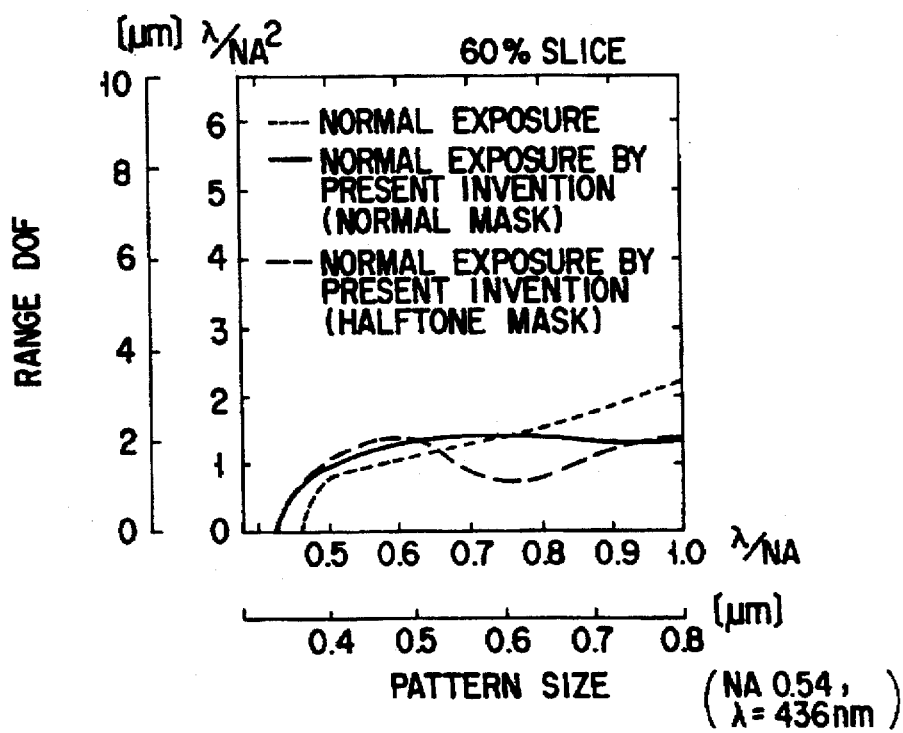
F I G. 70

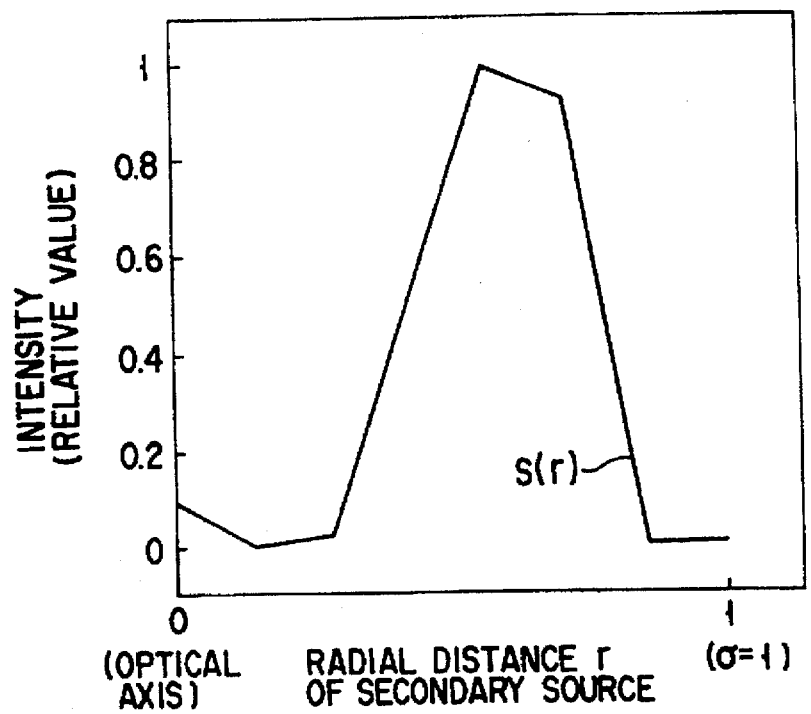
F I G. 71
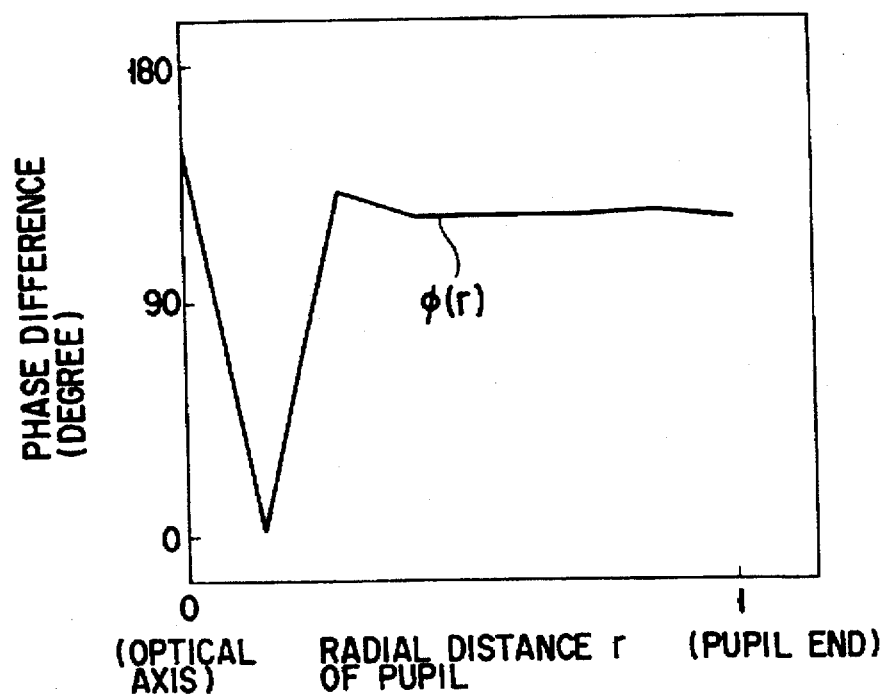
F I G. 72

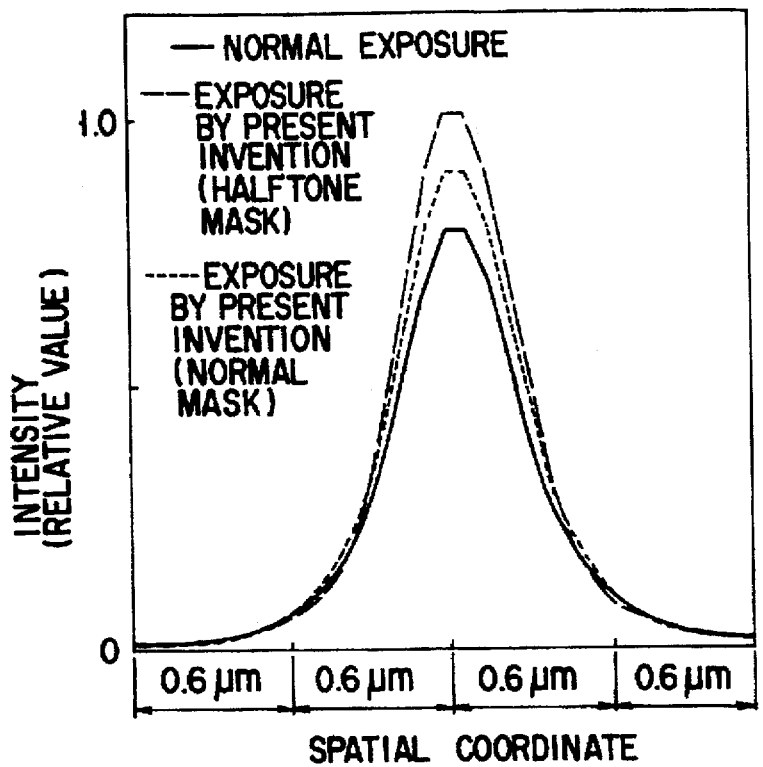
F I G. 77
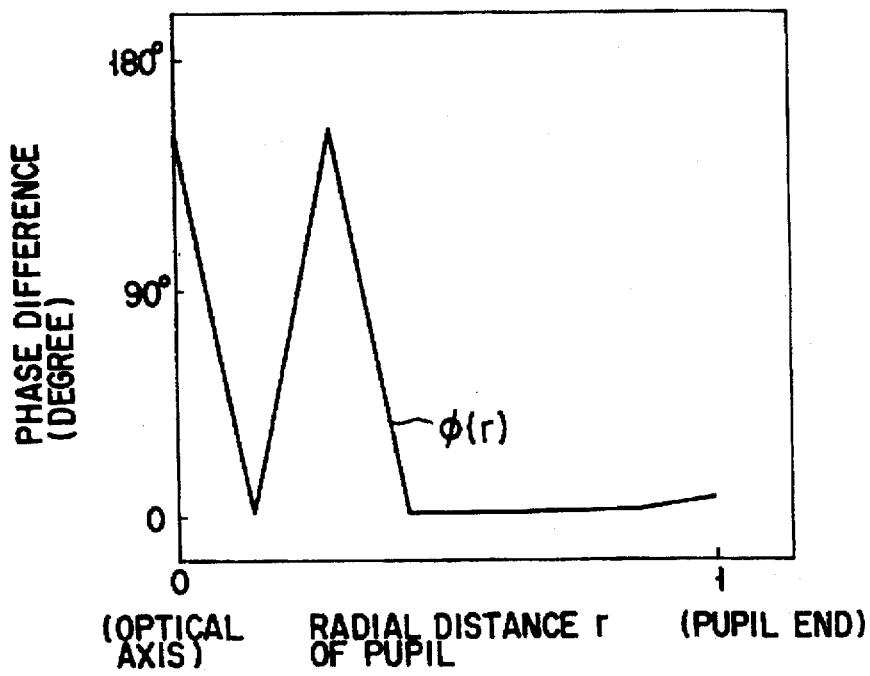
F I G. 78

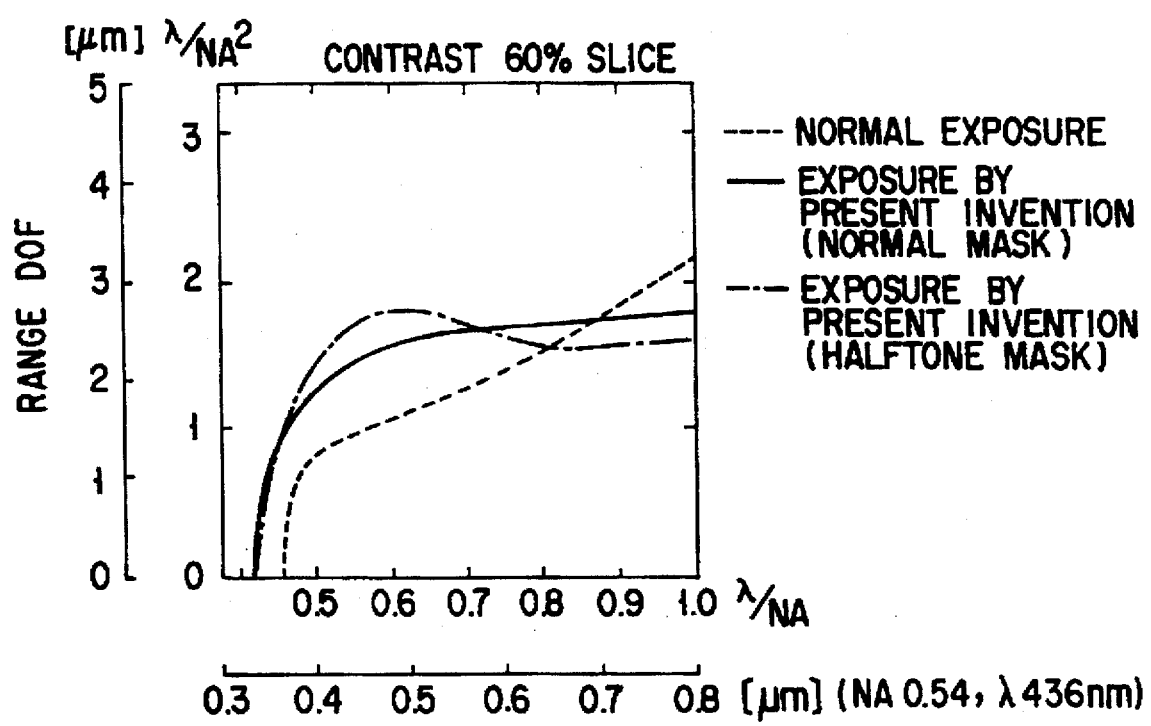
F I G. 81

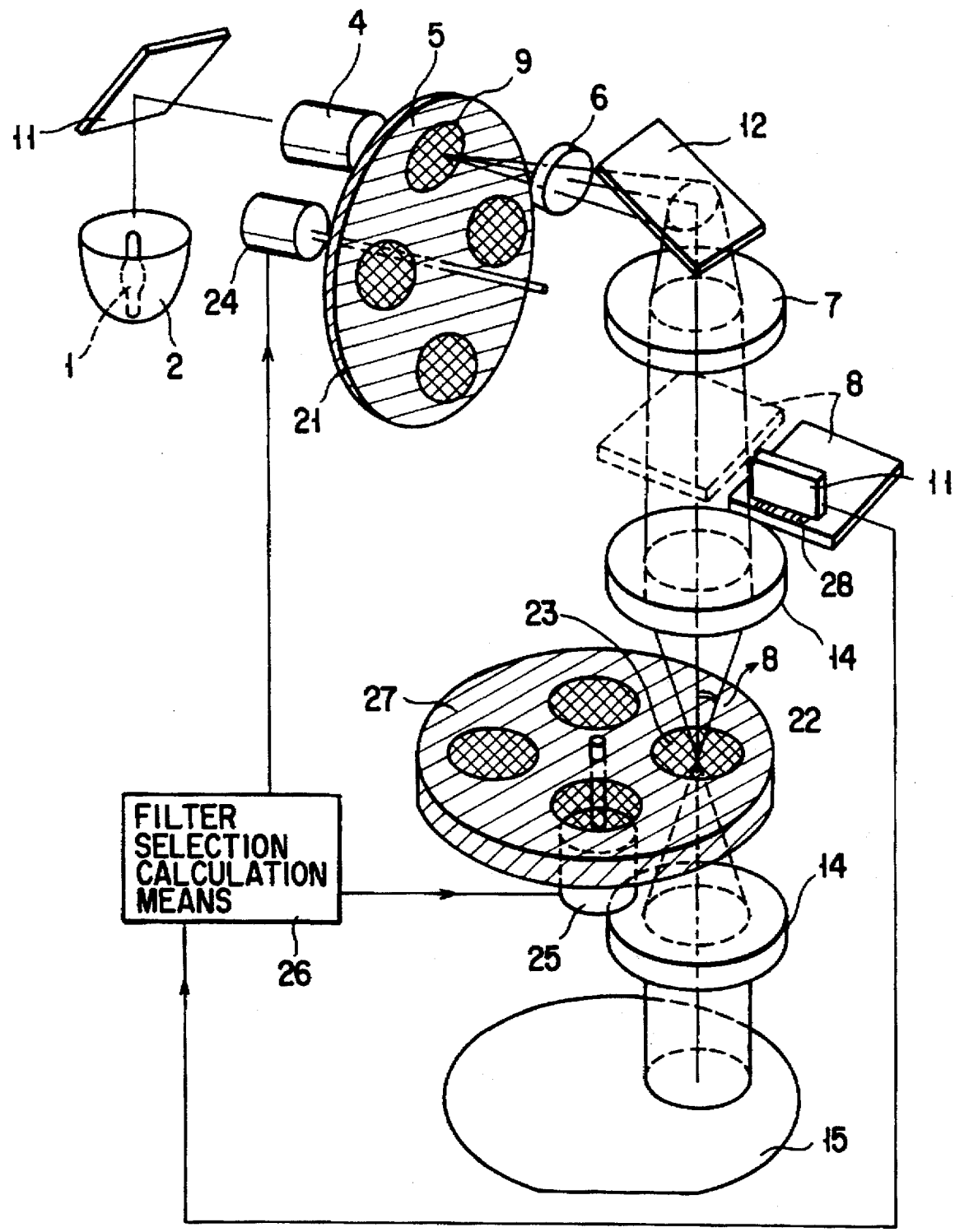
F I G. 82

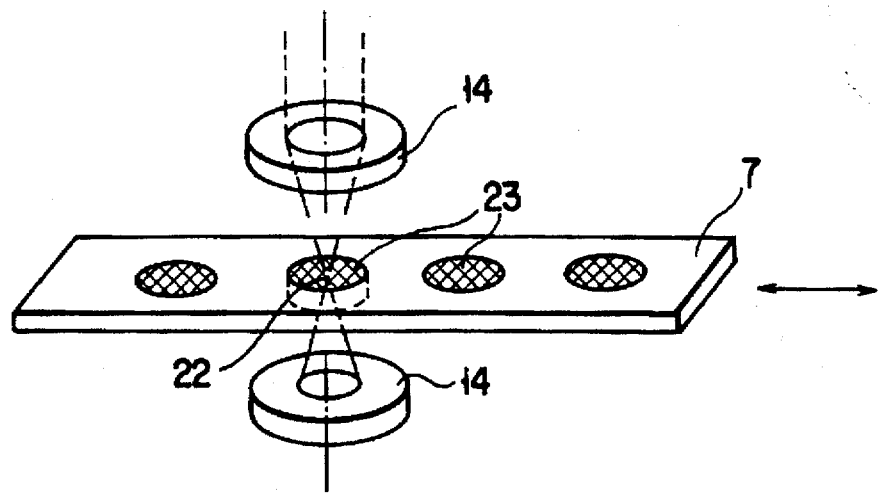
F I G. 83(a)
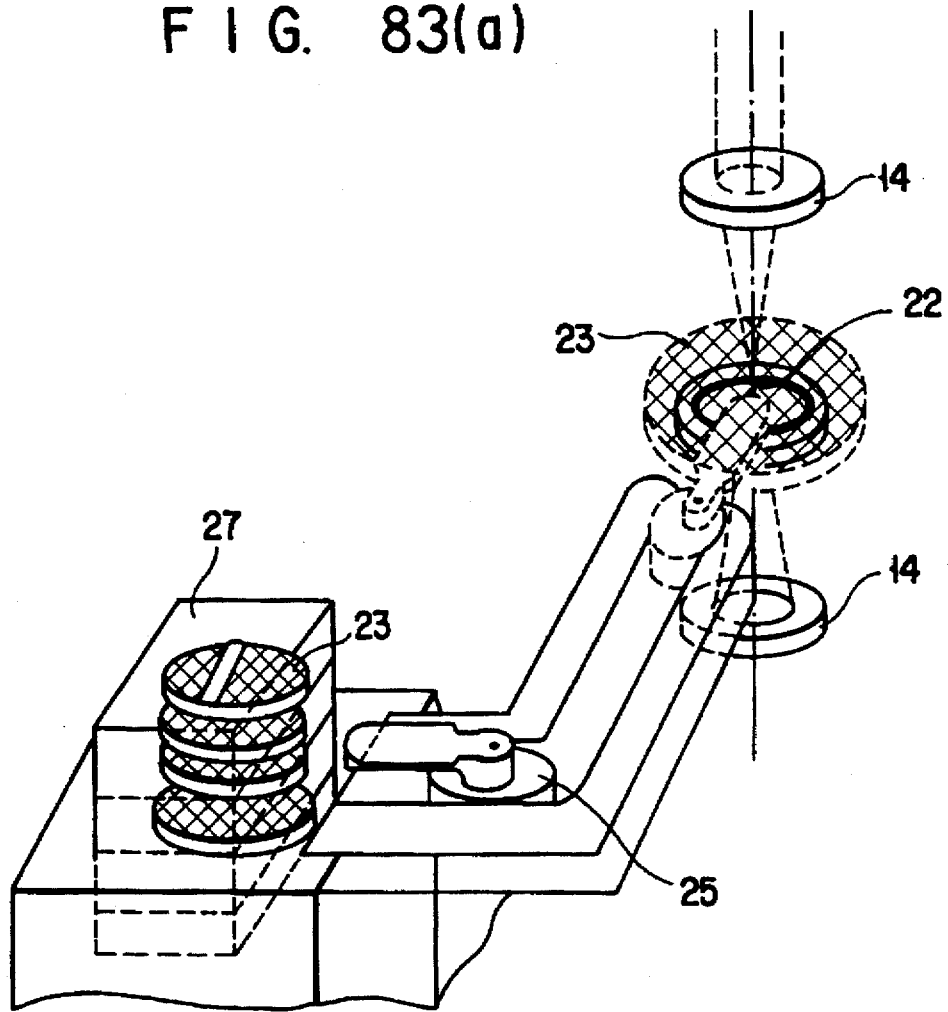
F I G. 83(b)

FILTER MANUFACTURING APPARATUS

This is a Division of application Ser. No. 08/411,844 filed on Mar. 28, 1995, which is a Continuation of Ser. No. 07/961,540 filed Oct. 15, 1992, now U.S. Pat. No. 5,621,498.

BACKGROUND OF THE INVENTION

1. Field of the Invention

The present invention relates to a projection exposure apparatus for forming a fine resist pattern required for the manufacture of a semiconductor integrated circuit and a pattern formation method using the apparatus and, more particularly, to a projection exposure apparatus in which an optical system is optimized to maximize the depth of focus.

2. Description of the Related Art

With the recent remarkable advances in photolithography, it may be possible to realize a "0.5-μm rule" by a projection exposure apparatus using a g-line (436 nm) or an i-line (365 nm). Such expectation is based on the recent improvement in the performance of a projection exposure apparatus, especially an increase in the NA of a lens. It is, however, doubtful that a "0.3-μm rule" of the next generation can be achieved by the extension of the conventional techniques. It is true that an increase in resolving power can be achieved by increasing the NA of a lens or reducing the wavelength of exposure light. However, the depth of focus is decreased, and hence the practical resolving power is not increased as expected. Therefore, demands have currently arisen for the development of a technique of achieving an increase in depth of focus.

FIG. 70 shows the basic schematic arrangement of a projection exposure apparatus which has been generally used. As shown in FIG. 70, the projection exposure apparatus comprises a lamp 1 constituted by a mercury-vapor lamp, an elliptic reflecting mirror 2, (its second focal point 3), an input lens 4, an optical integrator (fly-eye lenses) 5, an output lens 6, a collimation lens 7, a reticle (mask) 8, an aperture stop 9 as a uniform stop, a filter 10 which serves so that the optical system transmits only aberration-corrected light, cold mirrors 11 and 12 for bending the optical path to reduce the height of the apparatus, a lamp house 13, a projection optical system 14 for projecting a pattern image, formed on the reticle (mask) 8, onto a wafer by means of lenses, mirrors, or a combination thereof, a wafer 15, and a stop 16 for determining a numerical aperture.

Although there are various basic arrangements of conventional projection exposure apparatuses, in practice, in addition to the one shown in FIG. 70, they can be generally expressed, as shown in FIG. 71(a). That is, in a projection exposure apparatus of this type, a light source 1, a first focusing optical system 18, a uniforming optical system 19, a second focusing optical system 20, a reticle 8, a projection optical system 14, and a wafer 15 are arranged in the order named.

The first focusing optical system 18 corresponds to the elliptic reflecting mirror 2 and the input lens 4 in FIG. 70. In the first focusing optical system 18, a spherical mirror, a plane mirror, a lens, and the like are optimally arranged in addition to the elliptic mirror so as to cause beams emitted from the light source to be incident on the uniforming optical system 19 as efficiently as possible.

The uniforming optical system 19 corresponds to the optical integrator 5 in FIG. 70. The uniforming optical system 19 may also include, for example, an optical fiber or a polygonal prism in addition to the optical integrator.

The second focusing optical system 20 corresponds to the output lens 6 and the collimation lens 7 in FIG. 70. The optical system 20 serves to superpose beams, emerging from the uniforming optical system 19, on each other, and ensures image plane telecentricity. In addition, a filter corresponding to the filter 10 in FIG. 70 is inserted in the optical system 20 at a position close to the optical axis. Furthermore, reflecting mirrors corresponding to the cold mirrors 11 and 12 are inserted (their positions are not uniquely determined).

In the projection exposure apparatus having the above-described arrangement, since the characteristics of light emerging from the reticle 8 are the same as those of light emerging from the uniforming optical system 19 through the second focusing optical system 20, the exit side of the uniforming optical system 19 may serve as a so-called apparent light source. In the above arrangement, therefore, an exit side 24 of the uniforming system 19 is generally called a secondary source. In addition, when an image of the reticle 8 is projected on the wafer 15, the formation characteristics (i.e., resolving power, depth of focus, and the like) of a projected/exposed pattern are determined by the numerical aperture of the projection optical system 14 and the characteristics of light (i.e., the characteristics of the secondary source 24) radiated on the reticle 8.

FIG. 71(b) is a view for explaining reticle illumination light and focused light in the projection exposure apparatus shown in FIG. 71(a). Referring to FIG. 71(b), a projection optical system 14 generally incorporates an aperture stop 16 to regulate a predetermined angle θa at which light passing through a reticle 8 can pass therethrough and determine an angle θ at which light is incident on a wafer 15.

The numerical aperture (NA) of a projection optical system is generally defined as NA=sinθ. If the projection magnification is 1/m, sinθi=sinθ/m. Furthermore, an exposure apparatus of this type generally has a so-called "image plane telecentric" arrangement (i.e., a principal ray is perpendicularly incident on an image plane). In order to satisfy the condition for this "image plane telecentric" arrangement, a real image from the exit surface of the uniforming optical system 19 (i.e., the light source surface of the secondary source 24) shown in FIG. 71(a) is focused at the position of the aperture stop 16.

Under the above-described conditions, provided that an elevation angle at which the secondary source is viewed from the reticle 8 through the second focusing optical system 20 is obtained within the range of light incident on the reticle 8, half of the elevation angle is assumed to be φ, and that a coherence σ of illumination light is defined as σ=sinφ/sinφ, it is considered that the pattern formation characteristics are determined by NA and σ.

The relationship between NA, σ, and pattern formation characteristics will be described in detail next. With an increase in NA, the resolving power of a projection exposure apparatus is increased. On the other hand, the depth of focus is decreased, and a wide exposure field is difficult to ensure because of the aberration of the projection optical system 14. Such a projection exposure apparatus cannot be used for the actual manufacture of an LSI or the like unless it has a certain exposure region and depth of focus (e.g., 20×20 mm±1 μm). Therefore, in a conventional apparatus, the limit value of NA is about 0.55. The σ value is mainly associated with the cross-sectional shape of a pattern and the depth of focus, and is associated with the resolving power with correlation with the cross-sectional pattern shape. With a decrease in the σ value, the edge of a pattern is emphasized so that the angle of the side wall of the cross-sectional shape approaches a rectangular-shape, thus obtaining a good pattern shape. On the other hand, the resolution of fine patterns deteriorates, and the focal range within which patterns can be resolved is narrowed. In contrast to this, with an increase in the σ value, the resolution of fine patterns is slightly improved, and the focal range is slightly widened. However, the inclination (angle) of the side wall of the pattern is reduced. For this reason, if, for example, a thick resist is formed, its cross-sectional shape becomes trapezoidal or triangular. In the conventional projection exposure apparatus, therefore, σ=0.5 to 0.7 is fixed as the σ value for achieving a relatively good balance between these merits and demerits. Pattern formation under the condition of σ=0.3 or the like is only performed as an experiment. In addition, since the σ value can be set by determining the size of the light source surface of the secondary source 24, the circular aperture stop 9 for setting the σ value is placed immediately after the light source surface of the secondary source 24.

An annular illumination exposure technique (method) (reference: Published Unexamined Japanese Patent Application No. 61-91662) is one of the methods of increasing the depth of focus of a general projection exposure apparatus such as the one described above. In this method, a special stop is inserted in a projection exposure apparatus such that the intensity of a peripheral portion is higher than that of a central portion in the intensity distribution of the secondary source of the apparatus. More specifically, one of the different types of filters shown in FIGS. 72(a) to 72(d) is inserted in the apparatus in place of the σ value setting circular aperture stop 9 shown in FIG. 70. As an example, the depth-of-focus increasing effect obtained by the filter shown in FIG. 72(a) was evaluated by simulation. The result is shown in the graph in FIG. 73, in which the ordinate represents the depth of focus with respect to the mask pattern size, which value corresponds to a central shielding ratio ε (i.e., pattern size dependence) of an annular illumination filter. This central shielding ratio is represented by ε=r2/r1 where r1 and r2 are the outer and inner diameters of each of the annular filters shown in FIGS. 72(a) and 72(d). In addition, the exposure apparatus has an NA of 0.54, a coherence factor of 0.5, and an exposure wavelength of 436 nm (g-line). It is apparent from these characteristic curves that the limit resolving power and the depth of focus are increased with an increase in the ε value.

However, the actual secondary source is formed on the exit surface of the above-mentioned fly-eye lens and is spatially discrete. For this reason, if the ε value is increased too much (i.e., the annulus is narrowed), light cannot pass through the annular stop. Therefore, the ε value is normally set to be about 0.5 to 0.7. As a result, as is apparent from FIG. 73, even the maximum depth-of-focus increasing effect is as small as about 13%. At the same time, FIG. 73 indicates that the pattern size dependence of the depth-of-focus increasing effect is considerably high. That is, a certain depth-of-focus increasing effect can be recognized within the pattern size range from 0.6 to 0.9 μm, but the depth of focus decreases from a pattern size of 0.9 μm or more contrary to the intended effect. With regard to the annular stop shown in FIG. 72(d), there has been no detailed description as to a method of determining the transmittance.

The results obtained by actually applying annular illumination exposure to pattern (e.g. Isolated line, Isolated space, etc) formation, and L/S ratio will be described below. FIGS. 74(a) and 74(b) show a light source modulating filter actually used. An annular shielding ratio ε of the filter is defined as ε=r2/r1. The graph shown in FIG. 75 indicates the distribution of depths of focus obtained by combinations of coherences σ and annular shielding ratios ε with respect to an L/S pattern having a line/space ratio of 1:1 (0.6 μm). Similarly, the graph shown in FIG. 76 indicates a case of an isolated positive pattern (i.e., isolated line pattern), which has a pattern size of 0.6 μm. The graph in FIG. 77 indicates a case of an isolated negative pattern (i.e., isolated space pattern), which has a pattern size of 0.6 μm. The depths of focus (DOF values) shown in FIGS. 75 to 77 are obtained with a g-line, NA=0.54, a positive resist (PFR-GX200), and a film thickness of 1.0 μm. Each DOF value indicates the coherence σ and the annular shielding ratio ε (i.e., pattern size dependence) obtained on the basis of a contrast (critical image contrast) required for pattern formation, which contrast is calculated from a focus margin obtained in an experiment on an exposure process with coherence σ=0.5 and annular shielding ratio ε=0.

In consideration of the fact that the focus margin required for an actual (pattern formation) process is about 2 μm, exposure must be performed by annular illumination in the existing circumstance because limitations based on an L/S pattern are strictest, as is apparent from FIG. 75. In addition, the following conclusions can be drawn from the graphs shown in FIGS. 75 to 77.

(1) For an L/S pattern, σ=0.5 to 0.7 and ε=0.6 to 0.8 are the optimal values.

(2) For an isolated positive pattern, σ=0.6 to 0.7 and ε=0.6 to 0.8 are the optimal values.

(3) For an isolated negative pattern, the optimal values of σ and ε are small (i.e., values for normal exposure).

As described above, the problem of such a technique is that a given optimal filter must be replaced with another optimal film depending on whether a layer constituted by an L/S pattern or an isolated positive pattern is transferred in actual exposure or a layer constituted by an isolated negative pattern and contact holes is transferred. In practice, therefore, the operation efficiency of this technique is low.

As another example, a filter having four apertures shown in FIG. 78(b) (to be referred to as a four-eye filter hereinafter) has been proposed (Published Examined Japanese Patent Application No. 56-9010). Projection exposure using this four-eye filter was reported in Kamon, Miyata, et al., "Reduction Projection Exposure Methods (I) and (II) using Modified Light Source", (lecture numbers 12a-ZF-3 and 12a-ZF-4) in the 52th applied physics meeting held in October of 1991. According to this report, high resolution performance with respect to L/S can be obtained not only in one direction but also in a direction perpendicular thereto.

The graph in FIG. 79 indicates transfer characteristics obtained by simulating exposure processes by illumination using the four-eye filter and by normal illumination. Referring to FIG. 79, the abscissa represents the L/S pattern size with the line and space ratio=1:1; and the ordinate, the depth of focus (DOF). The exposure wavelength is 365 nm (i-line); and the NA of a projection optical system, 0.55. In this case, it is assumed that a resist which can resolve a pattern with an image contrast of 70% or more is used. This graph shows characteristics obtained when the four-eye filter and the direction of each L/S pattern have the relationship shown in FIG. 80. The following conclusions can be drawn from this graph. With the above-described L/S pattern, the resolving power and the depth of focus are greatly increased near L/S<0.65 μm, especially L/S=0.4 μm, by four-eye illumination as compared with normal illumination. However, when L/S≥0.65 μm, the depth of focus obtained by normal illumination is larger than that obtained by four-eye illumination. Especially near L/S=0.7 μm, the depth of focus obtained by four-eye illumination is minimized. Such characteristics are dependent on the positions and sizes of the eyes (holes) of the four-eye filter. For example, with an increase in distance between the eyes, the depth of focus with a small L/S value is increased, while the depth of focus with a large L/S value is considerably decreased. In addition, with a decrease in size of each eye, the depth of focus of only an L/S pattern of a specific size tends to increase.

Although there is a slight difference in characteristic depending on the positions and size of the eyes of the four-eye filter, as described above, this graph shows the overall characteristics.

The above description is associated with an L/S pattern. It is found that the use of the four-eye filter adversely affects the formation of an isolated negative pattern (i.e., a positive resist), and the DOF is decreased. More specifically, the minimum space width which can ensure a depth of focus of 1.5 μm is 0.4 μm in normal exposure but is 0.45 μm in exposure by means of four-eye illumination. That is, when exposure is to be performed by four-eye illumination, an L/S pattern with an L/S ratio of 1:1 can be designed on the order of 0.29 μm, whereas an isolated negative pattern needs to be designed on the order of 0.45 μm or more. Actual LSI pattern include only a small number of typical isolated negative patterns, each having a negative line width close to a design rule and resist portions extending on both sides by several μm, but includes a large number of patterns designed such that the space to line ratio is low. Therefore, in the case of such an isolated negative pattern, the line width which can ensure a depth of focus of 1.5 μm or more is increased, greatly influencing a reduction in the size of a chip.

In four-eye exposure using a four-eye filter, it is found that good resolution performance cannot be with respect to patterns arranged in directions other than two orthogonal directions. Especially for patterns arranged at an angle of 45° the four-eye filter and the direction of each L/S pattern have the relationship shown in FIG. 81, the resolution performance considerably deteriorates. The characteristics shown in FIG. 82 can be obtained. In this case, it is apparent that transfer by four-eye illumination is inferior in depth of focus to transfer by normal illumination.

A so-called "superflex method" (the 38th applied physics joint meeting papers (29a-ZC-8) is still another method of increasing the depth of focus of a projection exposure apparatus. In this method, a spatial frequency filter is inserted in the pupil of the projection exposure apparatus. According to this reference, when the amplitudes of two images having phases shifted from each other by ±Δ and focused at different positions z=±β in the direction of an optical axis are synthesized, the following two effects can be simultaneously obtained:

(1) an increase in depth of focus owing to a multiple focusing (FLEX) effect; and (2) a pseudo-phase shift effect upon cancellation of phases at a pattern edge.

If an amplitude distribution in a lateral (x) direction and optical axis (z) direction is represented by U(x,z), the synthesized amplitude can be given by the following equation:

$$U'(x,z)=[\exp(i\Delta\phi)U(x,z-\beta)+\exp(-i\Delta\phi)u((x,z+\beta)]/2$$

This amplitude is equal to that obtained by arranging a spatial filter having a radial distribution of complex amplitude transmittances represented by the following equation at a projection lens pupil (aperture):

$$t(r)=\cos(2c\pi\beta^2-\theta/2) \text{ (for } \theta=2\Delta\phi-8\pi\beta/NA^2)$$

If β and θ are properly selected, the distance between two focused images and the interference effect (or spatial frequency transfer characteristics) therebetween can be arbitrarily controlled.

In this method, however, since a filter having a small transmittance is inserted in the pupil inside a projection optical system, the filter absorbs exposure light to generate heat, and thermal expansion of the optical system occurs. As a result, the pattern transfer precision deteriorates.

In addition, the dependence of the depth-of-focus increasing effect on pattern size is high, as indicated by the graph in FIG. 82 of B. In this graph, the abscissa represents the mask pattern size normalized by λ/NA; and the ordinate, the focus margin normalized by λ/NA². When focus margins which ensure a pattern contrast of 60% or more on an image plane are viewed in this graph, it is found that the focus margin in the normal exposure method is larger than that in the "super flex method" with a pattern size of 0.8 (normalized size) or more.

As described above, (in summary), the two methods of increasing the depth of focus (i.e., the "annular illumination exposure method", four-eye illumination exposure method and the "superflex method") have the following problems, respectively.

In the "annular illumination exposure method (A)", the following four problems are posed:

(A-1) In consideration of the arrangement of an actual secondary source, the depth-of-focus increasing effect is small (13% at best).

(A-2) The dependence of the depth-of-focus effect on pattern size is high.

(A-3) With regard to an "annular stop" having a transmittance distribution, there has been no detailed description as to a method of determining the transmittance.

(A-4) The effect of the depth-of-focus enhancement is low, in case of the pattern of isolated line and contact hole.

In the "superflex method (B)", the following two problems are posed:

(B-1) The filter absorbs exposure light to generate heat, and thermal expansion of the optical system occurs, resulting in a deterioration in transfer precision.

(B-2) The dependence of the depth-of-focus effect on pattern size is high.

The following problems must be solved, especially in the case of four-eye illumination exposure method.

As described above, in an exposure process using the four-eye filter, as compared with a normal exposure process using a circular secondary source, the resolving power and the depth of focus are considerably increased when L/S<0.65 μm. In contrast to this, when L/S≧0.65 μm, the depth of focus obtained by the normal illumination method becomes larger than that obtained by the four-eye illumination method (especially near L/S=0.7 μm, the depth of focus obtained by the four-eye illumination method becomes as small as about 1.5 μm). For this reason, when a layer demanding a large depth of focus is transferred, a pattern having an L/S near 0.7 μm cannot be properly transferred (i.e., in spite of the fact that a depth of focus of 2.5 μm is obtained near L/S=0.4 μm, the transfer characteristics are rate-determined by a pattern having a larger size).

If a filter which transmits light only at four specific positions, such as a four-eye filter, is used, the resolution performance greatly varies depending on the direction of each pattern.

In the above-described four-eye illumination method, although the depth of focus and resolving power of an L/S pattern are increased, those of an isolated negative pattern are decreased. This indicates that a pattern must be designed on the order of a larger line width with an increase in line width as compared with the space width of the pattern. Since actual LSI patterns include a large number of patterns having a larger line width then the space width, the great depth-of-focus increasing effect using on four-eye illumination cannot be associated with a reduction in chip size.

SUMMARY OF THE INVENTION

It is an object of the present invention to provide a projection exposure apparatus which can solve the above-described problems, optimize the depth of focus and the pattern resolution performance, and improve the exposure precision, provided that a projection optical system has a predetermined numeral aperture, and a secondary source has a predetermined size.

The following are the detailed objects of the present invention:

(1) To provide a projection exposure apparatus which can sufficiently increase the depth of focus and improve the exposure precision even if the size of an L/S pattern is small or large.

(2) To provide a projection exposure apparatus which can sufficiently increase the depth of focus regardless of the direction of a pattern.

(3) To provide a projection exposure apparatus which can design a pattern without an isolated pattern or a similar pattern in which the line width is large as compared with the space width while reducing the negative line width of the pattern, thereby achieving a great reduction in chip size.

In order to achieve the above objects, there is provided a projection exposure apparatus comprising a first focusing optical system for focusing light from a mercury-vapor lamp as a light source, a uniforming optical system for uniforming the focused light, a second focusing optical system for focusing the uniform light and radiating the light on a mask (3) on a reticle, and a projection optical system for projecting the light transmitted through the reticle onto a wafer (15), wherein a predetermined mask pattern formed on the mask is projected/exposed (i.e., transferred) on the wafer (15) through the projection optical system. The apparatus further includes a special stop (9) (i.e., a four-eye filter (20)), as a secondary source for uniformly radiating the mask (8), which sets the intensity distribution within the exit plane of the light source to be "quadruple-symmetrical" about the optical axis of the light source and causes four regions shifted from the optical axis to have large intensities (than other regions). As the mask (8), a pattern consisting of a translucent film is formed on a light-transmitting substrate. The phase difference between light passing through the translucent film and light passing through the light-transmitting substrate is given by 180×(2n+1)±30 (degree) where n is an integer.

According to the present invention, the following effects can be obtained.

(1) When predetermined values are respectively given as the numerical aperture of the projection optical system and the size of the secondary source, at least the secondary source radial intensity distribution of the projection optical system, the complex amplitude transmittance distribution of the mask, or the pupil function radial complex amplitude transmittance distribution of the projection optical system is set by a successive approximation method, thereby realizing an optimal depth of focus in accordance with a desired pattern size.

(2) According to the present invention, in the case wherein pattern transfer is performed by the illumination method in which high intensities are set in four regions, of a light source intensity distribution, which are point-symmetrical about the optical axis and shifted therefrom, if a halftone mask, a self-alignment type phase shift mask, a shifter edge type phase shift mask, or the like is used, the DOF increasing effect with respect to L/S patterns of all sizes can further be improved. If a four-eye filter is simply used as a light source, similar to the case wherein a normal Cr mask is used, the depth of focus of a large L/S pattern tends to be relatively small compared with that of a small L/S pattern. However, the absolute value of the depth of focus can be increased by using the above-mentioned various types of phase shift masks.

(3) According to the present invention, a four-eye filter is used as a light source, and a substrate transparent to exposure light is arranged at the position of the pupil of the projection optical system so that the thickness or refractive index of a portion of the substrate which corresponds to a peripheral portion of the pupil is set to be different from that of other portions. With this arrangement, a large depth-of-focus and limit resolving power increasing effect can be obtained independently of the pattern size. In addition, the effect can be further improved by using a phase shift mask including a halftone mask.

(4) According to the present invention, the special stop as a light source serves as two types of filters, i.e., an annular illumination filter and a four-eye illumination filter. Consequently, the demerits of the two filters cancel each other, and the dependence of the depth of focus on pattern size and direction can be reduced to a level at which no practical problems are posed, thus obtaining a high resolving power and depth-of-focus increasing effect.

(5) According to the present invention, in addition to the effect of increasing the depth of focus and resolving power of an L/S pattern, obtained when pattern transfer is performed by the illumination method in which high intensities are set in four regions, of a light source intensity distribution, which are point-symmetrical about the optical axis and are shifted therefrom, the depth of focus and resolving power with respect to an isolated negative pattern can also increased by increasing the light source intensity near the center of the light source. As a result, a great reduction in chip size can be achieved.

In addition, according to the present invention, a filter having an aperture at a position decentered from the optical axis is arranged at the position of the light source of the exposure apparatus so as to cause an illumination optical system to obliquely radiate light on a mask. With this arrangement, high-order diffracted light generated by a long L/S pattern located in a direction perpendicular to the decentering direction is incident on the projection optical system to increase the resolving power. In this case, since an actual LSI has various directivities, high-order diffracted light generated by a pattern located in a direction other than the above-mentioned direction is not incident on the pupil, and the resolving power is not increased. For this reason, a slit whose longitudinal direction is aligned with the decentering direction of the filter is arranged at the position of the pupil to cut diffracted light generated by a pattern located in a direction other than the above-mentioned direction. In addition, the pattern directivity dependence of resolving power can be eliminated by performing an exposure process while synchronously rotating the slit and the filter about the optical axis as a rotational axis through 360°.

(6) By using a filter having two apertures which are respectively located at positions decentered from the optical axis and are symmetrical with each other, thereabout, as a filter arranged at the position of a light source, the same resolving power as that obtained by the above-described exposure method can be realized while the exposure time can be reduced to half. In addition, almost the same resolving power as that obtained by the above-described exposure method can be obtained and the exposure time can be further shortened by using a filter which sets high intensities in four regions quadruple-symmetrical about the optical axis and shifted therefrom, as a filter arranged at the light source position, and using a slit filter for increasing the transmittance in the form of a crisscross pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a flow chart showing an algorithm for optimizing a secondary source and a pupil function in the G1 embodiment;

FIG. 5 is a graph showing the relationship between the defocus amount and the contrast in the G1 embodiment;

FIG. 6 is a graph showing the relationship between the pattern size and the defocus state in the G1 embodiment;

FIG. 15 is a graph showing an optimized function φ(r) according to the G5 embodiment;

FIG. 16 is a graph showing a calculation result of focus margins according to the G5 embodiment;

FIG. 20 is a graph showing a calculation result of image intensity profiles according to the G7 embodiment;

FIG. 22 is a graph showing a calculation result of focus margins according to the G8 embodiment;

FIG. 24 is a graph showing a calculation result of focus margins according to the G9 embodiment;

FIG. 25(a) and 25(b) are views showing the arrangement and intensity distribution of a light source modulation filter according to the F1 embodiment;

FIGS. 26(a) and 26(b) are graphs showing the dependence of the DOF value for each pattern on the ε2 value according to the F1 embodiment;

FIGS. 27(a) and 27(b) are views showing the arrangement and intensity distribution of a light source modulation filter according to the F2 embodiment;

FIG. 28 is a plan view showing the arrangement of a four-eye filter according to the I1 embodiment;

FIG. 29 is a graph showing the relationship between the L/S size and the DOF according to the I1 embodiment;

FIGS. 30(a) to 30(c) are views showing the typical cross-sectional structure of a halftone mask;

FIGS. 32(a) to 32(c) are views showing the typical cross-sectional structure of a self-alignment type phase shift mask;

FIGS. 33(a) and 33(b) are views showing the schematic arrangement of a phase filter used in the I2 embodiment;

FIG. 35 is a plan view showing the arrangement of a four-eye filter having an annular portion used in the I3 embodiment;

FIG. 39 is a graph showing the relationship between the oblique L/S pattern size and the DOF according to the I3 embodiment;

FIG. 44 is a graph showing the relationship between the L/S size and the DOF according to the I5 embodiment;

FIG. 45 is a view for explaining the function of the I5 embodiment;

FIG. 46 is a schematic view showing the arrangement of a projection exposure apparatus according to the I6 embodiment;

FIG. 49 is a schematic view showing the arrangement of a thin film manufacturing unit using sputtering according to the D2 embodiment;

FIG. 50 is a schematic view showing the arrangement of a thin film manufacturing unit using etching according to the D2 embodiment;

FIG. 51 is a schematic view showing the arrangement of a thin film manufacturing unit using etching according to the D3 embodiment;

FIG. 52 is a block diagram showing the schematic arrangement of a thin film manufacturing unit having a film thickness monitor function according to the D4 embodiment;

FIGS. 55(a) to 55(d) are sectional views showing a thin film manufacturing process using lithography according to the D7 embodiment;

FIGS. 56(a) to 56(c) are graphs for explaining the function of the present invention;

FIG. 57 is a view showing the arrangement of a projection exposure apparatus according to the E1 embodiment of the present invention;

FIGS. 60(a) and 60(b) are views showing a case wherein the pattern of the liquid crystal panel has a transmittance distribution with gradation;

FIGS. 61(a) and 61(b) are views showing the arrangement of a filter portion of a projection exposure apparatus according to the E2 embodiment;

FIGS. 69(a) and 69(b) are views showing a light source filter and a pupil filter exchanging means according to the X embodiment;

FIG. 70 is a schematic view showing the arrangement of a conventional projection exposure apparatus;

FIGS. 71(a) and 71(b) are views for explaining the problems posed in the conventional apparatus;

FIGS. 72(a) to 72(c) are views respectively showing conventional light source modulation filters for annular illumination exposure, each of which is used in place of an aperture stop, and FIG. 72(e) is a graph showing the relationship between the transmittance and an aperture radius r;

FIG. 77 is a graph showing the dependence of the DOF value of an isolated negative pattern on the σ and ε values;

FIGS. 78(a) and 78(b) are views respectively showing filters used in place of an aperture stop;

FIG. 81 is a view showing the relationship between the four-eye filter and the direction of an L/S pattern;

FIG. 82 is a graph showing the relationship between the pattern size and the depth of focus with respect to a pattern having a directivity of 45° with respect to an L/S pattern; and FIG. 83 is a graph showing the relationship between the pattern size and the defocus state in the second conventional scheme.

Figure 1:
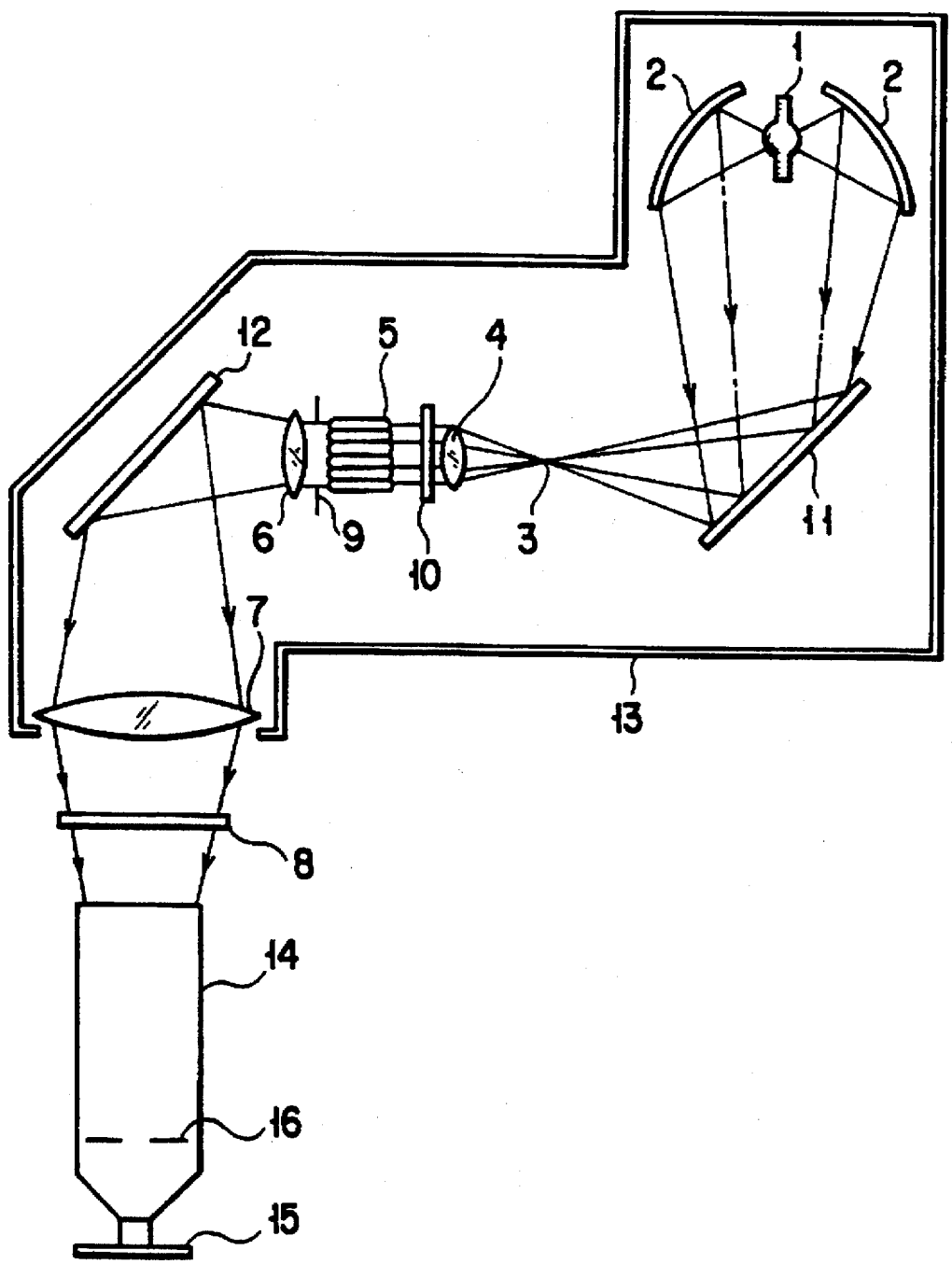
FIG. 1 is a schematic view showing the arrangement of a projection exposure apparatus according to the G1 embodiment of the present invention.

DETAILED DESCRIPTION OF THE PREFERRED EMBODIMENTS (D1 Embodiment)

FIG. 49 shows the arrangement of a main part of a thin film forming unit according to the D1 embodiment of the present invention. The unit basically has the function of a sputtering unit. This embodiment is characterized by a holder on which a substrate is mounted, and a shielding disk.

Referring to FIG. 49, reference numeral 11 denotes a holder on which a substrate 12 is mounted. The holder 11 is designed to be rotated about an axis B–B'. A shielding disk 13 is arranged above the holder 11. A hole 14 is formed in the shielding disk 13. A Cr target 15 for sputtering is placed above the shielding disk 13. Sputtered object sputtered from the Cr target 15 are radiated in the downward direction in FIG. 49 and are deposited on the substrate 12 through the hole 14 in the shielding disk 13. The holder 11 and the shielding disk 13 are designed to be relatively movable in a direction (A or A') perpendicular to the axis B–B'. These members are housed in a vacuum vessel (not shown).

In this unit, Cr of the Cr target 15 is sputtered by $Ar^+$, and the sputtered object are scattered in the direction of the holder 11. Since the shielding disk 13 is disposed between the Cr target 15 and the holder 11, the sputter atoms are supplied onto the shielding disk 13 and are also supplied onto the substrate 12 through the hole 14 in the shielding disk 13.

Since the holder 11 is rotated at a constant speed, an annular Cr thin film is deposited on the substrate 12 at a given radial position. The thickness of the deposited thin film is determined by the amount of sputter atoms and the rotational speed of the holder 11. When the film thickness at this position reaches a desired thickness, the holder 11 or the shielding disk 13 is slightly moved in the direction A or A'. With this operation, an annular Cr thin film is deposited on the substrate 12 at a different radial position. By repeating this operation, a film thickness distribution shown in FIG. 56(c) can be obtained.

In addition, if relative movement of the holder 11 and the shielding disk 13 is continuously performed, and the moving speed is changed in accordance with a desired film thickness, the thickness of a Cr thin film formed on the substrate 12 can be continuously changed in accordance with a desired transmittance distribution. Note that a desired film thickness distribution of a Cr thin film can be obtained by controlling the sputter rate while keeping the relative moving speed constant.

As described above, according to this embodiment, a Cr thin film having an arbitrary thickness can be formed in the radial direction of the substrate 12 by rotating the holder 11 on which the substrate 12 is mounted, while relatively moving the holder 11 and the shielding disk 13. Therefore, a filter having a film thickness distribution corresponding to a desired transmittance distribution or phase distribution can be manufactured as a light source modulation filter mounted in an effective light source of a projection exposure apparatus or a pupil filter used for the pupil of a projection optical system. Consequently, the transfer characteristics of the projection exposure apparatus can be improved.

Other sputtering targets instead of Cr, that are adequate to control the exposure light, for example, W, Si, C, Au, Ag, etc and alloy consisting of these matter, can be used.

(D2 Embodiment)

FIG. 50 shows the arrangement of an etching unit according to the D2 embodiment of the present invention. The unit basically has the function of a focus ion beam (FIB) unit. Similar to the D1 embodiment, this embodiment is characterized by a holder on which a substrate is mounted. This holder is identical to the one described in the D1 embodiment.

Ion beams (e.g., Ga+) emitted from an ion source 21 of an FIB unit pass through a stop 22 to be focused on a substrate 12 by an electrostatic lens 23. The FIB unit has at least one of the following functions: a function of continuously deflecting an ion beam radially from the rotational center of a holder 11; and a function of continuously moving the holder 11 relative to an ion beam in the radial direction from the rotational center.

In a film formation method, a Cr thin film 24 is deposited on a transparent substrate 12 to have a maximum thickness t1 in a desired film thickness distribution (FIG. 56(c)), and the substrate 12 is fixed on the holder 11 in such a manner that the rotational center of the holder 11 and the center of the substrate 12 coincide with each other. When an FIB is radiated on the Cr-deposited substrate surface, sputtering is performed, and the Cr thin film 24 on the substrate 12 is etched. While the dose (etching rate) of the FIB is kept constant, and the holder 11 is rotated at a constant speed, the relative moving speed of the beam and the stage is controlled to obtain a desired film thickness distribution (FIG. 56(c)). Alternatively, the dose of the FIB may be controlled while the relative moving speed is kept constant. If the FIB can be controlled such that the beam size is increased in a region having a moderate distribution gradient of the desired film thickness distribution (FIG. 56(c)) and is decreased in a region having a steep distribution gradient thereof (for example, by making the diameter of a stop 22 variable, making the holder 11 vertically movable, or making FIB focusing variable), a filter having an arbitrary transmittance distribution can be more efficiently formed.

Other films instead of Cr, that are adequate to control the exposure light, for example, W, Si, C, Au, Ag, etc and alloy consisting of these matter, can be used.

(D3 Embodiment)

FIG. 51 shows the arrangement of a main part of an etching unit according to the D3 embodiment of the present invention. This embodiment is different from the D2 embodiment in that a YAG laser is used in place of the FIB unit. In this case, a YAG laser beam is focused on a substrate on which Cr is deposited, and a filter 12 having an arbitrary transmittance distribution can be formed by the same control method as described above.

Other films instead of Cr, that are adequate to control the exposure light, for example, W, Si, C, Au, Ag, etc and alloy consisting of these matter, can be used.

(D4 Embodiment)

FIG. 52 shows the schematic arrangement of a thin film forming unit according to the D4 embodiment. This invention is associated with the transmittance monitor and control in the D1 and D2 embodiments described above. That is, the effect of the D4 embodiment is based on a combination of the D1 and D2 embodiments. FIG. 52 shows a case wherein a transmittance monitor and a control unit according to the D4 embodiment are incorporated in the unit described in the D1 embodiment.

Light emitted from a light source 40, which also emits exposure light, is collimated. The collimated light is split into two beams by a half mirror 41. One of the beams is detected, as reference light, by a detector 42, while the other beam is caused to pass through a substrate 12 on a holder 11 by an optical system designed to focus a beam on a surface to be detected, and is detected by a detector 44 through a reflecting mirror 43. Signals from the detectors 42 and 44 are supplied to a transmittance calculating circuit 45, so that a transmittance is calculated on the basis of the ratio of the intensity of one signal to that of the other signal. A feedback circuit 46 forms a feedback signal on the basis of the calculated transmittance and a target transmittance distribution (stored as data in a data base), thus driving a control circuit 47 to achieve the target transmittance. The control circuit 47 controls and drives a shielding disk actuator 48 and an actuator 49 for detection. The actuators 48 and 49 serve to continuously and relatively move a beam from the monitor light source 40 in a direction parallel to the holder 11, and are controlled such that the distance between a rotational axis B–B' and the position at which Cr is deposited coincides with the distance between the rotational axis B–B' and a monitored position.

In this embodiment, the transmittance of a minute area at the position at which a thin film is deposited is monitored, and the thickness of the deposited film is controlled by a feedback system. Therefore, film formation can be accurately performed even if the deposition rate is unstable, e.g., in a case wherein the deposition rate varies upon movement of a product by means of an actuator. Note that this embodiment can also be applied to the D2 embodiment.

(D5 Embodiment)

Figure 53:
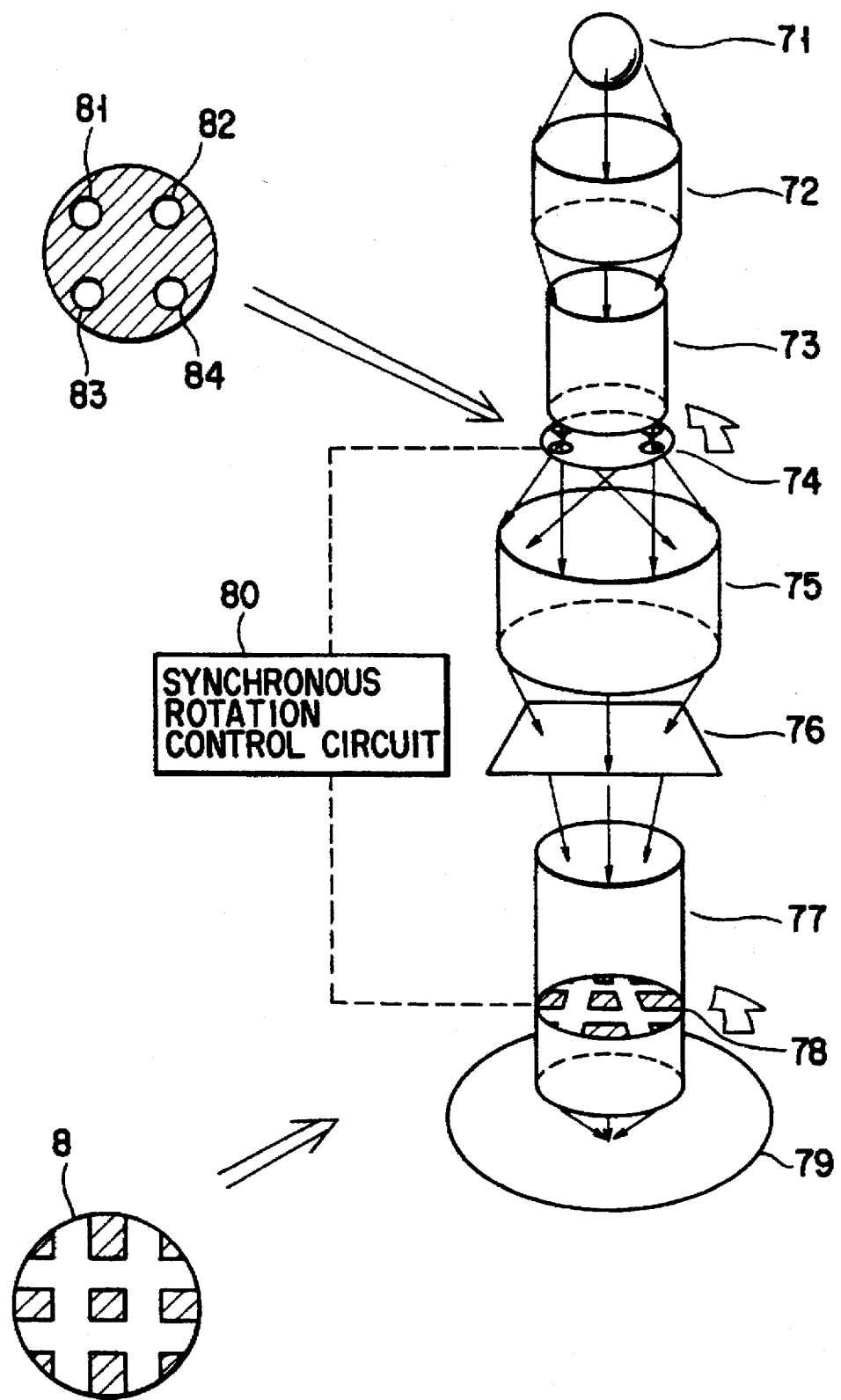
FIG. 53 is a schematic view showing the arrangement of a film thickness monitor mechanism according to the D5 embodiment.

FIG. 53 shows the D5 embodiment of the present invention. This embodiment is associated with an optical unit which is designed such that a prepared filter 52 is illuminated with a beam 51 having the same wavelength as that of exposure light, and a transmission image is formed on a two-dimensional CCD sensor 54 through a projection lens 53. The prepared filter 52 can be testes by comparing the resultant optical image with a desired transmittance distribution (FIG. 56(a)).

(D6 Embodiment)

FIGS. 54(a) to 54(e) show a translucent film forming process according to the D6 embodiment of the present invention. This embodiment is associated with the process of manufacturing a filter having a radial intensity transmittance distribution shown in FIG. 54(e) with respect to exposure light to be used. FIGS. 54(a) to 54(d) correspond to a cross-section taken along a line A–A' in FIG. 54(e). A desired transmittance distribution is divided into steps, as shown in FIG. 56(c), and a film is formed on a transparent substrate in accordance with a translucent film thickness distribution corresponding to FIG. 54(e). This process will be described in detail below.

Figure 54:
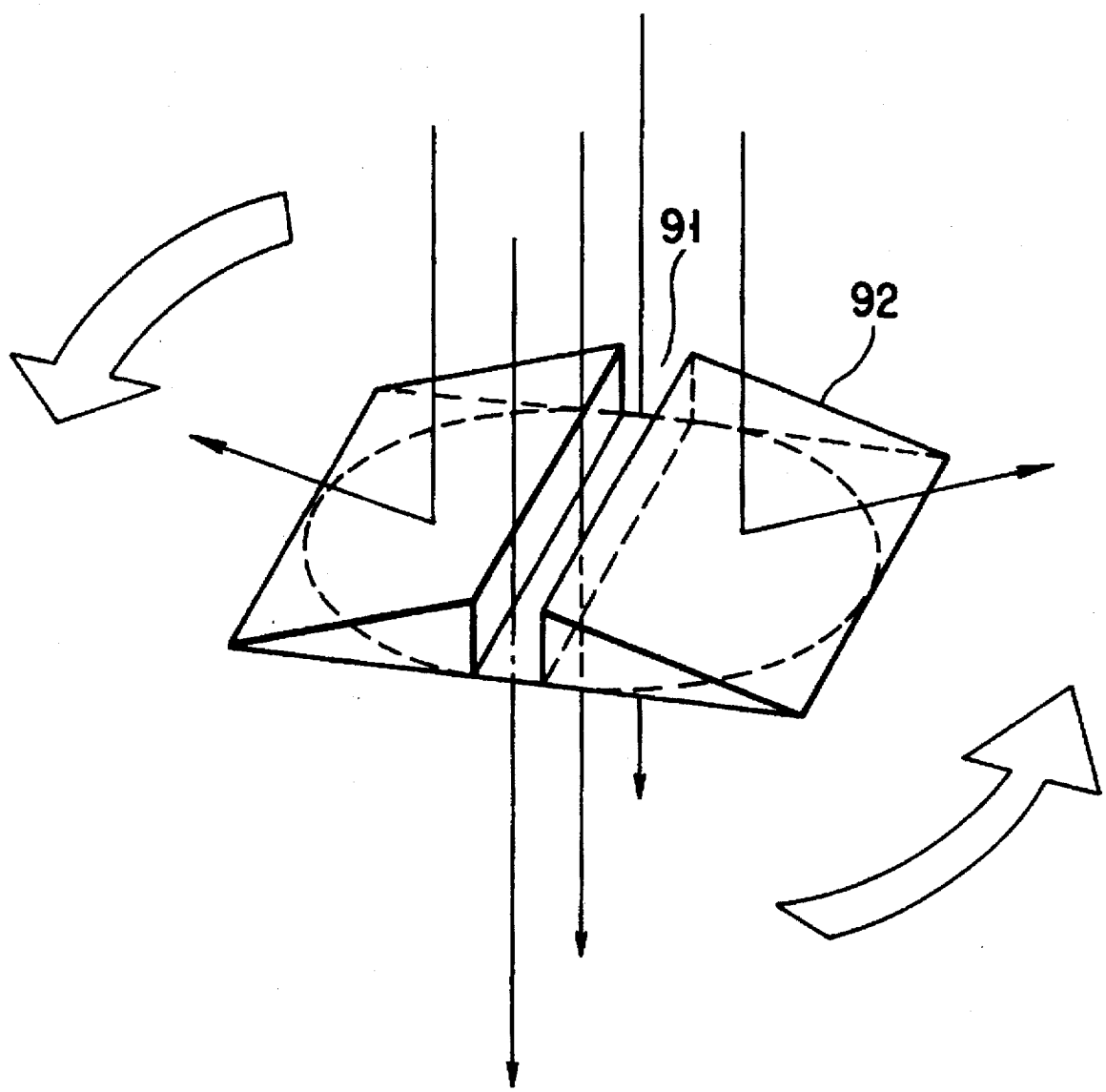
FIGS. 54(a) to 54(e) are views showing a thin film manufacturing process using lithography according to the D6 embodiment.

As shown in FIG. 54(a), a translucent thin film (e.g., Cr or amorphous silicon) 62 is deposited on a substrate (e.g., $SiO_2$, $MgF_2$, or $CaF_2$) 61 which is transparent to exposure light. A resist 63 is applied to the resultant structure by spin coating.

As shown in FIG. 54(b), after a circular portion of the resist 63 is exposed and developed, the translucent thin film 62 is etched by using the resist 63 as a mask to form a circular translucent portion in the center of the filter.

After the resist 63 is removed, a translucent thin film 62' is deposited again, and a resist 63' is applied to the resultant structure by spin coating, as shown in FIG. 54(c).

Subsequently, as shown in FIG. 54(d), a circular portion of the resist 63' is exposed and developed, and the thin film 62' is etched by using the resist 63' as a mask.

The above-described process is repeated to gradually increase the exposure size. In addition, both the thickness of a translucent thin film (Cr) to be deposited, and the radius of a translucent thin film portion to be left after etching are controlled to eventually form a filter having a desired transmittance distribution shown in FIG. 54(e).

For example, in a region having a steep transmittance distribution gradient, the thickness of a translucent thin film to be deposited is increased, and the exposure radius is finely increased in a circular exposure process. In contrast to this, in a region having a moderate transmittance distribution gradient, the thickness of a thin film is decreased, and the exposure radius is greatly increased in a circular exposure process.

(D7 Embodiment)

FIGS. 55(a) to 55(d) show a translucent film forming process according to the D7 embodiment of the present invention. More specifically, FIGS. 55(a) to 55(d) show the process of manufacturing a filter having a radial intensity transmittance distribution shown in FIG. 56(a) with respect to exposure light to be used. Similar to the D5 embodiment, in this embodiment, a desired transmittance distribution is divided into steps, as shown in FIG. 56(b), and a translucent film is formed on a transparent substrate in accordance with a translucent film thickness distribution corresponding to the desired transmittance distribution. The process will be described in detail below.

As shown in FIG. 55(a), a translucent thin film 72 is deposited on a substrate 71, which is transparent to exposure light, to the maximum thickness of the desired translucent film thickness distribution (FIG. 56(c)), i.e., a thickness t1. Thereafter, a resist 73 is applied to the translucent thin film 72 by spin coating.

As shown in FIG. 55(b), circular exposure is performed in the radial direction from the filter center within a radius r1 shown in FIG. 56(c). Upon development, etching is performed until the translucent thin film 72 reaches a thickness t2 shown in FIG. 56(c).

Subsequently, as shown in FIG. 55(c), after the resist 73 is removed, a resist 73' is applied again to the resultant structure by spin coating. As shown in FIG. 55(d), circular exposure is performed in the radial direction from the filter center within a radium r2 shown in FIG. 56(c). Upon development, etching is performed until the translucent thin film reaches a thickness t3 shown in FIG. 56(c).

The above-described process is repeated while an exposure radius r within which exposure is performed in the radial direction from the filter center is increased, and the etching time for each step is controlled to allow the translucent thin film 72 to have a desired film thickness in accordance with the distribution shown in FIG. 56(c). For example, in a region having a steep transmittance gradient, the exposure radius r is finely increased, while the etching rate is increased in a circular exposure process. In contrast to this, in a region having a moderate transmittance gradient, the exposure radium r is greatly increased, while the etching rate is decreased in a circular exposure process. With such control, a filter having an arbitrary transmittance distribution can be formed.

As described in detail above, according to the present invention, a substrate which is transparent to exposure light used for photolithography is rotated, and sputter atoms for deposition of a translucent film or energy beams for etching a translucent film are selectively radiated on the substrate. In addition, the radiating position of sputter atoms or energy beams is moved in the radial direction of the substrate. With this operation, the film thickness distribution of the translucent film in the radial direction of the substrate can be controlled, and a filter having a desired transmittance distribution or phase distribution can be manufactured as a light source modulation filter mounted in an effective light source of a projection exposure apparatus or a pupil filter used for the pupil of a projection optical system, thereby contributing an improvement in transfer characteristics.

(E1 Embodiment)

This embodiment is different from the conventional apparatus in that a secondary source forming film 30 constituted by a liquid crystal array panel formed by two-dimensionally arranging a micro liquid crystal shutter is used in place of the annular filter 9' in FIG. 57. A detailed arrangement of this secondary source forming filter 30 is shown in FIGS. 58(a)

and 58(b). Reference numerals 31 and 32 denote pixels of the liquid crystal array panel. The pixels 31 indicate an opened state of the shutter; and the pixels 32, a closed state. Referring to FIGS. 58(a) and 58(b), the liquid crystal array panel is constituted by 20 pixels (vertical)×20 pixel (horizontal). The liquid crystal array panel may be constituted by a larger number of pixels as needed. Reference numeral 33 denotes a position corresponding to the optical axis.

Figure 58:
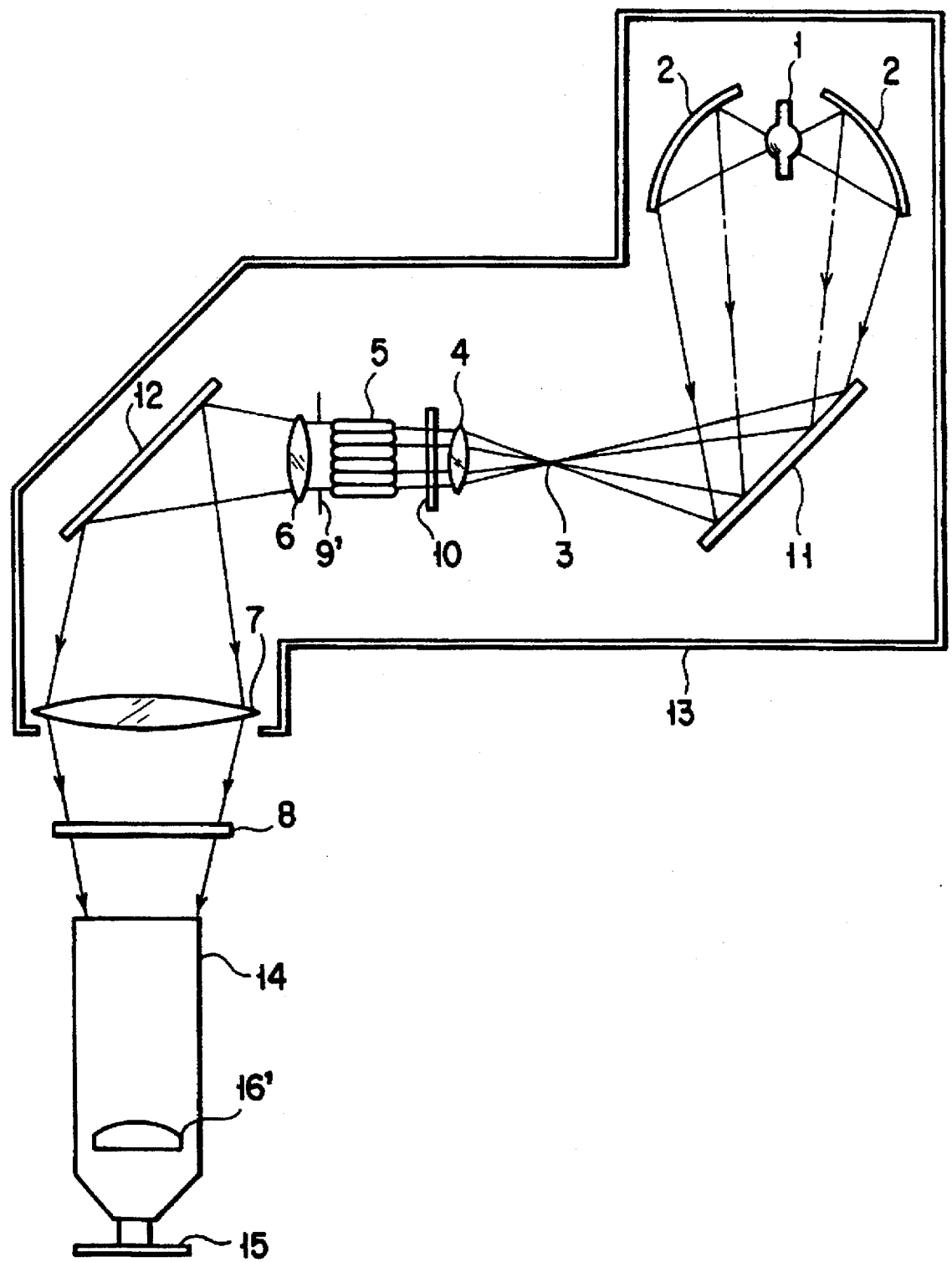
FIGS. 58(a) and 58(b) are views showing the detailed arrangement of a secondary source forming filter constituted by a liquid crystal array panel in the projection exposure apparatus.

When a layer constituted by L/S patterns and isolated positive patterns is to be transferred, an annular pattern is formed by the liquid crystal array panel, as shown in FIG. 58(a). In this case, the liquid crystal array panel serves as an annular filter. When a layer constituted by isolated negative patterns or one pattern is to be transferred, an aperture which provides a small σ value is formed by the liquid crystal array panel, as shown in FIG. 58(b). In this case, the liquid crystal array panel serves as a circular aperture stop having a small σ value. The pattern of the liquid crystal array panel is changed in accordance with the type of layer to be transferred in this manner so that effective light source shapes can be instantaneously and easily formed with respect to all types of LSI pattern transfer.

Figure 59:
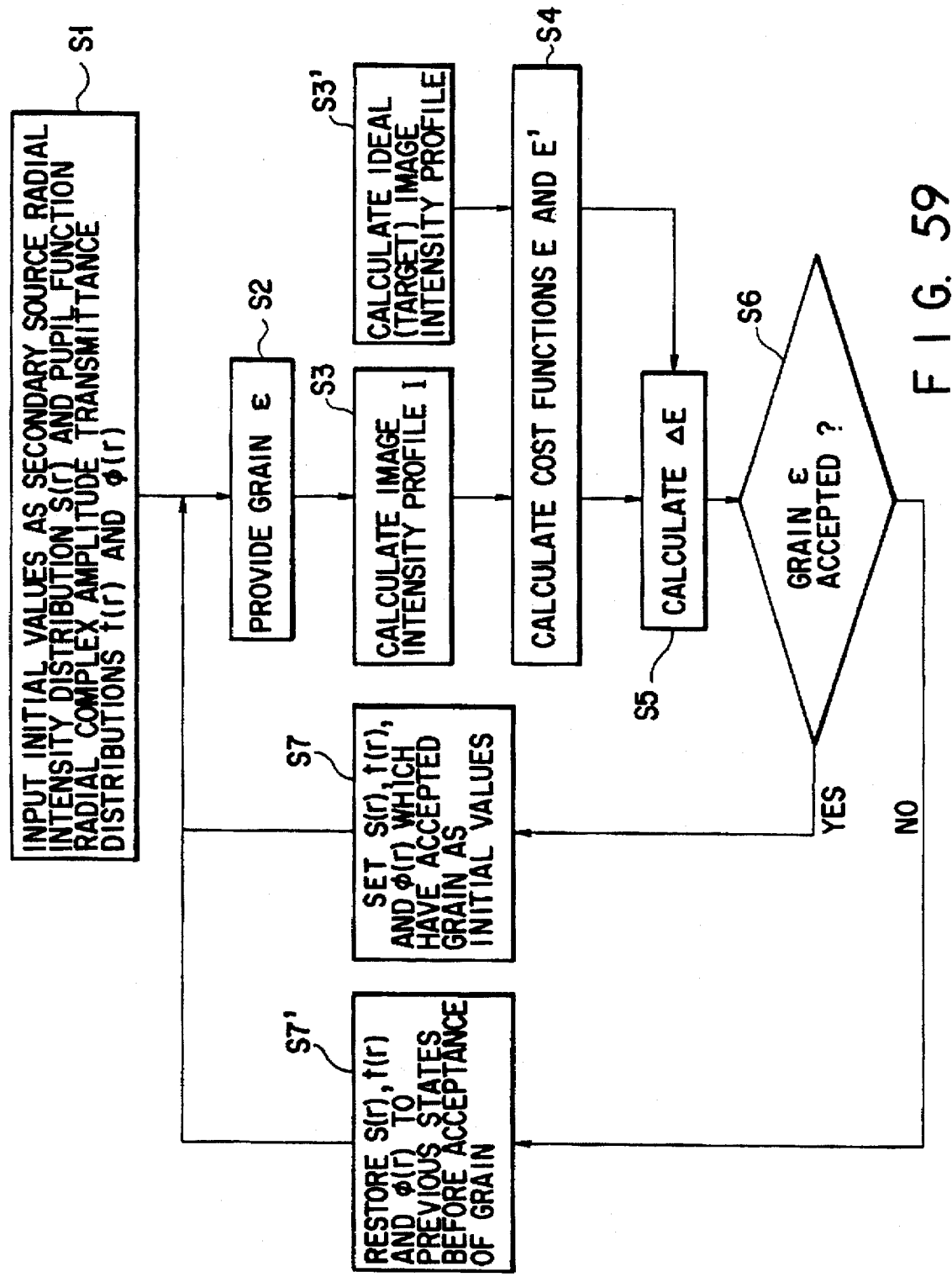
FIG. 59 is a view showing a filter pattern for four-division illumination.

In addition, as shown in FIGS. 60(a) and 60(b), the pattern of the liquid crystal array panel can be converted into a transmittance distribution having gradation instead of a binary distribution. In many cases, the optimal light source shape with respect to a given pattern is not the binary distribution described above but is a distribution having gradation. In such a case, a filter corresponding to a desired light source shape can also be formed by a liquid crystal array panel. In addition, as shown FIG. 59, a filter pattern for four-eye illumination can be formed by using liquid crystal array panel.

(E2 embodiment)

FIGS. 61(a) and 61(b) are views for explaining the arrangement of a main part of a projection exposure apparatus according to the E2 embodiment of the present invention. More specifically, FIGS. 61(a) and 61(b) show the detailed arrangement of a secondary source forming filter 40 constituted by a liquid crystal array panel formed by concentrically arranging an annular liquid crystal shutter. Reference numerals 41 and 42 denote rings of the liquid crystal array panel. The rings 41 indicate an opened state of the shutter; and the rings 42, a closed state. Referring to FIGS. 61(a) and 61(b), ten rings are concentrically arranged to form the liquid crystal array panel. However, the number of rings may be increased as needed. Reference numeral 43 denotes a portion corresponding to the optical axis.

When a layer constituted by L/S patterns and isolated positive patterns is to be transferred, an annular pattern is formed by the liquid crystal array panel, as shown in FIG. 61(a). In this case, the liquid crystal array panel serves as an annular filter. When a layer constituted by isolated negative patterns or hole patterns are to be transferred, an aperture which provides a small σ value is formed by the liquid crystal array panel, as shown in FIG. 61(b). In this case, the liquid crystal array panel serves as a circular aperture stop having a small σ value. The pattern of the liquid crystal array panel is changed in accordance with the type of layer to be transferred in this manner so that effective light source shapes can be instantaneously and easily formed with respect to all types of LSI pattern transfer.

Figure 62:
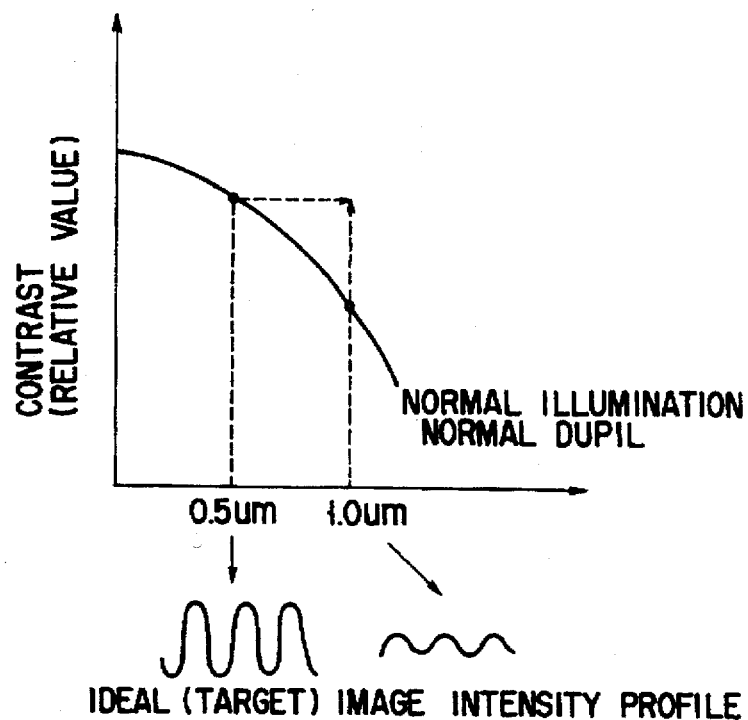
FIGS. 62(a) and 62(b) are views showing a case wherein the pattern of a liquid crystal panel has a transmittance distribution with gradation.

Furthermore, as shown in FIGS. 62(a) and 62(b), the pattern of a liquid crystal panel can have a "transmittance distribution" with gradation instead of a "binary distribution". In many cases, the optimal light source shape with respect to a given pattern is not the binary distribution described above but is a distribution having gradation. In such a case, a filter corresponding to a desired light source shape can be formed by the liquid crystal panel.

(Additional Embodiment)

Figure 66:
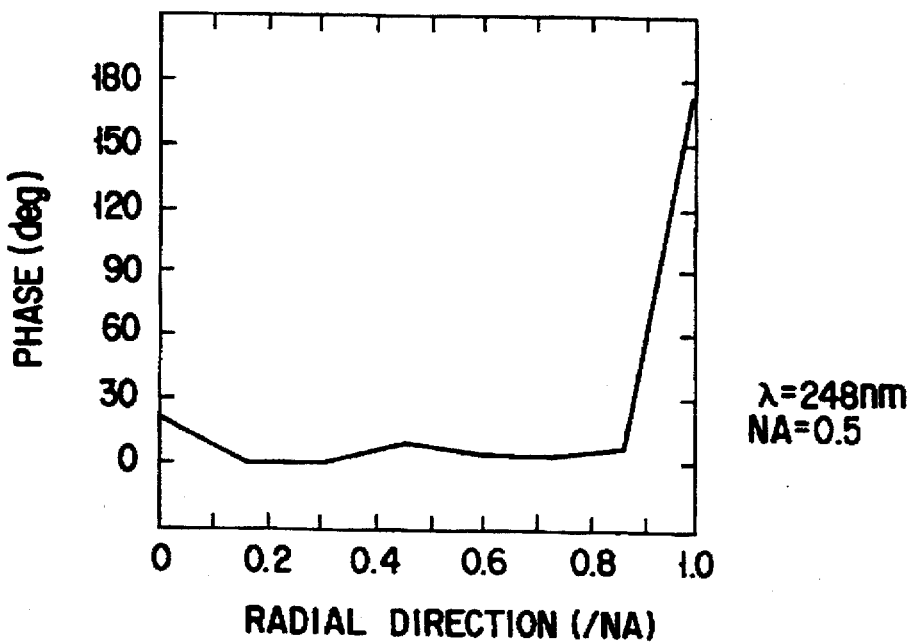
FIG. 66(a) is a schematic view showing the arrangement of an apparatus having optical fiber bundles and a portion having an optical conversion function based on optical waveguides, which components are used in place of the liquid crystal panels in the above embodiments.
FIG. 66(b) is a sectional view taken along a line A—A in FIG. 66(a), illustrating an optical fiber bundle.

FIG. 66(a) shows the schematic arrangement of an apparatus having optical fiber bundles 71 and 72 and an optical modulator 75 having an optical conversion function based on optical waveguides, which components are used in place of the liquid crystal array panels described above. FIG. 66(b) is a sectional view taken along a line A—A in FIG. 66(a), illustrating an optical fiber bundle.

This apparatus is different from the conventional apparatus as follows:

(1) A light source 11 and a projection exposure system 18 are connected to each other through the optical fiber bundles 71 and 72.

(2) The optical modulator 75 is arranged between the light source 11 and the projection exposure system 18.

Each optical fiber bundle is constituted by a bundle of a large number of fine optical fibers, as indicated by the sectional view of FIG. 66(b). The respective optical fibers are optically independent of each other so that each optical fiber can transmit light without causing mixing of light passing therethrough with light passing through another optical fiber.

Figure 67:
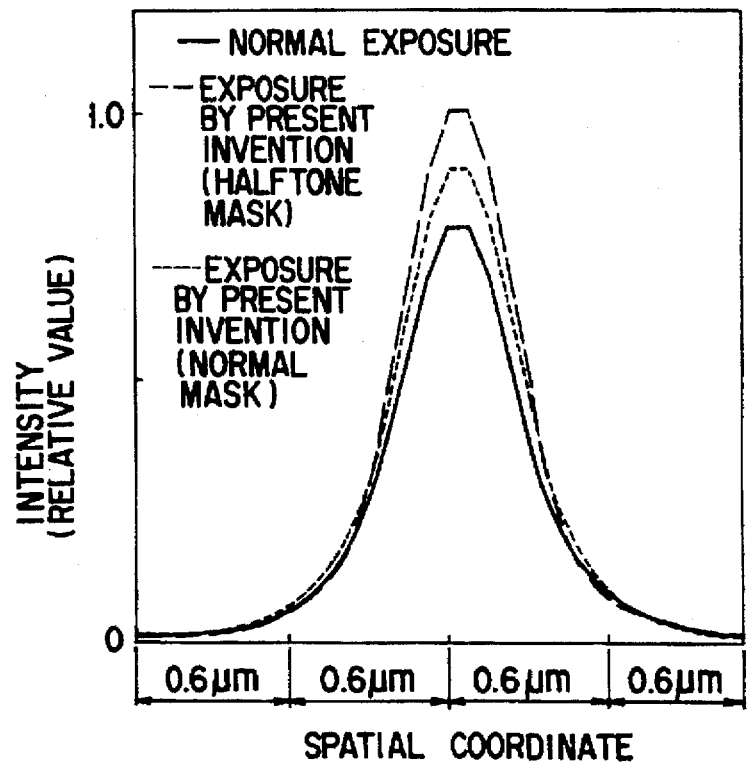
FIG. 67(a) is a schematic view showing the arrangement of an optical modulator.
FIG. 67(b) is a view showing the arrangement of the optical waveguides of the optical modulator.
FIG. 67(c) is a view showing the arrangement of the optical modulator in which an AOM (acousto-optic modulator) is arranged in an optical waveguide of the optical modulator.

FIG. 67(a) shows the schematic arrangement of an optical modulator. Light beams emitted from a light source are equalized in light amount and are subsequently incident on the first fiber bundle 71. This fiber bundle 71 is connected to the optical modulator 75 arranged between the two bundles. The fiber bundle 71 is constituted by a plurality (four in FIG. 67(a) for the sake of illustrative convenience) of small bundle fibers 70. The small bundle fibers 70 are connected to the optical modulator 75 so as to be differently modulated in units of small bundles. The modulated light beams are incident an the second fiber bundle 72. By performing different modulation processes with respect to these optical fibers 70, light having an arbitrary spatial intensity distribution can be obtained on the projection system 18 side. When a layer constituted by L/S patterns and isolated positive patterns is to be transferred, modulation is performed with respect to the fibers 70 in an "annular-shape" or "four-eye" manner. If a layer constituted by isolated negative patterns is to be transferred, modulation is performed with respect to the fibers 70 to provide a small σ value.

As described above, by changing the "manner of modulation" with respect to a layer to be transferred, effective light source shapes can be instantaneously and easily formed with respect to all types of LSI pattern transfer. In addition, it is apparent that not only the light source shape but also the intensity distribution can be continuously changed. The resulting light can be used as a "secondary source".

As the optical modulator 75, a modulator based on optical waveguides may be considered. For example, waveguides are arranged, as shown in FIG. 67(b). More specifically, an electrooptical crystal or the like is arranged on an optical path on one side to electrically change the optical path length, thus arbitrarily controlling the light intensity on the output side.

Alternatively, as shown in FIG. 67(c), an AOM (acousto-optic modulator) may be arranged in a waveguide to electrically generate a diffraction grating therein, thereby controlling the intensity of light passing through the optical modulator 75. Since modulation can be performed by proving a monitoring function to an output-side (OUT) fiber, the intensity distribution of the light source can be stably determined.

(E3 Embodiment)

Figure 63:
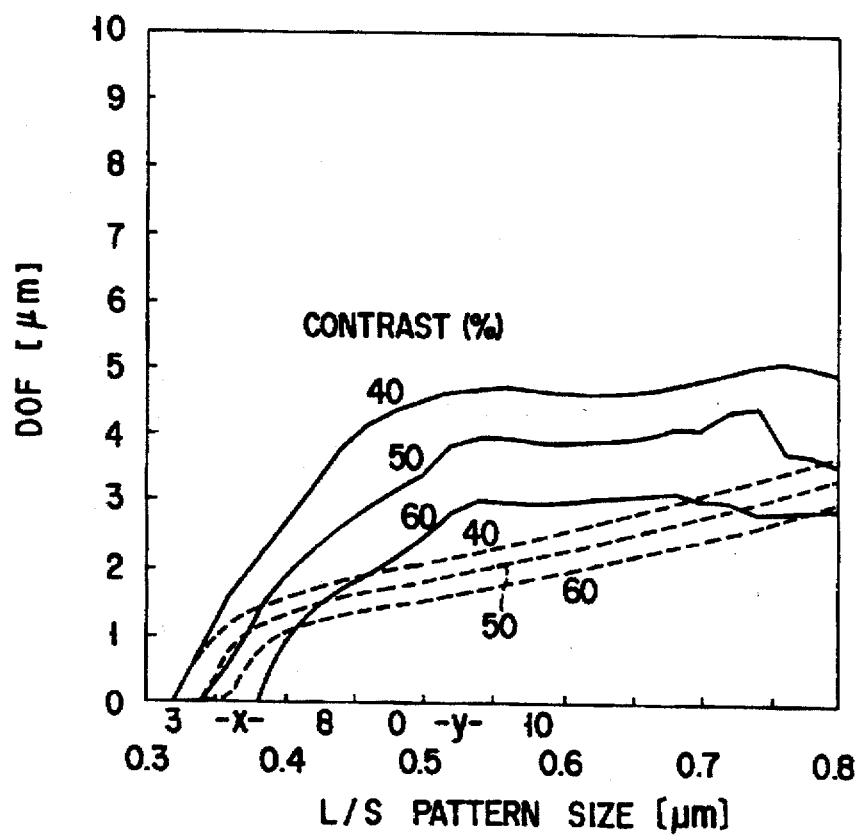
FIG. 63 is a schematic view showing the arrangement of a projection exposure apparatus according to the E3 embodiment of the present invention.

FIG. 63 shows the schematic arrangement of a projection exposure apparatus according to the E3 embodiment of the present invention. In this embodiment, a spatial frequency filter 50 constituted by a liquid crystal array panel is arranged at the pupil position of a projection optical system in the apparatus in place of the spatial frequency filter 16'.

Figure 64:
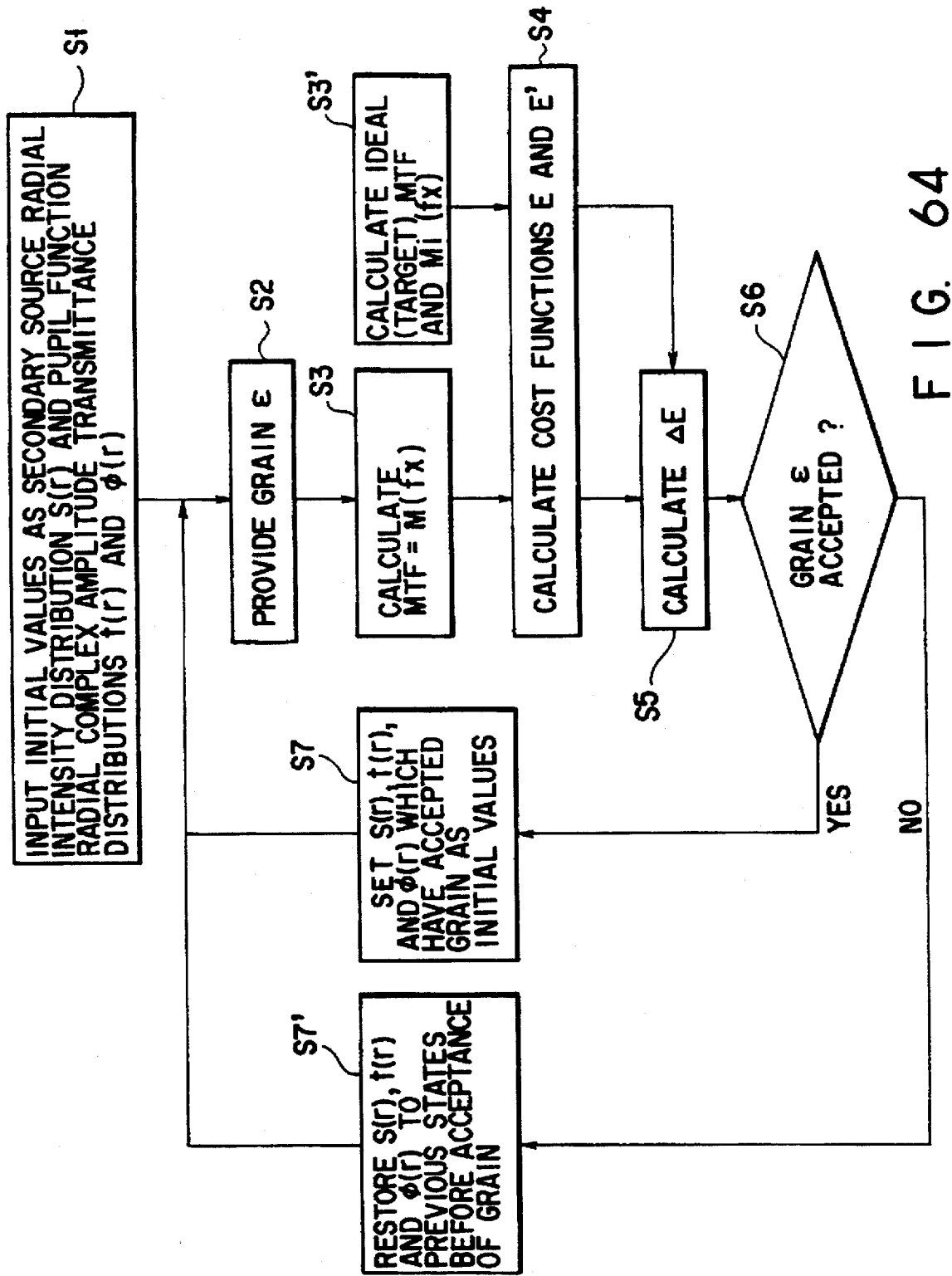
FIGS. 64(a) and 64(b) are views showing the detailed arrangement of a spatial frequency filter constituted by a liquid crystal array panel.

FIG. 64(a) shows the detailed arrangement of the spatial frequency filter 50 constituted by the liquid crystal array panel. Reference numerals 51 and 52 denote pixels of the liquid crystal array panel. The pixels 51 indicate an opened state of the shutter; and the pixels 52, a translucent state. Referring to FIG. 64(a), the liquid crystal array panel is constituted by 20 pixels (vertical)×20 pixels (horizontal). However, the panel may be constituted by a larger number of pixels as needed. Reference numeral 53 denotes a portion corresponding to the optical axis. This liquid crystal array panel is arranged at the pupil position of the projection optical system. By controlling this two-dimensional array panel, a radial (r) transmittance distribution t at the pupil given by the following equation is set:

$$t(r)=\cos(2\pi\beta r^2-\theta/2) \text{ (for, }=2\Delta\phi-8\pi\beta/NA^2)$$

FIG. 64(b) shows an amplitude transmittance distribution profile taken along a line A–A' in FIG. 64(a). Referring to FIG. 64(b), the broken curve indicates an ideal amplitude transmittance distribution calculated from the above equation; and the solid curve, a distribution formed by the liquid crystal array panel. In order to increase the precision, the size of each pixel may be reduced. If the values $\beta$ and $\theta$ in the above equation are changed, the characteristics of the filter are changed, and the characteristics associated with the depth-of-focus increasing effect are changed depending on the LSI pattern size. Therefore, by controlling the liquid crystal array panel in accordance with a layer to be transferred, a filter having a shape suitable for the layer can be instantaneously and easily formed.

(E4 Embodiment)

Figure 65:
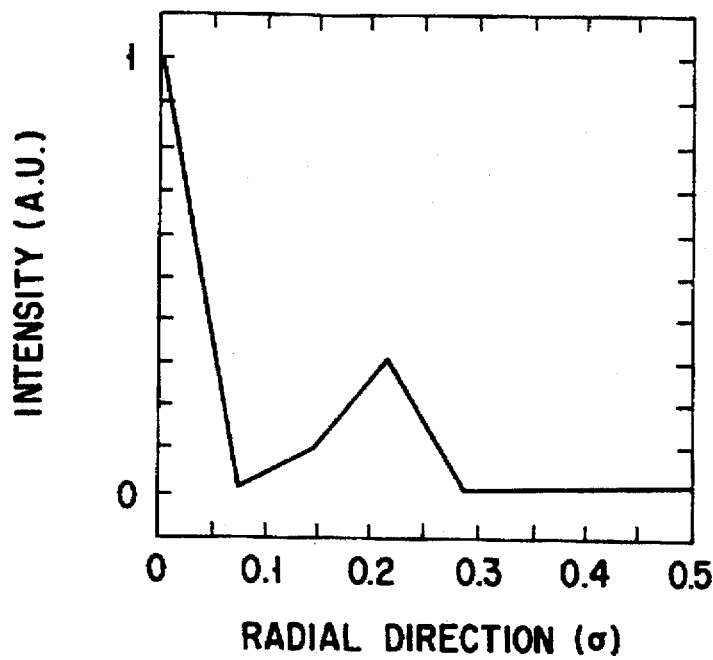
FIGS. 65(a) and 65(b) are views showing the arrangement of a filter portion of a projection exposure apparatus according to the E4 embodiment of the present invention.

FIG. 65(a) is a view for explaining the arrangement of a main part of a projection exposure apparatus according to the E4 embodiment of the present invention, illustrating the detailed arrangement of a spatial frequency filter 60 constituted by an annular concentrical liquid crystal panel. Reference numerals 61 and 62 denote rings of the liquid crystal panel. The rings 61 indicate an opened state of the shutter; and the rings 62, a translucent state. Referring to FIG. 65(a), ten rings are concentrically arranged to form the liquid crystal panel. However, the number of rings may be increased as needed. Reference numeral 63 denotes a portion corresponding to the optical axis. This liquid crystal panel is arranged at the pupil position of a projection optical system. By controlling the liquid crystal panel, the transmittance of each ring is determined to set a radial (r) transmittance distribution t at the pupil according to the following equation:

$$t(r)=\cos(2\pi\beta r^2-\theta/2) \text{ (for, }=2\Delta\phi-8\pi\beta/NA^2)$$

FIG. 65(b) shows an amplitude transmittance distribution profile taken along a line A–A' in FIG. 65(a). Referring to FIG. 65(b), the broken curve indicates an ideal amplitude transmittance distribution calculated from the above equation; and the solid curve, a distribution formed by the liquid crystal array panel. In order to increase the precision, the width of each ring may be reduced. If the values $\beta$ and $\theta$ in the above equation are changed, the characteristics of the filter are changed, and the characteristics associated with the depth-of-focus increasing effect are changed depending on the LSI pattern size. Therefore, by controlling the liquid crystal panel in accordance with a layer to be transferred, a filter having a shape suitable for the layer can be instantaneously and easily formed.

The present invention is not limited to the above-described embodiments. In the above embodiments, a liquid crystal shutter is used as a filter for defining a light source shape or a pupil shape. The present invention is not limited to this but may use a device having a shutter function designed to change the transmittance by electrical control. In addition, a reticle is not limited to the conventional binary transmission type. For example, a phase shift mask may used instead.

As described in detail above, according to the present invention, a portion (e.g., a micro shutter which can be opened/closed, or a conversion means) capable of arbitrarily performing modulation by electrical control is used as a filter for defining a secondary source shape of an illumination optical system or a pupil shape of a projection optical system. With this arrangement, an optimal filter shape (light source shape) can be realized in accordance with a layer to be transferred, the type of pattern to be transferred, and the pattern size, thereby improving the pattern transfer efficiency.

Furthermore, in an apparatus using fibers, the position of a light source can be arbitrarily set with respect to the position of a secondary source. In addition, the spatial light intensity distribution of exposure light can be monitored.

(I1 Embodiment)

FIG. 28 is a plan view showing the aperture pattern of a four-eye filter 20 serving as the special aperture stop 9' used in the apparatus of this embodiment. Referring to FIG. 28, the hatched portion indicates a shielding portion 23, and four circular apertures (light-transmitting portions) 22 are respectively arranged at positions which are quadruple-symmetrical about an optical axis 21 and are shifted therefrom. As a mask 8, a halftone mask (to be described later) is used.

FIG. 29 shows a calculation result of focus margins with respect to pattern sizes in exposure performed by using a four-eye filter in the I1 embodiment. Referring to FIG. 29, the broken curve indicates the depth of focus obtained when a normal Cr mask is transferred by a normal illumination process ($\sigma$ value=0.6); the solid curve, the depth of focus obtained when exposure is performed by four-eye illumination using a normal Cr mask; and the alternate long and short dash curve, the depth of focus obtained when exposure is performed by four-eye illumination using a halftone mask (I1 embodiment). Note that the NA of an exposure unit is 0.55, and a wavelength $\lambda$ of exposure light is 365 nm.

It is found that the depth of focus is uniformly increased with respect to all the line widths by performing four-eye illumination using the halftone mask. In this case, the depth of focus is maximized near L/S=0.4 μm, and is minimized near L/S=0.7 μm, similar to the case wherein the normal Cr mask is used. However, in the exposure method of the embodiment, since the absolute value of the depth of focus is increased, a sufficient depth of focus can be obtained with respect to a pattern having a large L/S size.

FIGS. 30(a) to 32(c) are views for explaining the mask 8 used in the apparatus of the embodiment. FIG. 30(a) shows the typical sectional structure of a halftone mask. FIG. 30(b) shows a light amplitude distribution. FIG. 30(c) shows a light intensity distribution. The halftone mask is designed such that an LSI pattern is formed on a light-transmitting substrate 30 (normally consisting of $SiO_2$) by using a film 31 which is translucent to exposure light ($1\% \leq$ amplitude transmittance $\leq 30\%$). The thickness of the translucent film 31 is controlled such that the phase of light 32 transmitted through the film 31 with respect to the phase of light 33 transmitted through the substrate is given by $$180 \times (2n+1) \text{ (degree)} \pm 30(\%)$$

where n is an integer.

The transmitted light 33 is diffracted and spread on a wafer so that a profile B shown in FIG. 30(b) is obtained. Since the light 32 transmitted through the translucent film 31 is inverted in phase on the wafer (profile A), the light 32 and the light 33 interfere with each other to reduce their intensities, thus improving the image contrast (profile C).

In the above embodiment, a large effect can be obtained by exposing the halftone mask using the four-eye illumination filter. Even if other types of phase shift masks, e.g., a shifter edge type phase shift mask and a self-alignment type phase shift mask, are used, a large effect can be obtained in the same manner as described above. FIGS. 31(a) to 31(c) show the typical sectional structure of a shifter edge type phase shift mask. The shifter edge type phase shift mask is designed such that an LSI pattern is formed on a light-transmitting substrate 30 (normally consisting of $SiO_2$) by using a film typically ($SiO_2$) 34 which is transparent to exposure light. The thickness of this transparent film 34 is controlled such that the phase of light 35 transmitted through the film 34 with respect to the phase of light 33 transmitted through the substrate is given by $$180 \times (2n+1) \text{ (degree)} \pm 30(\%)$$

where n is an integer.

Since the phases of the light 33 and the light 35 have opposite phases on the wafer, components corresponding to edge portions of the transparent film 34 interface with each other to reduce 54their intensities, thus forming dark portions. Since the line width of the transparent film 34 is small, the dark portions at the two edge portions overlap each other to form one dark portion.

Figure 32A:
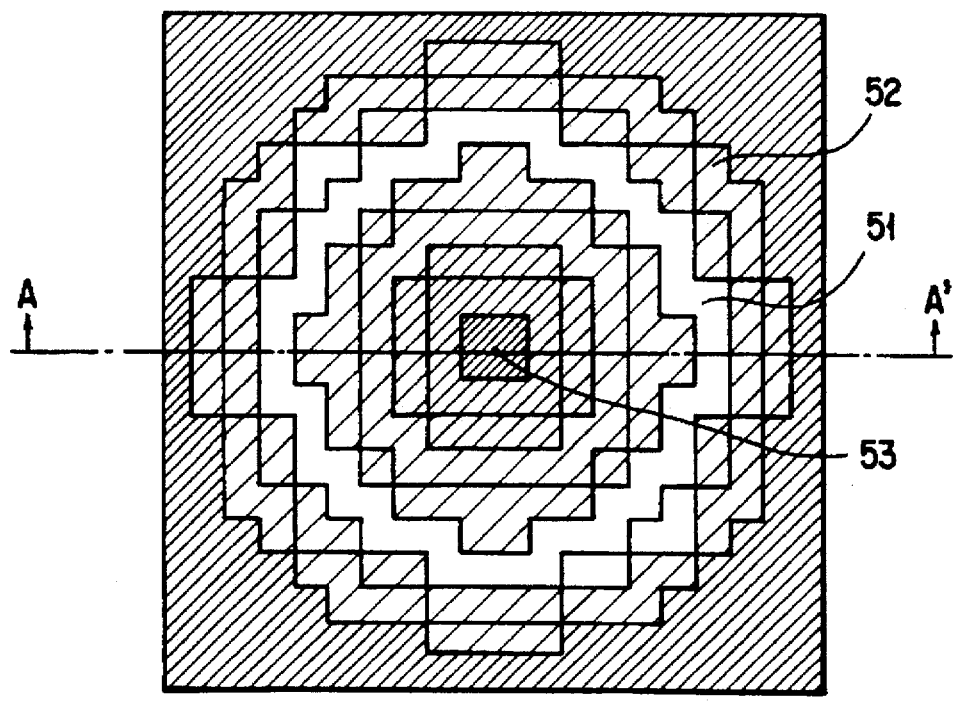
Figure 32B:
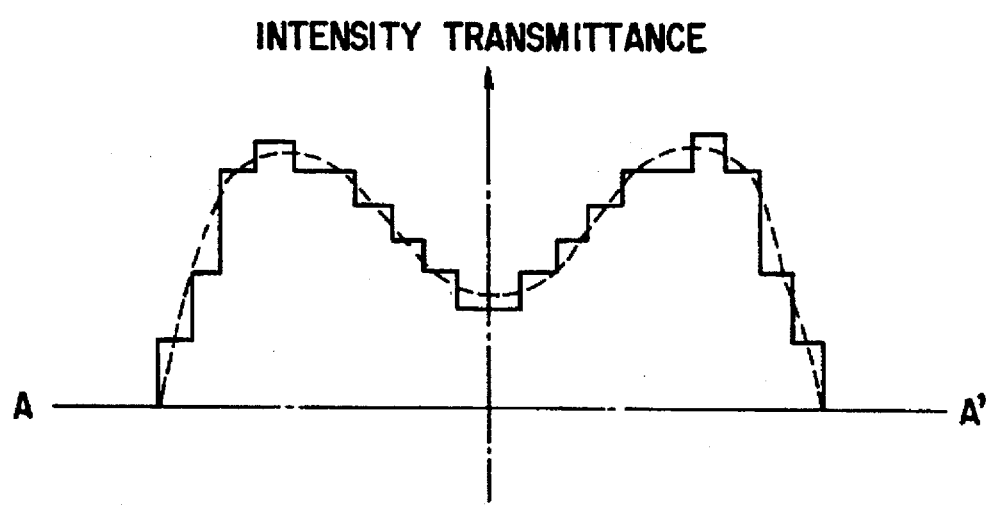

FIG. 32(a) shows the typical sectional structure of a self-aligned type phase shift mask. The self-aligned type phase shift mask is designed such that an LSI pattern is formed on a light-transmitting substrate 30 (normally consisting of $SiO_2$) by using a film 36 (e.g., Cr) which is opaque to exposure light. A phase shifter 37 is formed around the opaque film 36 by using a material (e.g., $SiO_2$) which is transparent to exposure light. The thickness of this phase shifter 37 is controlled such that the phase of transmitted light 38 with respect to the phase of light 33 transmitted through the substrate is given by $$180 \times (2n+1) \text{ (degree)} \pm 30(\%)$$

where n is an integer. In this embodiment, the above optical principle is achieved by the structure described above. However, the present invention is not limited to this structure, but other mask structures may be employed to achieve the above optical principle.

As described above, according to the embodiment, the four-eye filter 20 shown in FIG. 28 is used to determine a light source shape, and one of the various phase shift masks shown in FIGS. 30(a) to 32(c) is used as the mask 8, thereby improving the DOF increasing effect with respect to all the L/S pattern sizes. Therefore, even if the size of an L/S pattern is large, the depth of focus can be sufficiently increased, and an improvement in pattern exposure precision can be achieved.

(I2 Embodiment)

In this embodiment, a four-eye filter and a pupil filter are used. In addition to a four-eye filter for determining a light source shape, which is the same as that shown in FIG. 28, the embodiment includes a phase filter 40 shown in FIGS. 33(a) and 33(b) arranged at the pupil position of a projection optical system.

The phase filter shown in FIG. 33(a) has a disk-like shape rotationally symmetrical about an optical axis 41. The diameter of the phase filter corresponds to the pupil diameter. The phase filter is made of a material which transmits exposure light, e.g., $SiO_2$. The thickness of an annular region 42 having an inner diameter r and a width d is larger than that of the remaining region 43 by a value t. That is, the optical path length of light passing through the region 42 is longer than that of light passing through the region 43. This difference in optical path length causes a phase difference of light. The values r, d and t are determined depending on the line width at which the depth of focus is to be increased, the position of the four-eye filter, and the like. In this embodiment, the phase filter having a thickness distribution shown in FIG. 33(a) is used. The present invention is not limited to this. The phase filter shape can be changed depending on the line width at which the depth of focus is to be increased and the type of line.

The phase filter shown in FIG. 33(b) produces the same effect as that produced by the above-described phase filter. This phase filter is different from the one shown in FIG. 33(a) in that the thickness of an annular region 42 having an inner diameter r and a width d is lower than that of the remaining region 43 by a value t. That is, the optical path length of light passing through the region 42 is smaller than that of light transmitting through the region 43. Since one period of the phase difference of light, caused by the difference in optical path length, is represented by $2\pi$, a desired phase difference can be obtained by using any one of the structures shown in FIGS. 33(a) and 33(b).

Figure 34:
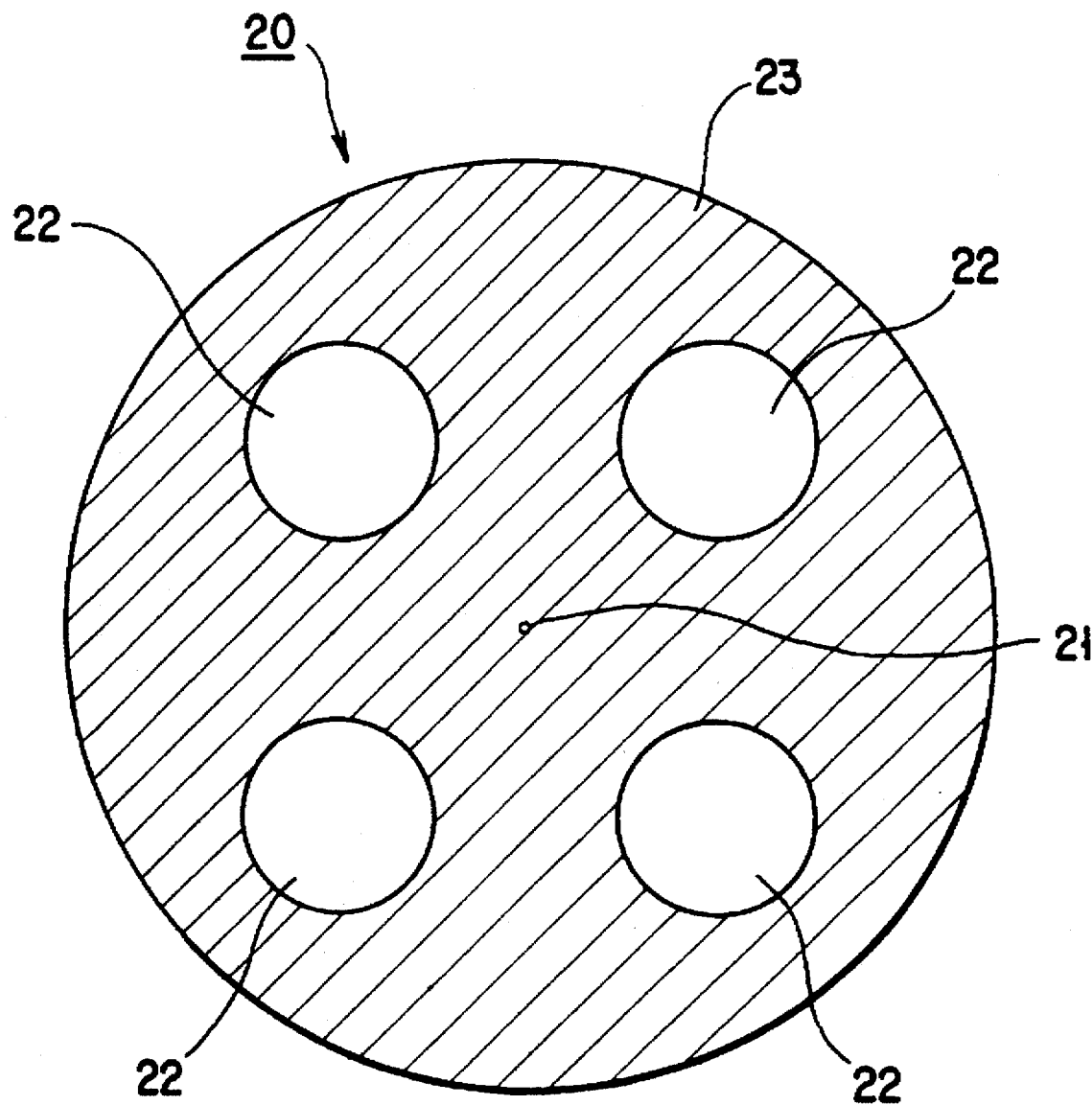
FIG. 34 is a graph showing the relationship between the L/S size and the DOF according to the I2 embodiment.

FIG. 34 shows a calculation result of focus margins with respect to pattern sizes in exposure performed by using a four-eye filter 20 having four apertures and the phase filter 40. Referring to FIG. 34, the broken curve indicates the depth of focus obtained by normal exposure (e.g., exposure performed by using only a four-eye filter); the solid curve, the depth of focus obtained by exposure performed by the embodiment using a normal Cr mask (i.e., "four-eye filter+pupil filter"); and the alternate long and short dash curve, the depth of focus obtained by exposure performed by the embodiment using a halftone mask (i.e., "four-eye filter+pupil filter+halftone mask"). Note that the NA of an exposure unit is 0.55; a coherence factor $\sigma$, 0.6; and a wavelength $\lambda$ of exposure light, 365 nm.

It is found that when the phase filter 40 is arranged at the pupil position, the depth-of-focus increasing effect is increased when L/S>0.65 µm, and the problem posed in an exposure process performed by only four-eye illumination is solved. In addition, it is found that if the halftone mask shown in FIGS. 30(a) to 30(c) is used, the effect is enhanced. The same effect can also be obtained by using the shifter edge type phase shift mask shown in FIGS. 31(a) to 31(c) or the self-alignment type phase shift mask shown in FIGS. 32(a) to 32(c). In addition, since the amplitude transmittance of a pupil function is 100%, there is no possibility of causing one of the problems in the "superflex method", i.e., the problem that the filter absorbs exposure light to generate heat, and thermal expansion of the optical system occurs, resulting in a deterioration in transfer precision.

(I3 Embodiment)

In this embodiment, a "four-eye/annular filter" is used. A special stop 9' on a secondary source plane in the embodiment has a shape shown in FIG. 35 and is constituted by an optical axis 51, light-transmitting portions 52, and a light-shielding portion 53. In this special stop 9', circular light-transmitting portions A, B, C, and D having wide regions in the radial direction with respect to the optical axis as the center are connected to each other through a ring-like light-transmitting portion E having a narrow region in the radial direction.

Figure 36A:
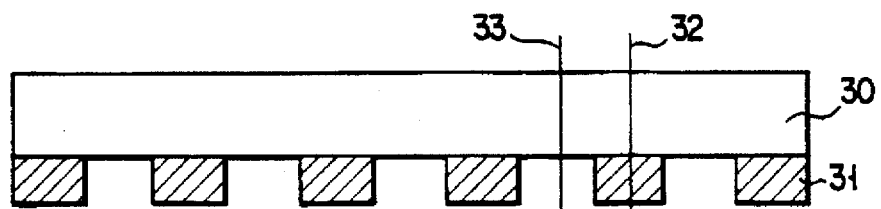
FIG. 36 is a plan view showing another four-eye filter having an annular portion.
Figure 36B:
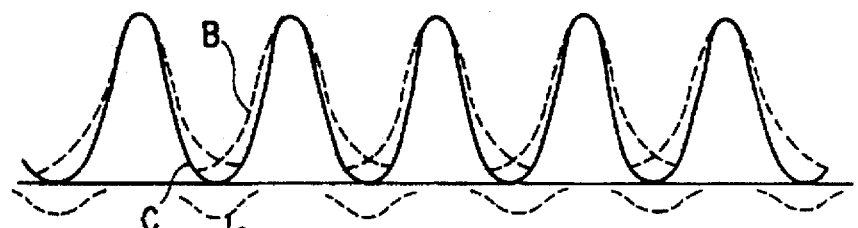
Figure 36C:
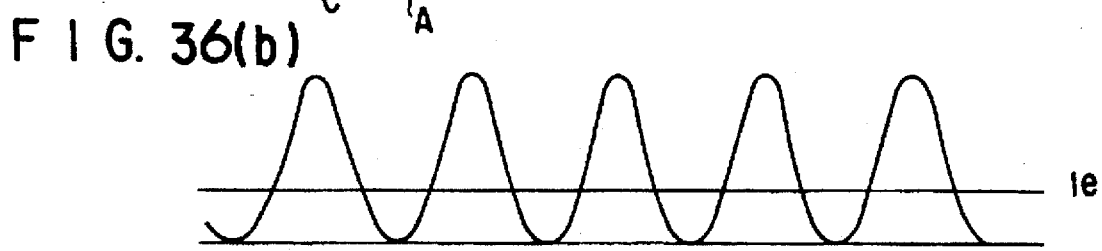
Figure 37A:
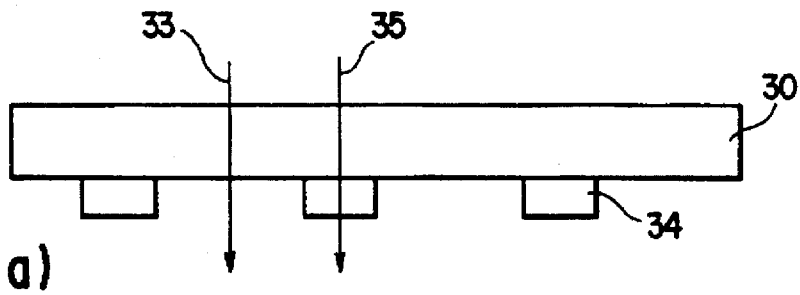
FIG. 37 is a plan view showing the arrangement of a four-eye filter having a virtual annular portion.
Figure 37B:
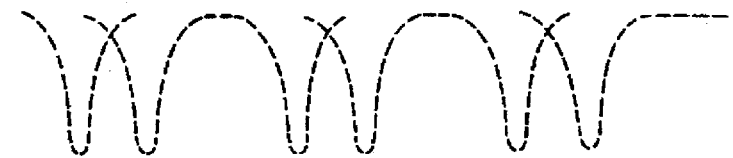
Figure 37C:
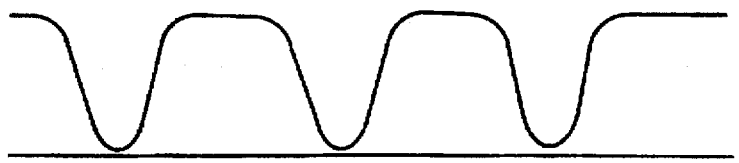

Although the special stop 9' in FIG. 35 is constituted by boundaries consisting of only curves, a stop having a second shape shown in FIG. 36 may be used as the special stop 9'. In addition, even a stop having a third shape shown in FIG. 37 can be employed as the special stop 9' without departing from the spirit and scope of the invention. The shape shown in FIG. 37 is characterized in that portions of wide regions in the radial direction do not have uniform width, and the wide regions are intermittently connected to each other. As is apparent from FIG. 37 light-transmitting portions 52 having large, intermediate, and small sizes are formed.

With regard to the shapes of the embodiments shown in FIGS. 35 to 37, the transmittance of each light-transmitting portion 52 need not be 100%. In some cases, the same transmittance need not be set in all the regions. In addition, there is no need to set the regions to be point symmetrical. In this embodiment, the positions and areas of the light-transmitting portion 52 can be properly changed in accordance with the resolution performance and dimensional precision of a desired pattern.

Figure 38A:
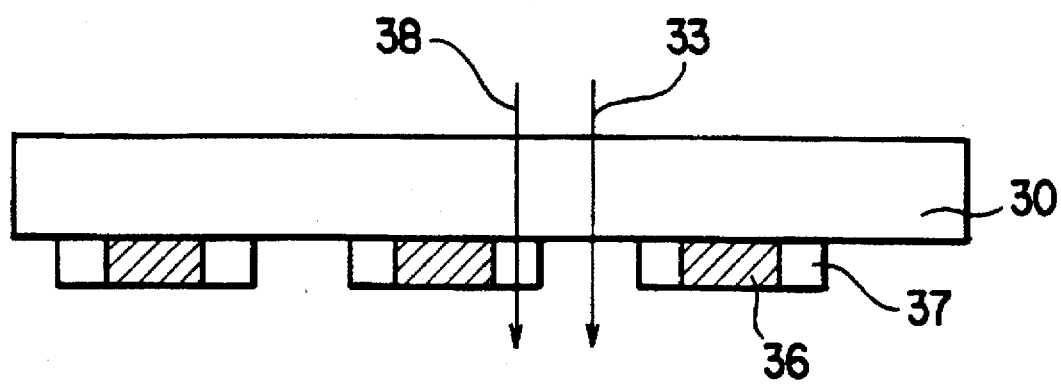
FIG. 38 is a graph showing the relationship between the vertical/horizontal pattern size and the DOF according to the I3 embodiment.
Figure 38B:
Figure 38C:
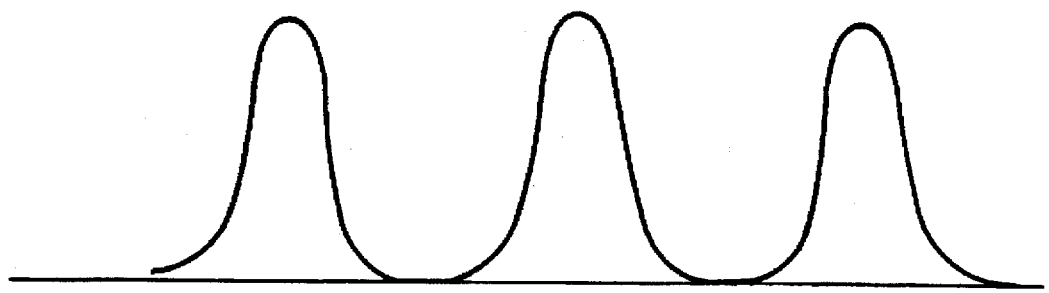

FIGS. 38 and 39 are graphs showing exposure characteristics obtained when exposure is performed by using the special filter shown in FIG. 35. FIG. 38 shows the characteristics with respect to vertical/horizontal L/S patterns. FIG. 39 shows the characteristics with respect to oblique (45O) L/S patterns. Referring to each graph, the ordinate represents the depth of focus obtained when the critical image contrast is set to be 70%; and the abscissa, the L/S pattern size.

Assume that the depth of focus required for an actual device pattern transfer process is 1.5 µm. In this case, as is apparent from FIG. 38 the characteristics associated with the L/S pattern size at which the required depth of focus can be ensured hardly deteriorate as compared with those obtained when a special filter having four apertures is used. That is, L/S=0.32 µm is realized in this embodiment, while L/S≧0.3 µm is set in the comparative case.

Referring to FIG. 39 showing the characteristics associated with oblique (45°) L/S patterns, the pattern size at which the required depth of focus can be ensured in the conventional exposure method is given by L/S≧0.7 µm. It is, therefore, apparent that an oblique L/S pattern must be designed to have a large size. In contrast to this, in the exposure method of the embodiment, the required depth of focus can be ensured with L/S≧0.55 µm, which is sufficiently small as compared with the normal exposure method (L/S≧0.5 µm). That is, according to the embodiment, while the exposure characteristics in the vertical/horizontal directions ensure excellent resolution characteristics obtained when a special filter having a mask with four apertures is used, the resolution characteristics with respect to oblique L/S patterns do not deteriorate much, thereby enabling a great design rule reduction with respect to oblique L/S patterns.

The characteristics shown in FIGS. 38 and 39 change depending on the radii and central positions of the circular apertures A, B, D, and D, and the width and inner and outer diameters of the ring-like region E of the special filter shown in FIG. 35. These values must be optimized as needed.

As described above, according to the embodiment, the use of the special filter having the "four-eye/annular portions" realizes high resolution performance and a high depth-of-focus increasing effect. In addition, the dependence of the depth-of-focus increasing effect on pattern size and direction can be decrease to a level at which no practical problems are posed, which cannot be achieved by the conventional apparatus. Furthermore, if the halftone mask, the self-alignment type mask, or the shifter edge type mask shown in FIGS. 30(a) to 32(c) is used as a mask, a larger depth-of-focus increasing effect can be obtained.

(I4 Embodiment)

Figure 40:
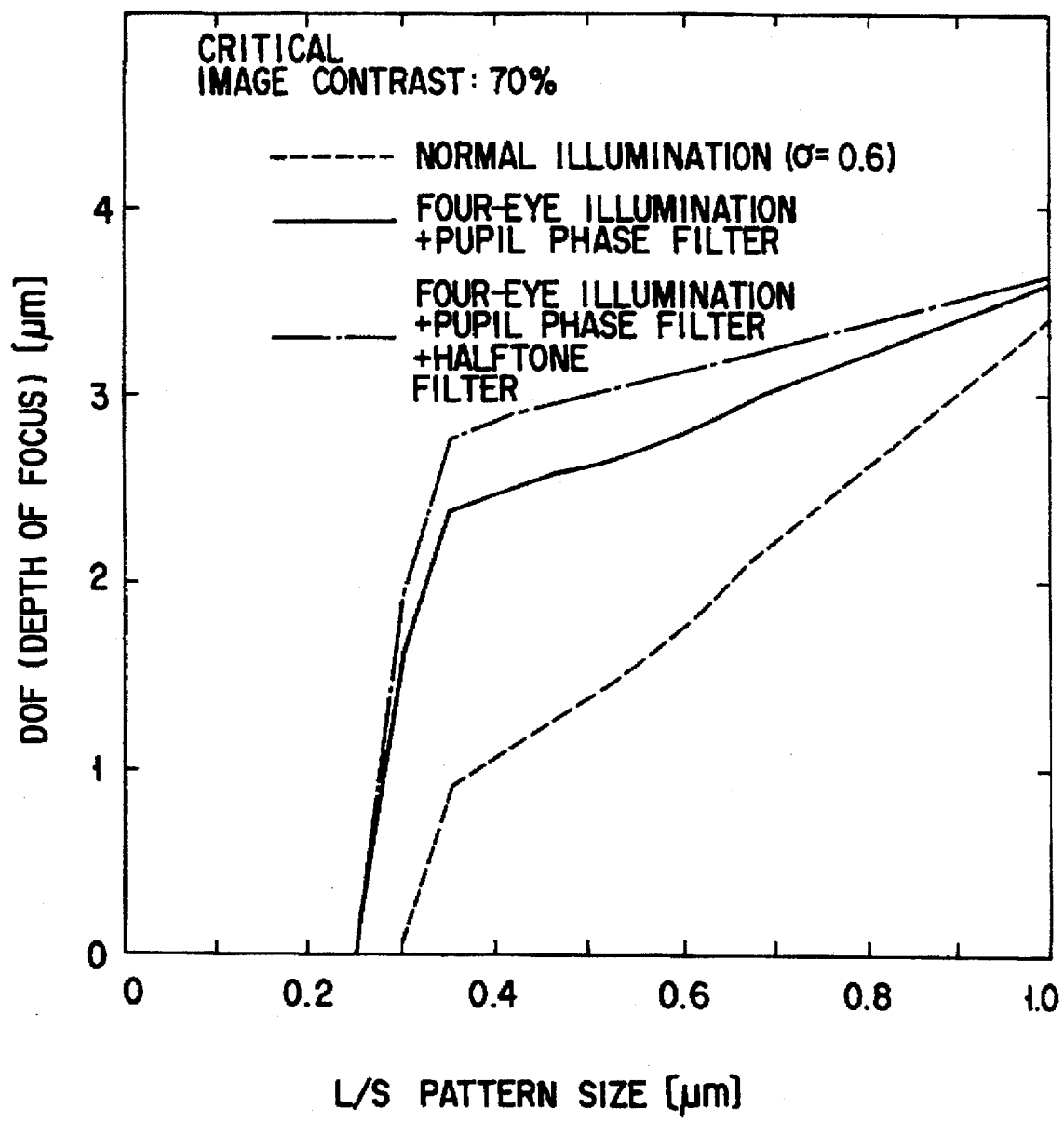
FIGS. 40(a) and 40(b) are views showing the arrangement of a five-eye filter used in the I4 embodiment.

In this embodiment, a "five-eye filter" and a combination of a "five-eye filter" and a "halftone mask" are respectively used for exposure processes. The I4 embodiment is basically a modification similar to the previous embodiment. As shown in FIGS. 40(a) and 40(b) a five-eye filter 60 as a secondary source is constituted by an optical axis 61, light-transmitting portions 62, and a light-shielding portion 63. In addition to four apertures A, B, C, and D which are quadruple-symmetrical about the optical axis 61, the filter 60 includes an aperture E near the optical axis 51.

Figure 42:
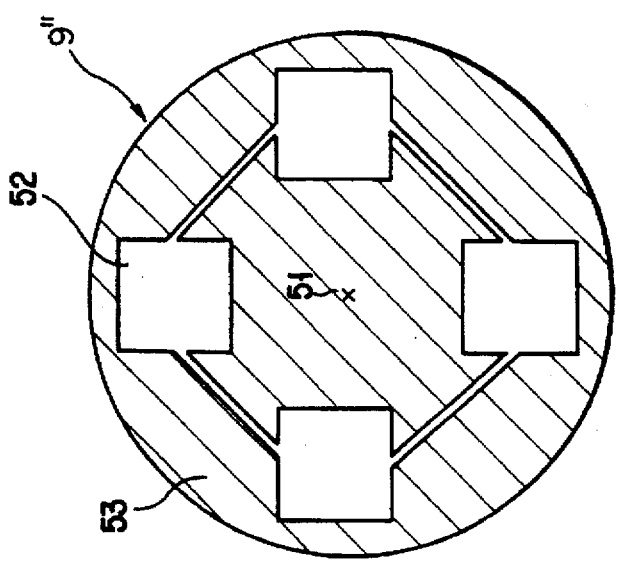
FIG. 42 is a graph showing the relationship between the size of an isolated negative pattern and the DOF according to the I4 embodiment.
Figure 41:
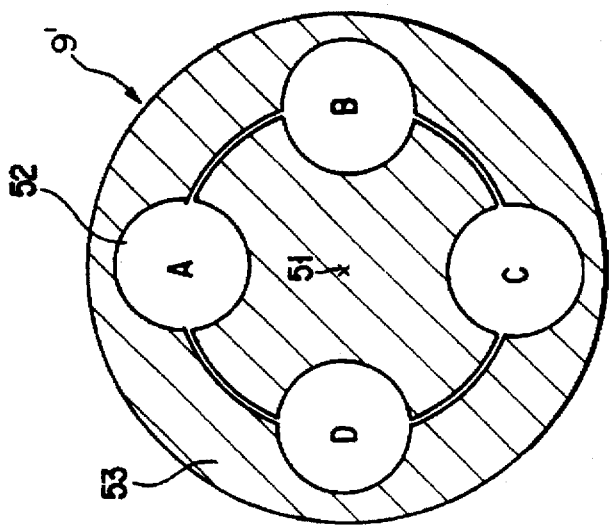
FIG. 41 is a graph showing the relationship between the L/S size and the DOF according to the I4 embodiment.

FIGS. 41 and 42 respectively show results obtained by exposing a normal Cr mask and a halftone mask using the above-described filter 60. FIG. 41 shows the resolving power/depth-of-focus increasing effect with respect to L/S patterns each having a line/space ratio of 1:1. In this graph, the abscissa represents the pattern size; and the ordinate, the depth of focus (DOF). Note that the wavelength of exposure light is 365 nm (i-line); and the NA of a projection optical system, 0.55.

As is apparent from this graph, the depth-of-focus increasing effect obtained by five-eye illumination exposure is lower than that obtained by four-eye illumination exposure. However, the minimum line width at which a depth of focus of 1.5 µm can be ensured is almost the same as that in the case of four-eye illumination exposure, and hence five-eye illumination exposure has no adverse effect on a reduction in chip size. In addition, if a halftone mask is used, a lager depth-of-focus increasing effect can be obtained.

FIG. 42 shows a calculation result of depths of focus with respect to the pattern sizes of isolated negative patterns. As is apparent from this graph, the depth of focus is increased by five-eye illumination exposure as compared with the case of four-eye illumination exposure. In addition, it is apparent that the use of a halftone mask further increases the depth of focus. The negative line width at which a depth of focus of 1.5 µm can be ensured is 0.45 µm in a normal Cr mask exposure process performed by means of four-eye illumination but can be reduced to 0.41 µm in a halftone mask exposure process performed by means of five-eye illumination. In addition, the depth of focus can be further increased by optimizing each aperture.

That is, by performing five-eye illumination exposure, the negative line width for isolated patterns can be designed to be smaller while the advantage of four-eye illumination exposure that the minimum line width of an L/S pattern having an L/S ratio of 1:1 can be designed to be small (about 0.3 µm). As a result, the negative line width for isolated negative patterns, which are designed such that the line width is large as compared with the space width and exist in a large number among LSI patterns, can be designed to be smaller, and a great reduction in chip size can be achieved.

The present invention is not limited to the above-described embodiments. Various modifications and changes can be made within the spirit and scope of the invention. In the embodiments, the special stops shown in FIGS. 28 and 30(a) to 30(c) are used as means for realizing four-eye illumination and five-eye illumination. However, the present invention is not limited to this. For example, four-eye and five-eye illumination processes can be performed by using fibers and the like.

(I5 Embodiment)

Figure 43:
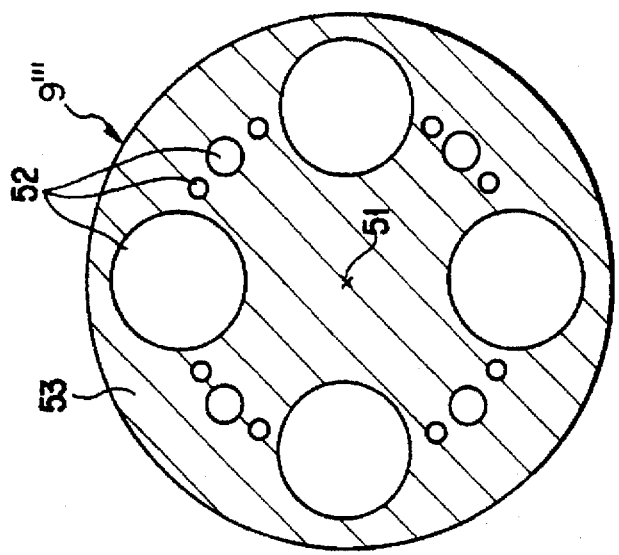
FIG. 43 is a schematic view showing the arrangement of a projection exposure apparatus according to the I5 embodiment.

FIG. 43 is a schematic view showing the arrangement of a projection exposure apparatus according to the I5 embodiment of the present invention. Light generated by a light source 71 is focused by a first focusing optical system 72 and is guided to a uniforming optical system 73. The uniforming optical system 73 may be constituted by optical fibers, a polygonal prism, or the like. The light emerging from the uniforming optical system 73 forms a secondary source. A filter 74 (to be referred to as a decentered single-eye filter hereinafter) having an aperture 81 decentered from the optical axis is set at the position of this secondary source. Exposure light passes through only the aperture 81 to illuminate a reticle 76 through a second focusing optical system 75.

The exposure light passing through the reticle 76 reaches a wafer 79 through a projection optical system 77. A pupil 78 in the projection optical system 77 is normally constituted by a circular aperture. In this embodiment, however, a slit-like filter (to be referred to as a pupil slit filter hereinafter) is arranged at the pupil position, as shown in FIG. 43. The longitudinal direction of this slit coincides with the decentering direction of the decentered single-eye filter 74. The decentered single-eye filter 74 and the pupil slit filter 78 can be synchronously rotated by a synchronous rotation control circuit 80, a motor (not shown), and the like while the above-mentioned positional relationship of the two filters is maintained. One exposure operation is completed when the decentered single-eye filter 74 and the pupil slit filter 78 are rotated through 360° by the synchronous rotation control circuit 60.

FIG. 44 shows a calculation result of focus margins with respect to pattern sizes in exposure performed by the projection exposure apparatus of the I5 embodiment. Referring to FIG. 44, the broken curve indicates the depth of focus obtained when normal exposure ($\sigma$=0.6) is performed; and the solid curve, the depth of focus obtained when exposure is performed by the apparatus of the embodiment using a normal Cr mask. Note that the NA of an exposure unit, a coherence factor $\sigma$, and a wavelength $\lambda$ of exposure light are respectively set to be 0.55, 0.6, and 365 nm. The result shown in FIG. 44 is not dependent on the direction of an L/S pattern. Therefore, this embodiment can solve the above-mentioned problem, eliminate the L/S pattern direction dependence, and greatly increase the depth of focus as compared with the normal exposure method. In addition, with an increase in decentering distance of the center of the aperture 81 from the optical axis, the depth of focus with respect to fine L/S patterns is increased.

As described above, according to the I5 embodiment, the filter having the aperture 81 located at the position decentered from the optical axis is arranged at the secondary source position of the exposure unit, and the illumination optical system is designed to obliquely illuminate a mask 76. With this arrangement, higher-order diffracted light from an L/S pattern elongated in a direction perpendicular to the decentering direction is obliquely incident on the projection optical system 77, thus increasing the resolving power. In addition, since the slit whose longitudinal direction is caused to coincide with the decentering direction of the filter is arranged at the pupil position, diffracted light generated by patterns other than patterns in the above-mentioned direction is cut. Furthermore, the pattern direction dependence of the resolving power can be eliminated by performing exposure while synchronously rotating the slit and filter about the optical axis as a rotational axis through 360°.

In addition, according to this embodiment, if a translucent portion for attenuating 0th-order diffracted light is arranged as the pupil slit filter 78, as shown in FIG. 45 the resolving power can be further increased. As shown in FIG. 45, the light emerging from the decentered single-eye filter 74 obliquely illuminates the mask 76. When an L/S pattern having an L/S ratio of 1:1 is illuminated, the light transmitted through the mask 76 is diffracted to be split into ±1st-order diffracted light and 0th-order diffracted light. The 0th-order diffracted light propagates straight to reach a point a of the pupil slit filter 78. The +1st-order diffracted light component reaches a point b. The −1st-order diffracted light component is not incident on the pupil and hence is not associated with a focusing operation. Since the 0th-order diffracted light component is larger than the +1st-order diffracted light component, the resolving power can be further increased by attenuating the 0th-order diffracted light component through a translucent film 85. Although the translucent film 85 is used in the I5 embodiment, any means capable of attenuating only 0th-order diffracted light can be employed.

(I6 Embodiment)

FIG. 46 shows the schematic arrangement of the I6 embodiment of the present invention. The same reference numerals in FIG. 46 denote the same parts as in FIG. 43, and a detailed description thereof will be omitted. This embodiment is different from the I5 embodiment in the shape of a light source filter arranged at the secondary source.

More specifically, the light source filter of the embodiment has two apertures 81 and 82 (to be referred to as a two-eye filter hereinafter) located at positions symmetrical about the optical axis. According to the I6 embodiment, although the resolution characteristics are the same as those of the I5 embodiment, one exposure operation is completed when a two-eye filter 74 and a pupil slit filter 78 are rotated through 180° by a synchronous rotation control circuit 80, unlike the I5 embodiment. If the amount of light from the aperture 81 in the I5 embodiment is the same as that from one aperture in the I6 embodiment, the exposure time can be reduced to half because of the two apertures and the rotation angle which is half of the rotational angle in the I5 embodiment.

(I7 Embodiment)

Figure 47:
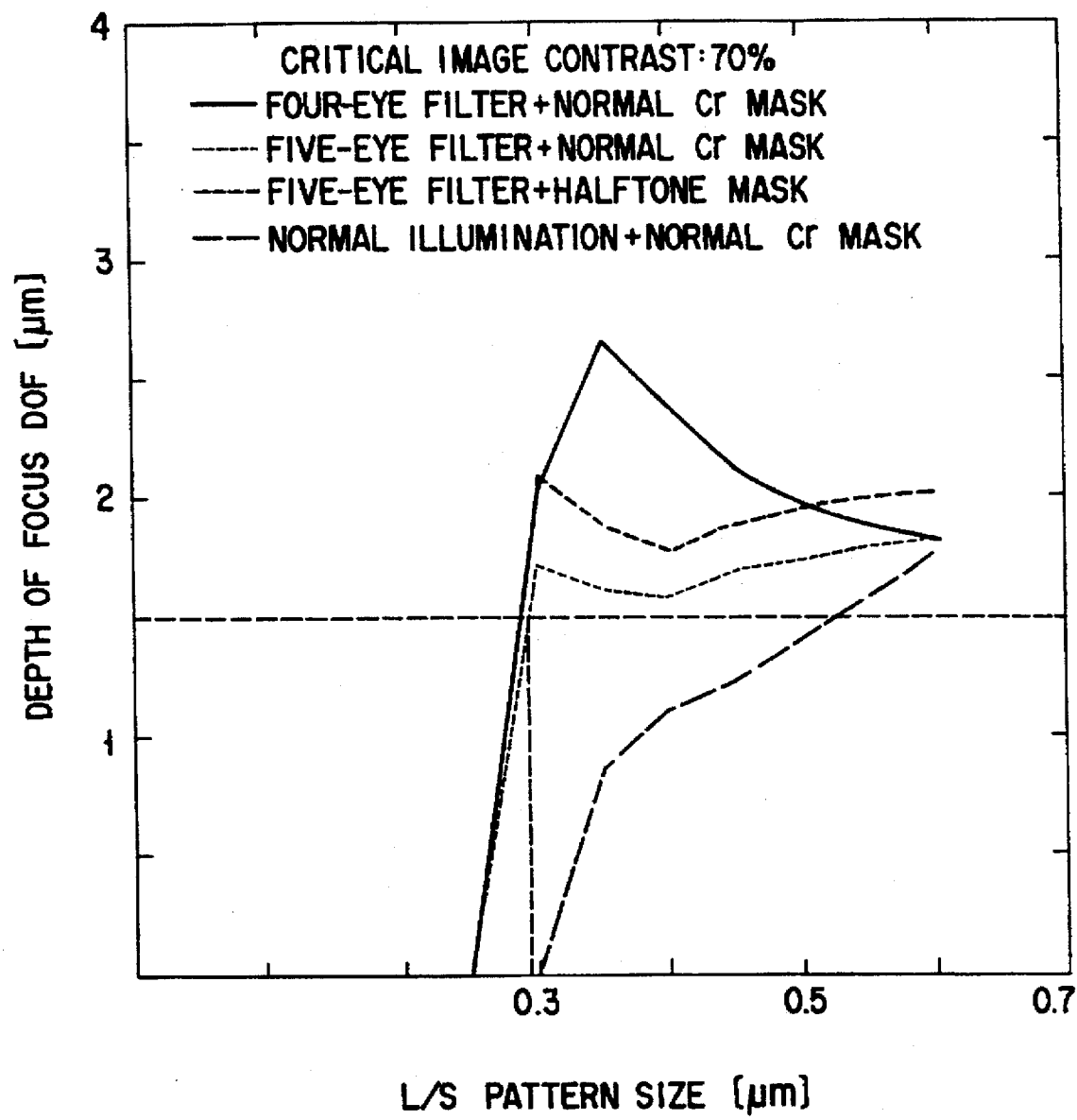
FIG. 47 is a schematic view showing the arrangement of a projection exposure apparatus according to the I7 embodiment.

FIG. 47 shows the schematic arrangement of the I7 embodiment of the present invention. The same reference numerals in FIG. 47 denote the same parts as in FIG. 43, and a detailed description thereof will be omitted. This embodiment is different from the I6 embodiment in the shape of a light source filter arranged at a secondary source and in the shape of a filter arranged at the pupil position.

More specifically, the light source filter (to be referred to as a four-eye filter hereinafter) in the I7 embodiment has four apertures 81, 82, 83, and 84 at positions which are quadruple-symmetrical about the optical axis. The filter at the pupil position has an aperture in the form of a crisscross pattern (to be referred to as a pupil crisscross filter hereinafter). Note that the filter at the pupil position may take any shape as long as its aperture connects the four eyes (apertures) at the pupil position. That is, an aperture may be formed along the sides of a rectangle defined by four eyes (apertures) like the above-mentioned crisscross pattern, or an aperture may be formed along the diagonal lines connecting the four lines (i.e., a cross-shaped aperture).

Figure 48:
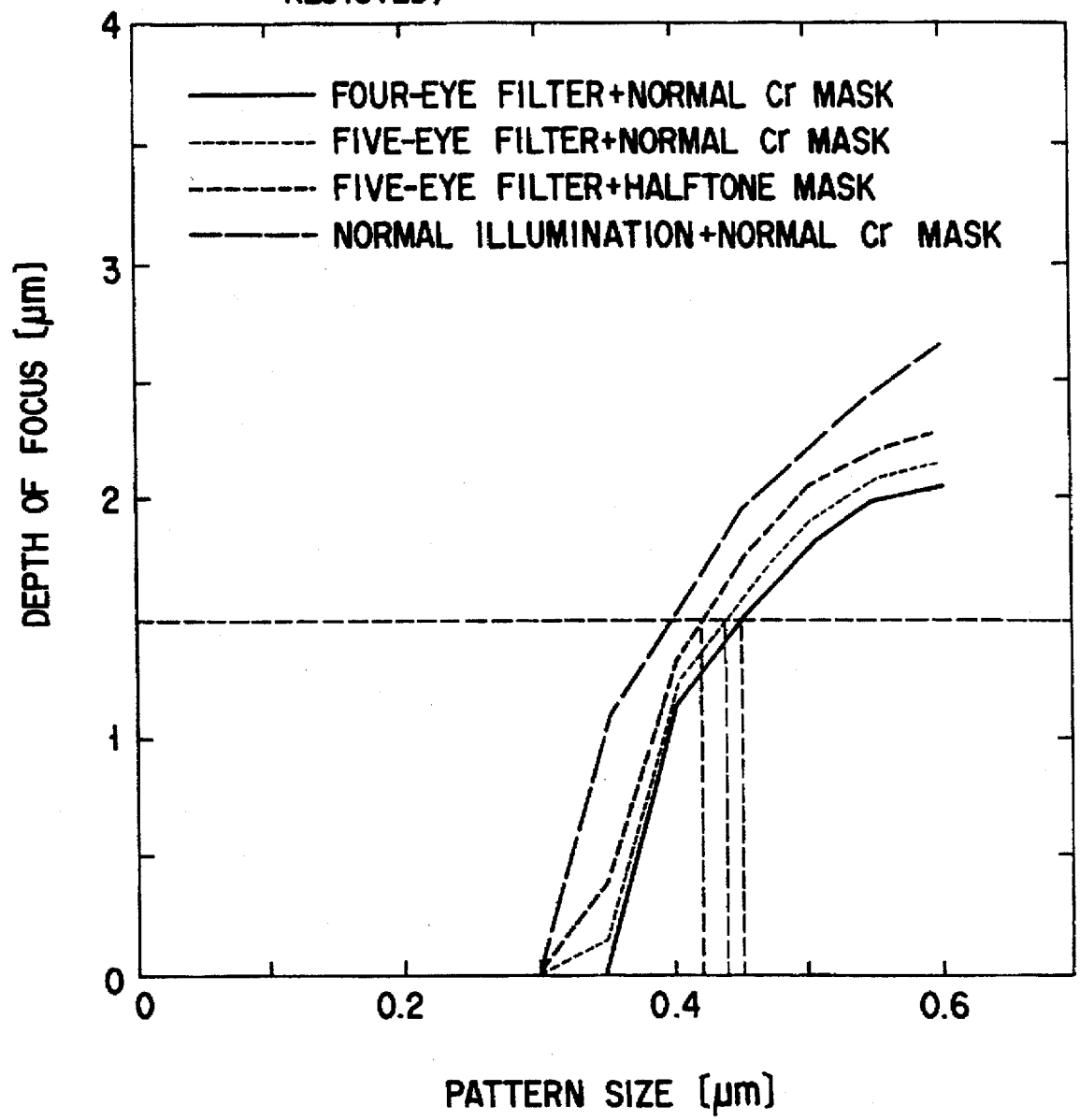
FIG. 48 is a perspective view showing a detailed example of a pupil filter which is designed to suppress generation of heat.

According to this embodiment, although the resolution characteristics are almost the same as those in the I5 embodiment, one exposure operation is completed when the four-eye filter and the pupil crisscross filter are rotated through 90° by a synchronous rotation control circuit 80 unlike the I5 embodiment. If the amount of light from the aperture in the I5 embodiment is the same as that from one of the apertures in the I7 embodiment, the exposure time can be reduced to ¼ because of the four apertures and the rotational angle which is ¼ that in the I5 embodiment, In the I5 to I7 embodiments, a slit-like filter or a filter in the form of a crisscross pattern is arranged at the pupil position in the projection optical system. In this case, the light-shielding portion of the filter absorbs exposure light to generate heat, and this heat causes a deterioration in the optical system, thus greatly influencing the transfer precision. FIG. 48 shows the detailed arrangement of a pupil filter which is designed to solve the above-described problem which is especially associated with the I5 and I6 embodiments. FIG. 48 shows the arrangement of a pupil slit filter, which includes a slit 91 and inclined mirrors 92. When exposure light is radiated from above onto the pupil slit filter, the exposure light components incident on the inclined mirrors 92 are reflected thereby without being absorbed. The reflected exposure light components are guided outside the optical system to be absorbed by an absorber arranged outside the optical system. Therefore, the exposure light is not converted into heat in the optical system, and hence no deterioration in transfer precision occurs.

In the I5 to I7 embodiments, if a halftone phase shift mask is used, the depth of focus and the resolving power can be further increased. The alternate long and short dash curve in FIG. 44 indicates the transfer characteristics obtained when transfer is performed by using a halftone mask in addition to the arrangement of the three embodiments described above. As is apparent from this graph, the depth of focus is increased as compared with the case wherein a normal Cr mask is used.

In the above embodiment, a large effect is obtained by exposing a halftone mask using a four-eye filter and a phase filter. However, a large effect can also be obtained by using other types of phase shift masks, e.g., a shifter edge type phase shift mask and a self-alignment type phase shift mask. In addition, the above-described optical principle may be realized by other mask structures.

In the I5 to I7 embodiments, a filter having at least one aperture decentered from the optical axis is used to determine the shape of a secondary source. The present invention is not limited to this. For example, other methods, e.g., a method using fibers, may be used.

According to the present invention described in detail above, the following functions and effects can be obtained. A four-eye filter as a secondary source and a halftone mask, a self-alignment type shift mask, a shifter edge type phase shift mask, or the like are used so that even if the size of an L/S pattern is large, the depth of focus can be sufficiently increased, and the exposure precision can be improved.

According to the present invention, by using a four-eye filter as a secondary source and arranging a phase filter at the pupil position of a projection optical system, the depth of focus and the limit resolving power can be greatly increased independently of the pattern size. By using a phase shift mask including halftone mask, self-aligned type mask, shifter-edge type mask in addition to the above arrangement, the above-mentioned effect can be further enhanced.

In addition, according to the present invention, since a special stop having an arrangement of two types of filters, i.e., an annular illumination filter and a four-eye filter, is used as a secondary source, the pattern size and direction dependence can be reduced to a level at which no practical problems are posed, and high resolution performance and a high depth-of-focus increasing effect can be obtained.

Furthermore, according to the present invention, by increasing the light source near the center of a secondary source, the depth of focus and the resolving power with respect to isolated negative patterns can be increased in addition to the depth-of-focus and limit resolving power increasing effect obtained when exposure is performed by using a four-eye filter as a secondary source as in the above-described embodiments. As a result, a great reduction in ship size can be achieved.

Moreover, according to the present invention, by synchronously rotating a secondary source having a decentered aperture and a pupil filter, the depth of focus can be sufficiently increased regardless of the direction of a pattern.

(F1 Embodiment)

In the present apparatus, at least one light-transmitting portion is formed in a light source modulation filter such as those shown in FIGS. 72(a) to 72(c), and the transmittances of a peripheral portion and the inner light-transmitting portion of the filter are controlled, thus forming a light source modulation filter to satisfy the focus margin for a target device pattern (consisting of at least two patterns of an L/S pattern, an isolated positive pattern, an isolated negative pattern, and a contact hole).

FIGS. 25(a) and 25(b) respectively show the schematic arrangement of a light source modulation filter used in this embodiment and the central cross-section of an intensity distribution. A value r1 determining the radius of this filter is a diameter corresponding to σ=0.6. In an annular illumination filter having an annular shielding ratio ε defined as r2/r1=0.67, a light-transmitting portion defined by ε2 (ε2= r3/r1) is arranged. Note that the transmittance of a light-shielding portion is 0; and the transmittance of an aperture (light-transmitting portion) is 1.

FIGS. 26(a) and 26(b) are graphs respectively showing results obtained when a 0.6-μm L/S pattern and a 0.6-μm an isolated negative pattern are exposed by using the filter shown in FIG. 25(a) and a halftone mask. In each graph, the abscissa represents the value ε2; and the ordinate, the DOF value. If an annular illumination filter is formed (ε2=0), a sufficient focus margin can be obtained with respect to an L/S pattern, but the required focus margin (2.0 μm) cannot be obtained with respect to an isolated negative pattern. If the value ε2 is increased, the DOF value is decreased with respect to an L/S pattern but is increased with respect to an isolated negative pattern. A DOF of 2.0 μm±5% can be ensured within the range of 0.3≦ε≦0.5 with respect to both an L/S pattern and an isolated negative pattern. That is, a filter suitable for both the types of patterns can be formed.

As described above, according to this embodiment, the secondary source modulation filter 15 is designed such that the light-transmitting portion defined by 0.3≦ε≦0.5 is formed in the annular illumination filter having the annular shielding ratio ε=0.67. With this arrangement, not only an L/S pattern and an isolated positive pattern but also an isolated negative pattern can be exposed with a sufficient focus margin (about 2 μm). Therefore, a sufficient focus margin can be ensured with respect to various types of patterns without replacing the secondary source modulation filter 15, thereby improving the pattern transfer efficiency.

In the above-described embodiment, as a secondary source modulation filter, a filter having a peripheral intensity Ip and a central intensity Ic of the intensity distribution within the exit plane of the secondary source, which intensities satisfy Ip=Ic, is used. Better characteristics can be obtained by changing the two intensity values. More specifically, by using a light source modulation filter having a peripheral intensity higher than a central intensity (Ip>Ic) or a central intensity higher than a peripheral intensity (Ip>Ic), an intensity distribution of the filter which is optimal for both the types of patterns, i.e., an L/S pattern and an isolated negative pattern is set. As a result, the DOF value can be further increased.

(F2 Embodiment)

FIG. 27(a) is a view for explaining the arrangement of a main part of the F2 embodiment, illustrating the arrangement of a light source modulation filter. This embodiment is characterized by a filter whose transmittance is radially increased toward its peripheral portion, which filter has a transmittance distribution having at least one maximum transmittance, as shown in FIG. 27(b).

With the above-described arrangement, the high-transmittance peripheral portion of the secondary source modulation filter acts with respect to L/S patterns, while the high-transmittance central portion of the filter acts with respect to isolated negative patterns. As a result, the same effect as that of the F1 embodiment can be obtained.

In the above embodiment, the annular shielding ratio ε of the secondary source modulation filter is set to be r2/r1= 0.67. This value is properly set in accordance with the size and the like of an L/S pattern to be exposed. In addition, the value ε2 (ε2=r3/r1) of the central light-transmitting portion of the secondary source modulation filter is not limited to the range of $0.3 \le \epsilon 2 \le 0.5$ from the center but may be properly set in accordance with the size and the like of an isolated negative pattern which is to be exposed.

According to the present invention described in detail above, since the secondary source modulation filter is designed such both the peripheral and central portions of the intensity distribution within the exit plane of the secondary source are higher than the intermediate portion, focus margins required for various types of patterns can be ensured without replacing the secondary source modulation filter in accordance with a pattern to be transferred.

(G1 Embodiment)

FIG. 1 shows a projection exposure apparatus according to the G1 embodiment. As shown in FIG. 1, the apparatus comprises a lamp (light source) 1, an elliptic reflecting mirror 2, a second focal point 3 of the elliptic reflecting mirror 2, an input lens 4, an optical integrator 5, an output lens 6, a collimation lens 7, a reticle 8, a special stop 9' having a transmittance distribution, a filter 10, cold mirrors 11 and 12, a lamp house 13, a lens 14, a projection optical system for projection a pattern image on the reticle 8 through a mirror or a combination of mirrors, a wafer 15, and a filter 16' having an optical path length distribution.

A mercury-vapor lamp is used as the lamp 1 serving as a light source. A spectral line of a g-line (436 nm), an h-line (405 nm), an i-line (365 nm) or the like, or a continuous spectrum of a ray having a wavelength near one of their wavelengths is extracted to be used. For this reason, the lamp 1 as a light source needs to have a high luminance and is preferably close to a point light source in consideration of focusing efficiency and radiation uniformity. However, since such an ideal light source does not actually exist, the lamp 1 having a finite size and an intensity distribution must be used. It is, therefore, important to efficiently convert light emitted from the lamp 1 into light having good radiation uniformity.

In the apparatus shown in FIG. 1, the lamp is placed at the first focal point of the elliptic reflecting mirror 2 to temporarily focus beams to a position near the second focal point 3 of the elliptic reflecting mirror 2. The beams are collimated into substantially parallel beams by the input lens 4 having a focal position almost coinciding with the second focal point 3. The beams are then incident on the optical integrator 5. The optical integrator 5 is constituted by a large number of rod-like lenses and is called a "fly-eye lens". That the beams pass through the optical integrator 5 is a main factor which improves the radiation uniformity. The input lens 4 serves to improve the focusing efficiency by reducing an "eclipse" of the beams passing through the optical integrator 5.

The beams emerging from the optical integrator 5 are focused by the output lens 6 and the collimation lens 7 such that the beams emerging from the small lenses of the integrator 5 are incident on the reticle 8 upon superposition. The beams incident on the optical integrator 5 have an intensity distribution based on places where they are incident. However, since the beams emerging from the small lenses of the optical integrator 5 are almost uniformly superposed on each other, the radiation intensities of the beams on the reticle 8 become almost uniform. As is apparent, if the intensities of beams incident on the optical integrator 5 are close to uniformity, the radiation distribution on the reticle 8 which is based on the beams emerging from the optical integrator 5 and are superposed on each other becomes more uniform. The special stop 9' (to be described later) is arranged on the exit side of the optical integrator 5.

If a mercury-vapor lamp is used as the lamp 1 and beams from the lamp 1 are focused by the elliptic reflecting mirror 2, since the mercury-vapor lamp is elongated and has electrodes at two ends, as shown in FIG. 1, beams in the axial direction of the lamp 1 cannot be extracted. For this reason, as shown in FIG. 1, if only a convex lens is used as the input lens 4, the intensities of beams incident on a central portion of the optical integrator 5 may become lower than those of beams incident on other portions. In order to prevent this, a double-convex lens or a conical lens having a convex portion on one surface and a concave portion on the other may be inserted between the input lens 4 and the optical integrator 5 to obtain a more uniform intensity distribution of beams incident on the optical integrator 5.

The filter 10 is inserted so that the optical system transmits only light of a wavelength which is aberration-corrected. The cold mirrors 11 and 12 serve to reduce the height of the apparatus by bending the optical path and transmit heat rays having long wavelengths to allow a cooling portion of the lamp house 13 to absorb the heat rays. The light radiated on the reticle 8 passes through the lens 14, and an image of a fine pattern on the reticle 8 is projected/exposed to be transferred onto a resist on the wafer 15. The projection optical system incorporates the filter 16' for changing the optical path length of the transmitted light which extends in the radial direction from the optical axis.

A method of designing a secondary source intensity distribution and a pupil function in the apparatus of the embodiment will be described in detail below with reference to FIGS. 2 to 4. FIG. 2 shows an algorithm for optimizing the secondary source and pupil function of the projection exposure apparatus. This optimization algorithm is a method called a "simulated annealing" The simulated annealing is the optimization algorithm to the Monte Carlo method, which uses an analogy to statistical thermodynamics. This method is used to find a global minimum point when a proper cost function is given.

Assume that an exposure unit has NA=0.54 (numerical aperture), $\lambda$=436 nm (exposure light wavelength), and σ=0.5

(coherence factor). When a numerical aperture and a size of a secondary source (coherence factor) are given, the intensity distribution of the secondary source and the pupil function complex amplitude transmittance distribution of the projection optical system are determined to optimize the performance of the exposure unit. A calculation procedure for increasing the depth of focus with respect to a pattern having an L/S ratio=0.6 μm will be described below with reference to FIG. 2.

In step S1, initial distributions as a radial intensity distribution S(r) of the secondary source and pupil function radial complex amplitude transmittance distributions t(r) and ϕ(r) are determined. Note that r is the radial spatial coordinate; t, the amplitude transmittance; and ϕ, the phase. Although the convergence speeds of the respective distributions vary depending on initial values, any distributions can be set as long as the following boundary conditions are satisfied: $0 \leq S(r) \leq 1$, $0 \leq t(r) \leq 1$, and $0 \leq \phi(r) \leq 180°$.

Figure 3A:
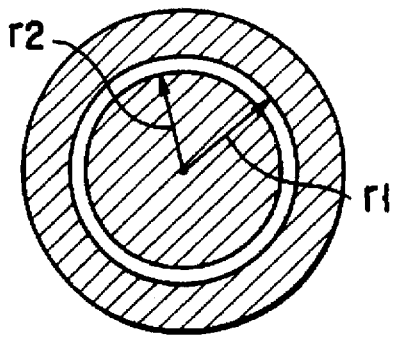
FIGS. 3(a) and 3(b) are graphs showing a state wherein a grain having a size φ is given at a portion in an initial distribution.
Figure 3B:
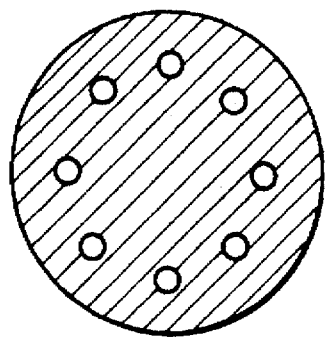
Figure 3C:
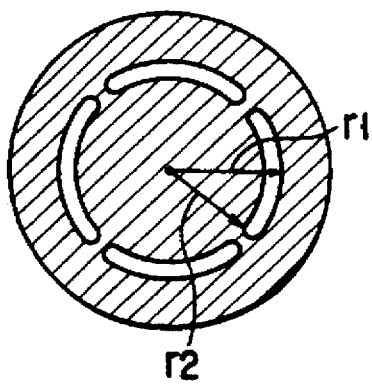
Figure 3D:
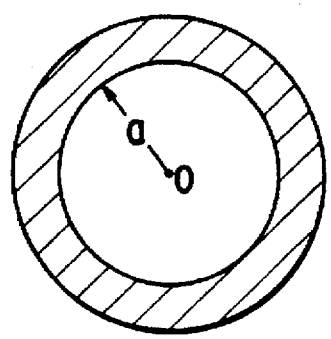
Figure 3E:
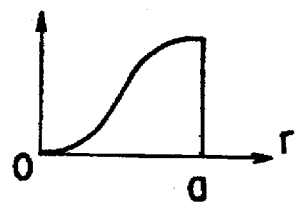

In step S2, a slight perturbation (grain) ε is given to a portion of each initial distribution, as shown in FIG. 3(b) A place where the grain is given or a sign "+" or "−" are selected at random.

In step S3, image intensity distributions I before and after the grain is given are calculated. In this case, an ideal (target) image intensity distribution Ii is calculated in advance.

In step S4, cost functions E and E' are calculated according to the following equations:

$$E=(C-Ci)^2$$

$$E'=(C'-Ci)^2$$

where C is the contrast value obtained from the image intensity distribution calculated after the grain is given, C' is the contrast value obtained from the image intensity distribution calculated before the gain is given, and Ci is the contrast value obtained from the ideal (target) image intensity distribution.

In step S5, ΔE=E−E' is obtained. If ΔE<0, it indirectly indicates that the image intensity distribution obtained after the grain is given is closer to the ideal (target) image intensity distribution, and that the given grain locally contributes to a gradual approach to the optimal value. In contrast to this, if ΔE>0, it indicates that the given grain locally contributes to a departure from the optimal value.

In step S6, it is determined on the basis of ΔE whether the grain ε is accepted or not. If ΔE<0, since the given grain locally contributes to a gradual approach to the optimal value as described above, the grain ε is entirely accepted. In contrast to this, if ΔE>0, since the given grain locally contributes to a departure from the optimal value, the grain ε is not basically accepted. However, if the grain is not accepted at all, since the solution cannot depart from the local minimum value, the grain is accepted at a certain probability. If this probability is increased too much, the value of the cost function oscillates, and an optimal solution cannot be obtained forever. In contrast to this, if the probability is too low, a sufficient force to depart from the local minimum point cannot be obtained, and an optimal solution is difficult to obtain. For this reason, if ΔE>0, by using an analogy to thermodynamics, a grain which increases the cost function is accepted at a probability conforming to a Boltzmann distribution represented by $$P(\Delta E)=\exp(-\Delta E/T)$$

That is, a grain which slightly increases the cost function is accepted at a relatively high probability, whereas a grain which greatly increases the cost function is accepted at a low probability. Note that T is a variable called a "temperature" for controlling the probability.

In step S7, if the grain is accepted, the radial intensity distribution of the secondary source and the pupil function radial complex amplitude transmittance distributions obtained after the grain is given are to be the initial values S(r), t(r), and ϕ(r), respectively. If the grain is not accepted, the radial intensity distribution of the secondary source and the pupil function radial complex amplitude transmittance distributions obtained before the grain is given are set to be the initial values S(r), t(r), and ϕ(r), respectively. When this operation is repeated for all the values S(r), t(r), and ϕ(r), an optimal solution can be obtained. Oscillations near the convergence point can be suppressed by reducing the "temperature" T as a solution approaches the convergence point. As the temperature T is reduced, the probability of accepting changes in ε with respect to a large positive ΔE tends to abruptly decrease.

Figure 4:
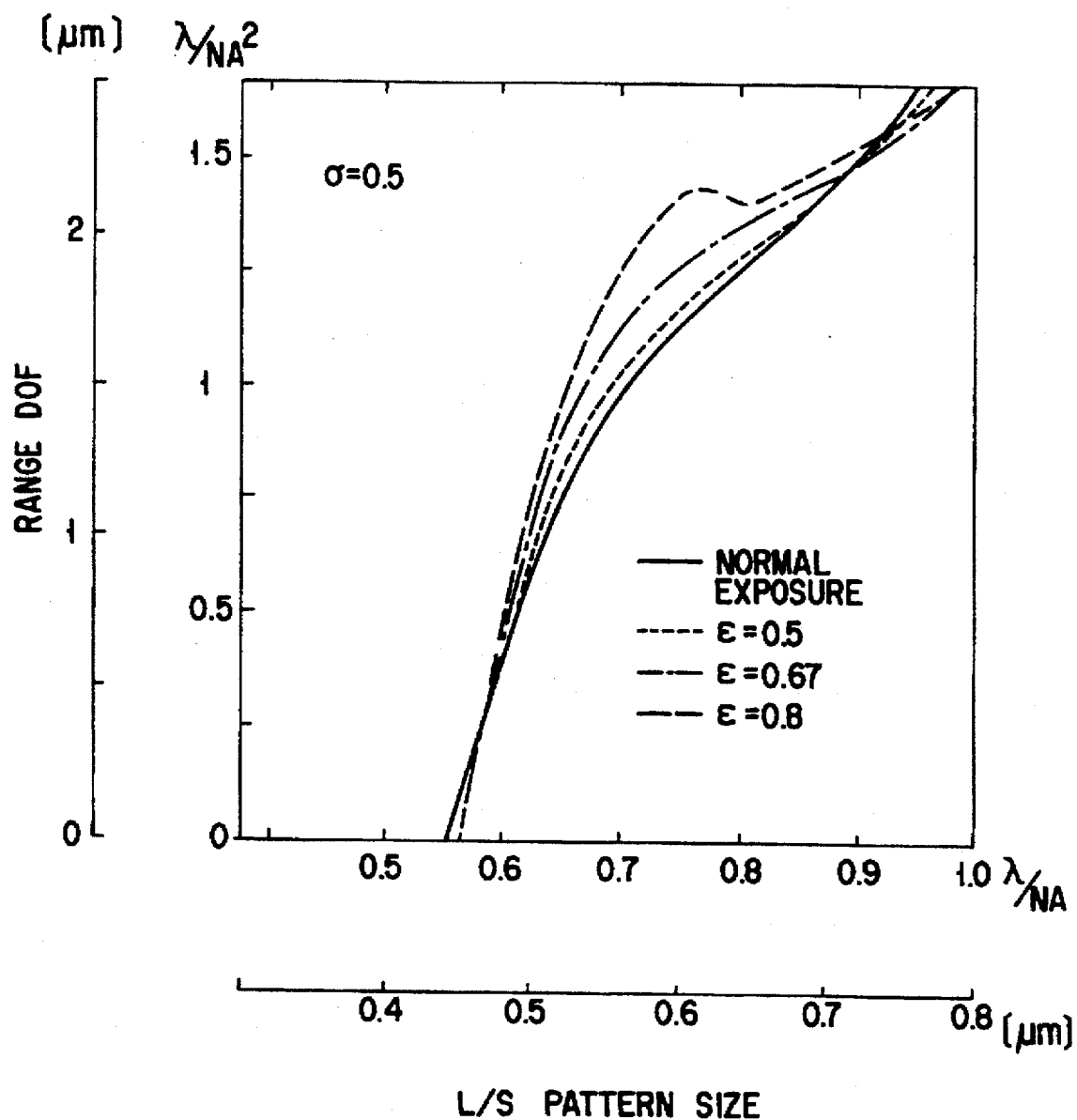
FIGS. 4(a) and 4(b) are graphs showing changes in secondary source intensity and pupil phase with respect to the distance from an optical axis in optimized functions S(r) and φ(r)

FIG. 4 shows the values S(r) and ϕ(r) optimized by the above-described method. The transmittance distribution of the special stop 9' and phase distribution of the pupil function which means the optical path length distribution of the filter 16' are set on the basis of this result. More specifically, the special stop 9' is set such that the transmittance at a central portion of the optical axis is almost constantly kept low, while the transmittance at a peripheral portion is high. The filter 16' is set such that the optical path length at the central portion of the optical axis is almost constantly kept small, while the optional path length at the peripheral portion is large. Note that, as shown in FIG. 5, the image intensity distribution at a defocus position of 0.5 μm in normal illumination (S(r)=1) and a normal pupil (t(r)=1; ϕ(r)=0) is regarded as the ideal (target) image intensity distribution Ii. The image intensity distribution at a defocus position of 1 μm is optimized. That is, the values S(r) and ϕ(r) are calculated to obtain a contrast at a defocus position of 1 μm, which contrast is close to the contrast at a defocus position of 0.5 μm in normal illumination and a normal pupil.

FIG. 6 shows a calculation result of focus margins with respect to pattern sizes in exposure with the above-mentioned values S(r) and ϕ(r). It is apparent from this graph that the depth of focus is increased, and the pattern size dependence is reduced.

As described above, according to this embodiment, since amplitude transmittance of the pupil function the projection optical system is 100%, the apparatus is free from one of the problems in the superflex method described with reference to the prior art, i.e., the problem that the filter absorbs exposure light to generate heat, and thermal expansion of the optical system is caused, resulting in a deterioration in transfer precision. In addition, as shown in FIG. 6, the dependence of the depth-of-focus increasing effect on pattern size is very low, the other of the problems in the superflex method is solved as well, and the depth-of-focus increasing effect is very large. According to the above description, t(r)=1 is set. However, the effect can be further enhanced by also optimizing the value t(r).

In the above embodiment, the contrast of the pattern with L/S=0.6 μm at a defocus position of 1 μm is optimized. However, optimization of contrast can be performed with respect to patterns having different sizes at arbitrary defocus position. In addition, optimization is performed with respect to L/S patterns. However, optimization can be performed with respect to arbitrary patterns such as isolated patterns and contact hole patterns. Furthermore, the cost function is not limited to the square of the difference between contrast C and optimal contrast Ci, but any proper cost functions may be used.

(G2 Embodiment)

Figure 7:
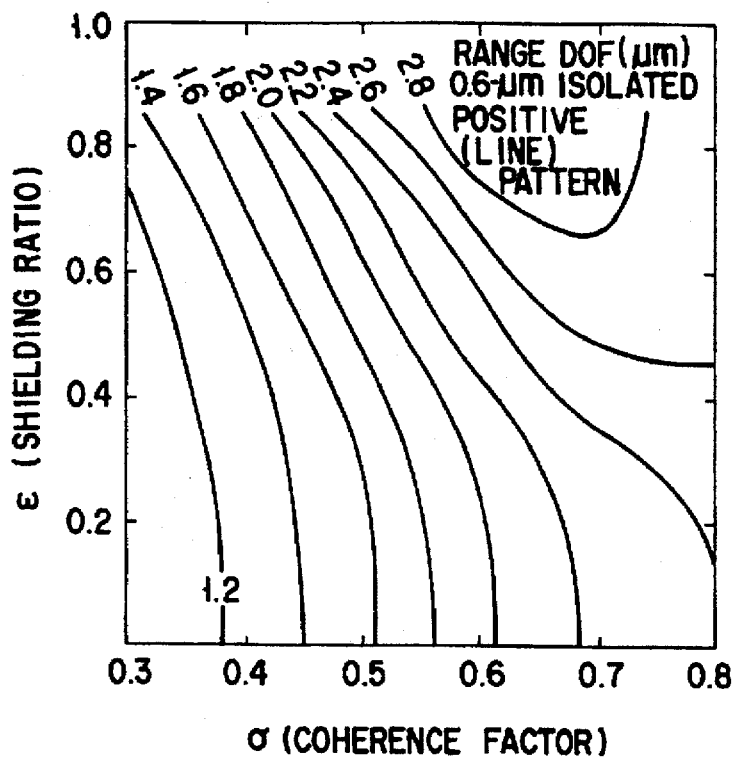
FIG. 7 is a flow chart showing an algorithm for optimizing a secondary source and a pupil function by using MTF as a cost function in the G2 embodiment.

The G2 embodiment of the present invention will be described below with reference to FIG. 7. FIG. 7 shows an algorithm for performing optimization by using an MTF (Modulation Transfer Function) as a cost function. The MTF is a function indicating the spatial frequency transfer characteristics of an optical system, specifically an amplitude at which a spatial frequency fx constituting a mask pattern can pass through the optical system.

The calculation procedure is almost the same as that the G1 embodiment except for the calculations in steps S3, S4, and S5. Therefore, only these steps will be described.

In step S3, MTF and M(fx) before and after the grain is given are calculated. Ideal (target) Mi(fx) is also calculated in advance.

In step S4, cost functions E and E' are calculated according to the following equations:

$$E = \int_0^{fc} (M(fx) - Mi(fx))^2 \, dfx$$

$$E' = \int_0^{fc} (M'(fx) - Mi(fx))^2 \, dfx$$

where M(fx) is the MTF calculated after the grain is given, M'(fx) is the MTF calculated before the grain is given, Mi(fx) is the ideal (target) MTF, and fc is the cutoff frequency.

In step S5, ΔE=E−E' is obtained. If ΔE<0, it indirectly indicates that the MTF calculated after the grain is given is closer to the ideal (target) MTF, and that the given grain locally contributes to a gradual approach to the optimal value. In contrast to this, if ΔE>0, it indicates that the given grain locally contributes to a departure from the optimal value.

Although the calculation amount is increased as compared with the G1 embodiment, since optimization is not performed with respect to a pattern having a specific size, the pattern size dependence of the transfer performance improving effect can be further reduced.

Note that the MTF is used as a cost function in this embodiment, but an OTF (Optical Transfer Function) may be used as a cost function instead.

When a layer to be exposed is mainly constituted by L/S patterns, the filters 9' and 16' (shown in FIG. 1) for providing the light source intensity distribution and the pupil function phase distribution shown in FIG. 4 may be inserted. However, when a contact hole layer or a layer mainly constituted by isolated patterns is to be transferred, optimal conditions may not be satisfied. In this case, at least one of the following distributions is optimized with respect to major mask patterns: the secondary source radial intensity distribution, the complex amplitude transmittance distribution of the mask, and the pupil function radial complex amplitude transmittance distribution of the projection optical system. The filters 9' and 16' are switched with each other for each layer to be transferred to change at least one of the following distributions: the secondary source radial intensity distribution, the complex amplitude transmittance distribution of the mask, and the pupil function radial complex amplitude transmittance distribution of the projection optical system.

(G3 Embodiment)

In a projection exposure apparatus of the G3 embodiment, which is designed to project/expose a mask pattern on a wafer through an projection optical system, a special stop is arranged as secondary source for illuminating a mask to set an intensity distribution within the exit plane of the secondary source such that a peripheral portion is higher in intensity than a central portion, and a filter is arranged at a pupil plane in the projection optical system to cause a relative delay or advance in phase of light passing through a peripheral portion of the pupil plane with respect to light passing through other portions.

If the radius of the secondary source is represented by L, a radius d of the central portion in which the secondary source intensity is low satisfies d≧0.5 L, while a low intensity Ic of the central portion and an intensity Ip of the peripheral portion satisfy Ic≦0.35 Ip. In addition, if the radius of the pupil is represented by H, a radial coordinate r of the pupil is a pupil function in which a region which causes a relative delay or advance of 130° or more in phase with respect to light passing through a region other than a region defined by 5H/7<r<6H/7 exists within the range defined by 5H/7<r<6H/7.

Figure 8:
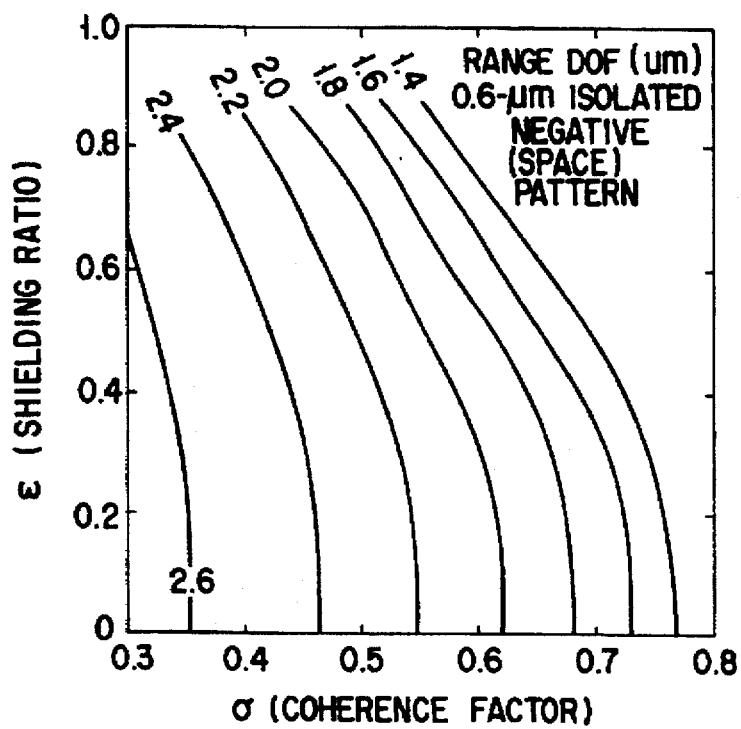
FIG. 8 is a graph showing an optimized function S(r) according to the G3 embodiment.
Figure 9A:
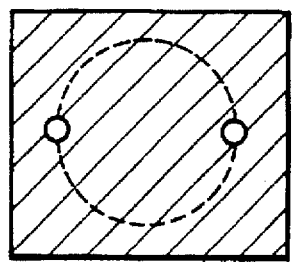
FIG. 9 is a graph showing an optimized function φ(r) according to the G3 embodiment.
Figure 9B:
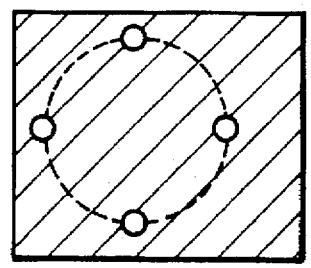
Figure 10:
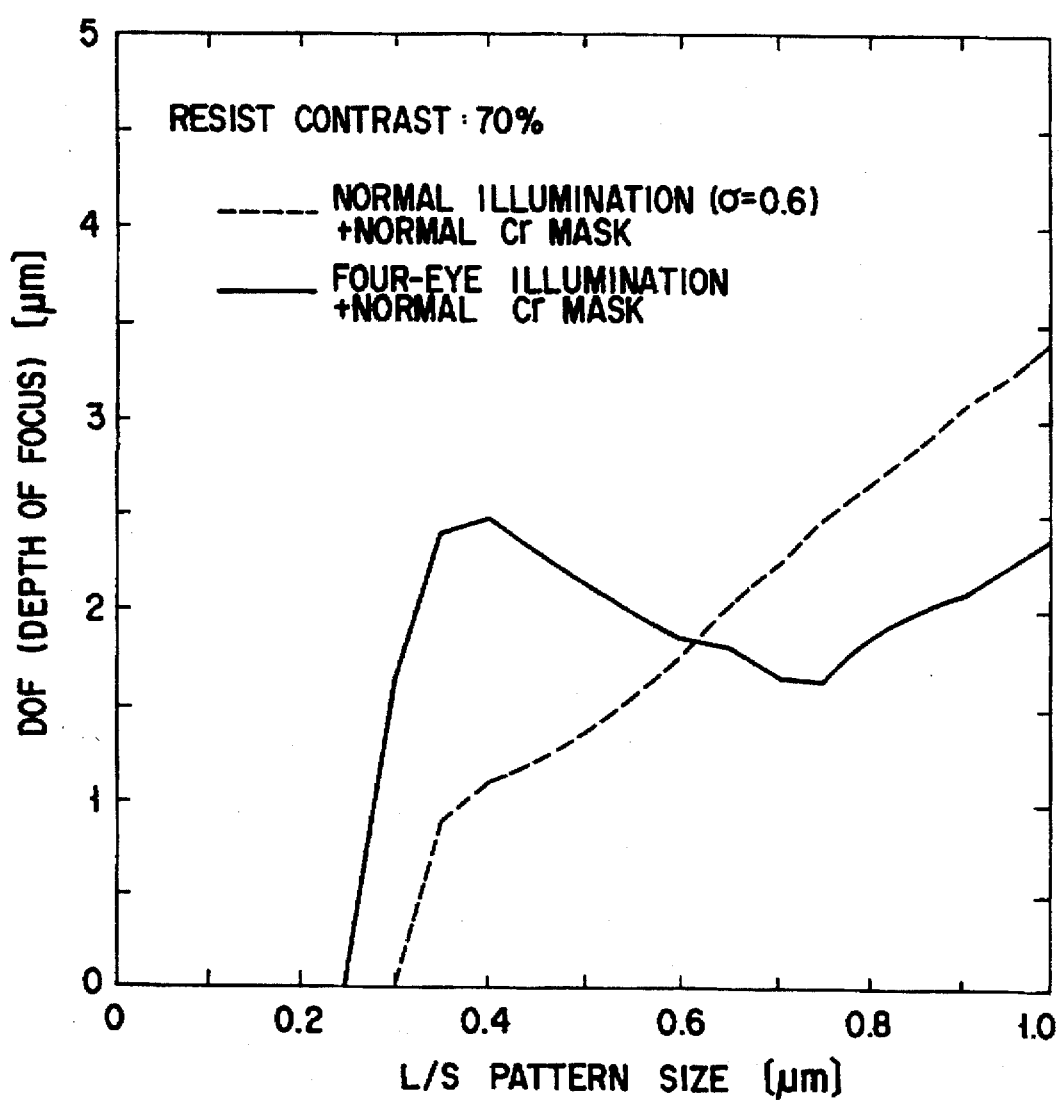
FIG. 10 is a graph showing a calculation result of image intensity profiles according to the G3 embodiment.

FIGS. 8 to 10 show the results obtained by this embodiment. FIG. 8 shows S(r) by the above-described method. FIG. 9 shows φ(r) optimized in the same manner.

A value t(r) is set to be 1 (constant). Note that optimization is performed to maximize the peak intensities of an image intensity distribution at a defocus amount of ±1 μm and in a just-in-focus state with respect to a mask pattern having a line width of 0.6 μm and a space width of 1.8 μm. (In addition, the NA of an exposure unit, a coherence factor e, and an exposure light wavelength λ are respectively set to be 0.54, 0.5, and 436 nm.)

FIG. 10 shows a calculation result of image intensity profiles in a normal exposure process and in an exposure process with the above-mentioned values S(r) and φ(r). In this graph, the solid curve indicates normal exposure; the short dash curve, exposure according to the embodiment using a normal Cr mask; and the long dash curve, exposure according to the embodiment using a halftone mask. As is apparent, according to the embodiment, the peak intensity of the image intensity profile is increased. In addition, it is found that if the halftone mask is used, the effect is enhanced.

(G4 Embodiment as First Modification)

In the 4 embodiment, if the radius of the pupil in the G3 embodiment is represented by H, a radial coordinate r of the pupil is a pupil function in which a region which causes a relative delay or advance of 130° or more in phase with respect to light passing through a region other than a region defined by 0≦r<H/7 and H/7<r<3H/7 exists within the range defined by 0≦r<H/7 and H/7<r<3H/7.

Figure 11:
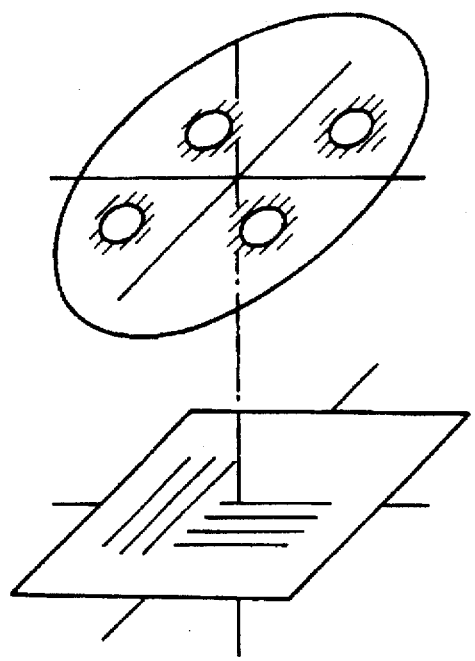
FIG. 11 is a graph showing an optimized function S(r) according to the G4 embodiment.
Figure 12:
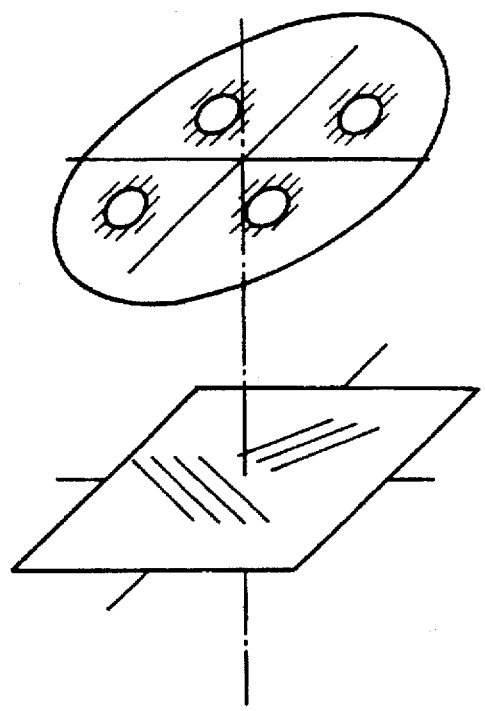
FIG. 12 is a graph showing an optimized function φ(r) according to the G4 embodiment.
Figure 13:
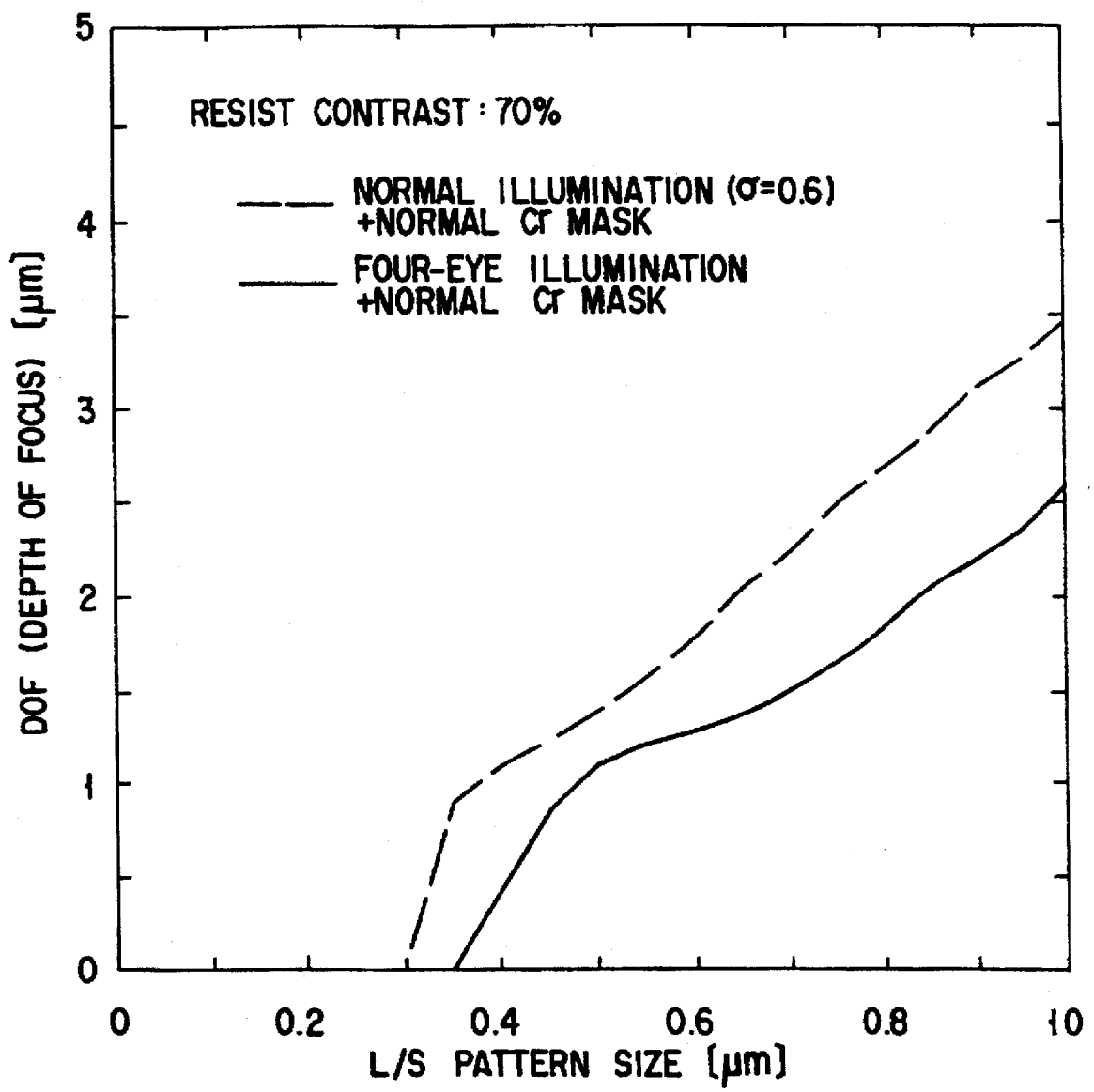
FIG. 13 is a graph showing a calculation result of focus margins according to the G4 embodiment.

FIGS. 11 to 13 show the results obtained by this embodiment. FIG. 11 shows S(r) optimized by using the above-described method. FIG. 12 shows φ(r) optimized in the same manner. A value t(r) is set to be 1 (constant). Note that optimization is performed to maximize the contrast values calculated from an image intensity distribution at a defocus amount of ±1 and in a just-in-focus state with respect to a mask pattern having an L/S=0.4 μm. (In addition, the NA of an exposure unit, a coherence factor e, and an exposure light wavelength λ are respectively set to be 0.54, 0.5, and 436 nm.)

FIG. 13 shows a calculation result of focus margins with respect to pattern sizes in exposure with the above-mentioned values S(r) and φ(r). In this graph, the short dash curve indicates normal exposure; the solid curve, exposure according to the embodiment using a normal Cr mask; and the long dash curve, exposure according to the embodiment using a halftone mask. According to the embodiment, the depth of focus is increased as compared with a normal exposure process. In addition, it is apparent that if the halftone mask is used the effect is enhanced. With the above-mentioned NA and exposure light wavelength, since the line width defined by L/S=0.4 μis close to the resolution limit, if optimization is performed to maximize the depth of focus of this line width, the limit resolving power is also increased.

(G5 Embodiment as Second modification)

In the G5 embodiment, if the radius of the pupil in the G3 embodiment is represented by H, a radial coordinate r of the pupil is a pupil function in which a region which causes a relative delay or advance of 130° or more in phase with respect to light passing through a region other than a region defined by $0 \leq r < H/7$ and $H/7 < r$ exists within the range defined by $0 \leq r < H/7$ and $H/7 < r$.

Figure 14:
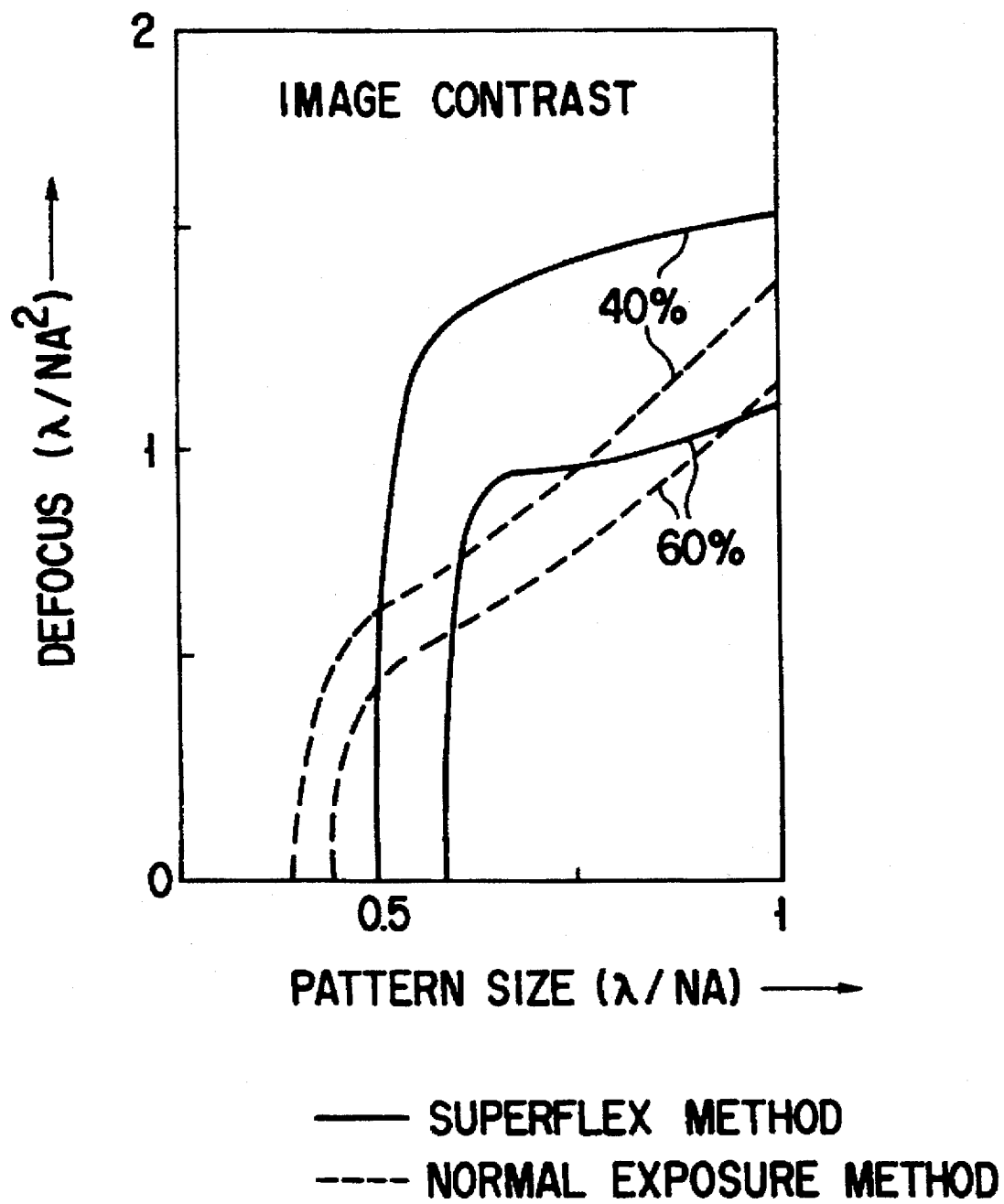
FIG. 14 is a graph showing an optimized function S(r) according to the G5 embodiment.

FIGS. 14 to 16 show the results obtained by this embodiment. FIG. 14 shows S(r) optimized by using the above-described method. FIG. 15 shows $\phi(r)$ optimized in the same manner. A value t(r) is set to be 1 (constant). Note that optimization is performed to cause dark portions of an image intensity distribution at a defocus amount of ±1 and in a just-in-focus state with respect to a mask pattern having an L/S=0.4 μm to approximate to 0. The approximation of the dark portions of this image intensity distribution to 0 is almost equivalent to maximization of the contrast. (In addition, the NA of an exposure unit, a coherence factor σ, and an exposure light wavelength λ are respectively set to be 0.5, 1.0, and 436 μm.)

FIG. 16 shows a calculation result of focus margins with respect to pattern sizes in exposure with the above-mentioned values S(r) and $\phi(r)$. In this graph, the short dash curve indicates normal exposure; the solid curve, exposure according to the embodiment using a normal Cr mask; and the long dash curve, exposure according to the embodiment using a halftone mask. According to the embodiment, the depth of focus is increased as compared with a normal exposure process. In addition, it is apparent that if the halftone mask is used, the effect is enhanced. With the above-mentioned NA and exposure light wavelength, since the line width defined by L/S=0.4 μm is close to the resolution limit, if optimization is performed to maximize the depth of focus of this line width, the limit resolving power is also increased.

(G6 Embodiment)

According to the G6 embodiment, in a projection exposure apparatus for projecting/exposing a mask pattern on a wafer through a projection optical system, the pupil function of the projection optical system is set such that the phase of light passing through a peripheral portion of the pupil plane is delayed or advanced relative to the phase of light passing through a portion other than the peripheral portion. If the radius of the pupil is represented by H, a radial coordinate r of the pupil is a pupil function in which a region which causes a relative delay or advance of 130° or more in phase with respect to light passing through a region defined by $r \leq 6H/7$ exists within the range defined by $r \leq 6H/7$.

Figure 17:
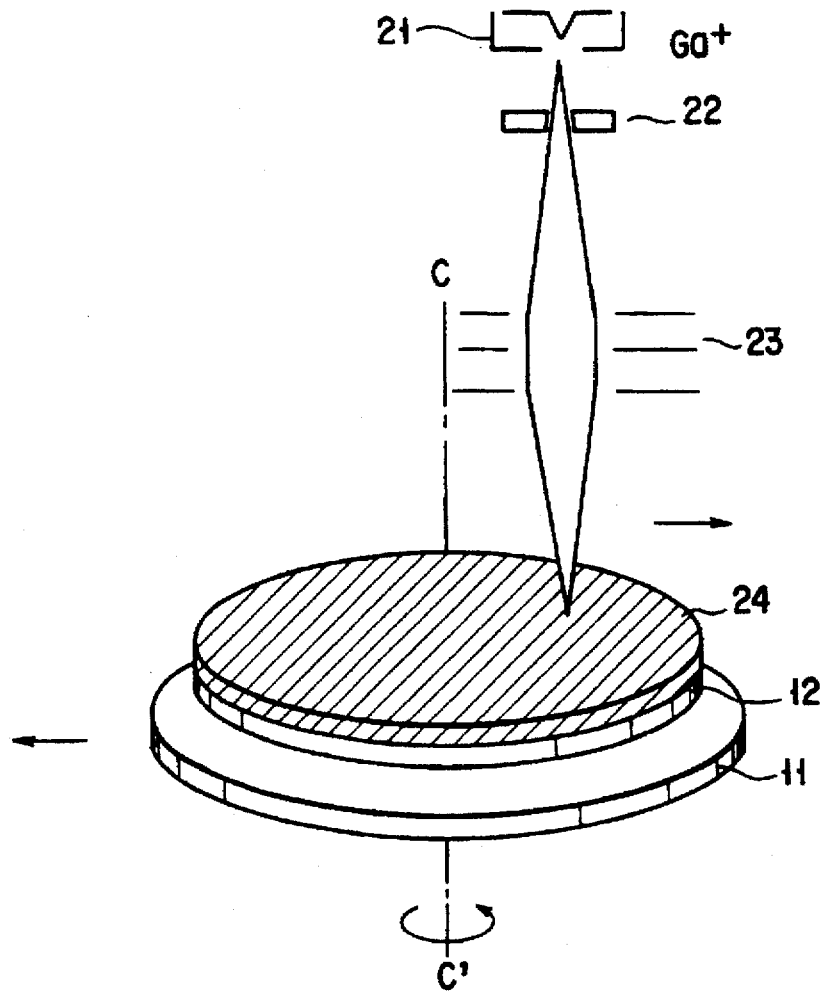
FIG. 17 is a graph showing an optimized function φ(r) according to the G6 embodiment.
Figure 18:
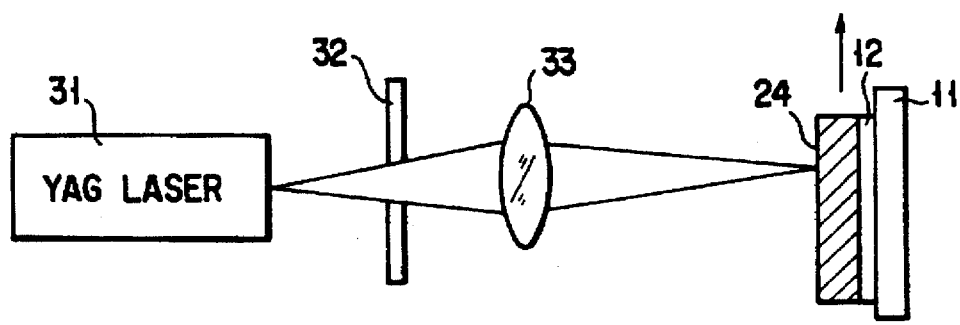
FIG. 18 is a graph showing a calculation result of focus margins according to the G6 embodiment.

FIGS. 17 and 18 show the effects of this embodiment. FIG. 17 shows $\phi(r)$ optimized by using the above-described method. A value t(r) is set to be 1 (constant). Note that optimization is performed to cause a dark portion of an image intensity distribution at a defocus amount of ±1 with respect to a mask pattern having an L/S=0.6 μm to approximate to 0. The approximation of the dark portion of this image intensity distribution to 0 is almost equivalent to maximization of the contrast. (In addition, the NA of an exposure unit, a coherence factor e, and an exposure light wavelength λ are respectively set to be 0.54, 0.5, and 436 nm.)

FIG. 18 shows a calculation result of focus margins with respect to pattern sizes in exposure with the above-mentioned value $\phi(r)$. In this graph, the short dash curve indicates normal exposure; the solid curve, exposure according to the embodiment using a normal Cr mask; and the alternate long and short dash curve, exposure according to the embodiment using a halftone mask. According to the embodiment, the depth of focus is increased as compared with a normal exposure process. In addition, it is apparent that if the halftone mask is used, the effect is enhanced. That is, the embodiment is characterized in that the pattern size dependence of the depth-of-focus increasing effect is very low.

(G7 Embodiment as Third Modification)

In the G7 embodiment, if the radius of the pupil in the G6 embodiment is represented by H, a radial coordinate r of the pupil is a pupil function in which a region which causes a relative delay or advance of 130° or more in phase with respect to light passing through a region other than a region defined by $5H/7 \leq r < 6H/7$ exists within the range defined by $5H/7 \leq r < 6H/7$.

Figure 19:
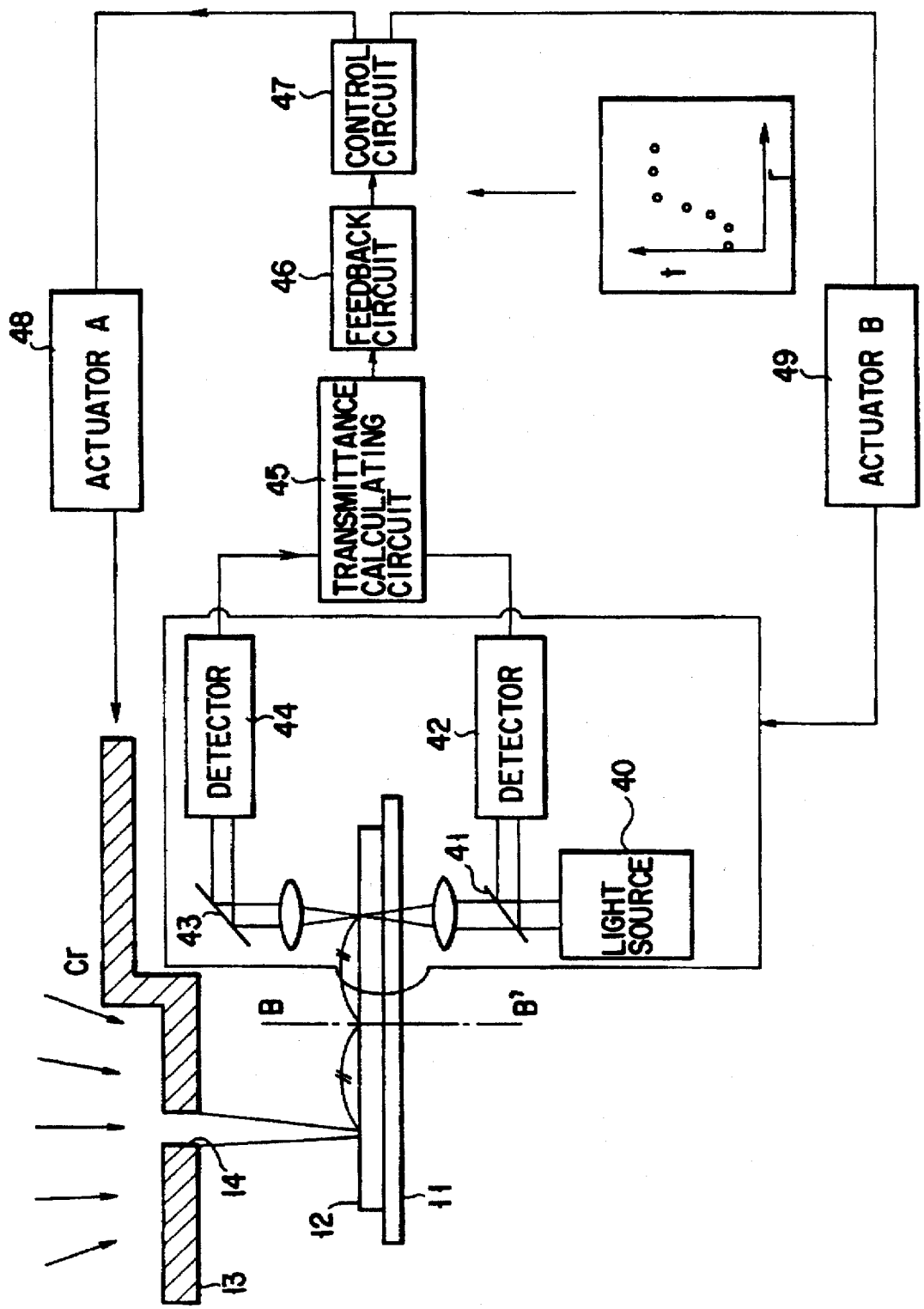
FIG. 19 is a graph showing an optimized function φ(r) according to the G7 embodiment.
Figure 21A:
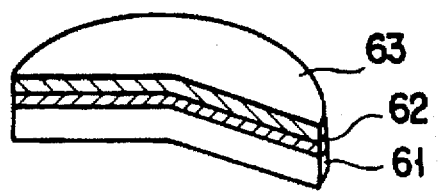
FIG. 21 is a graph showing an optimized function φ(r) according to the G8 embodiment.
Figure 21B:
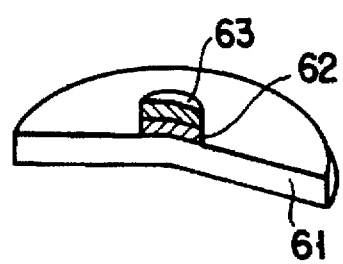
Figure 21C:
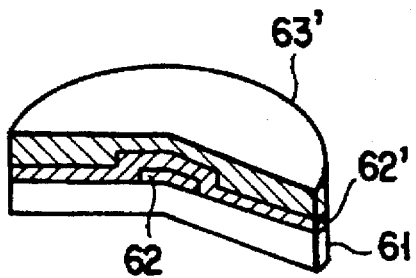
Figure 21D:
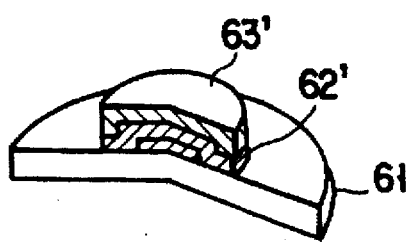
Figure 21E:
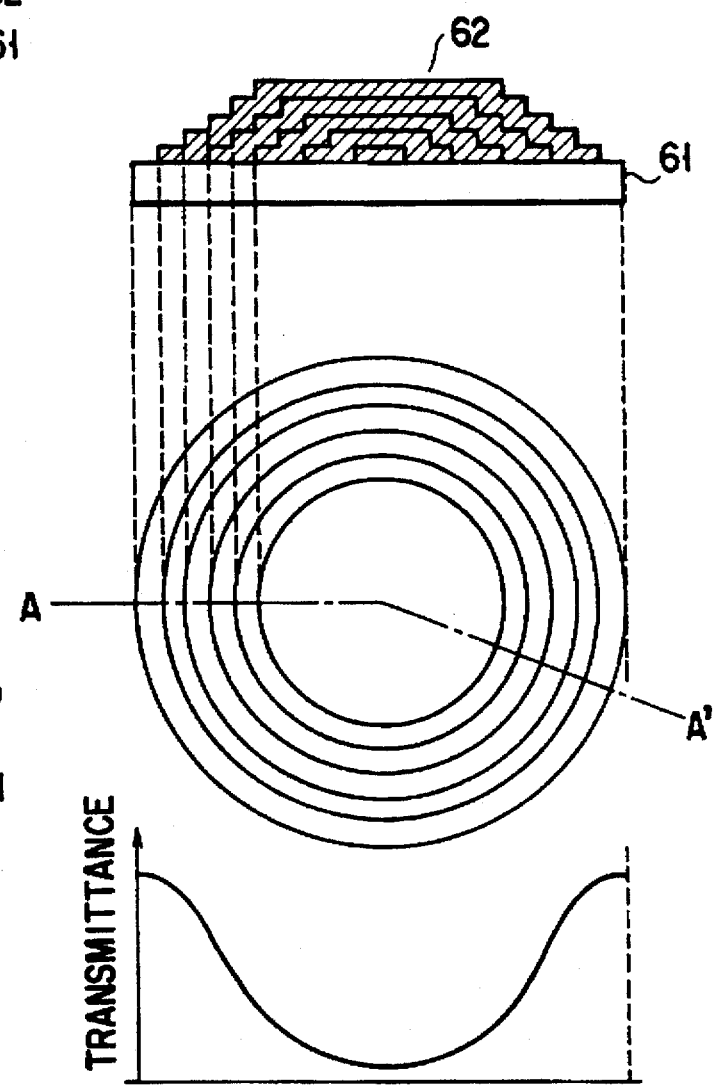

FIGS. 19 and 20 show the effects of this embodiment. FIG. 19 shows $\phi(r)$ optimized by using the above-described method. A value t(r) is set to be 1 (constant). Note that optimization is performed to maximize the peak intensities of an image intensity distribution at a defocus amount of ±1 μm and in a just-in-focus state with respect to a mask pattern having a line width of 0.6 μm and a space width of 1.8 μm. (In addition, the NA of an exposure unit, a coherence factor σ, and an exposure light wavelength λ are respectively set to be 0.54, 0.5, and 436 nm.)

FIG. 20 shows a calculation result of image intensity profiles in a normal exposure process and in an exposure process with the above-mentioned values S(r) and $\phi(r)$. In this graph, the solid curve indicates normal exposure; the short dash curve, exposure according to the embodiment using a normal Cr mask; and the long dash curve exposure according to the embodiment using a halftone mask. As is apparent, according to the embodiment, the peak intensity of the image intensity profile is increased. In addition, it is found that if the halftone mask is used, the effect is enhanced.

(G8 Embodiment as Fourth Modification)

In the G8 embodiment, if the radius of the pupil in the G6 embodiment is represented by H, a radial coordinate r of the pupil is a pupil function in which a region which causes a relative delay or advance of 130° or more in phase with respect to light passing through a region other than a region defined by $0 \leq r < H/7$ and $H/7 \leq r < 3H/7$ exists within the range defined by $0 \leq r < H/7$ and $H/7 \leq r < 3H/7$.

FIGS. 21 and 22 show the effects of this embodiment. FIG. 21 shows $\phi(r)$ optimized by using the above-described method. A value t(r) is set to be 1 (constant). Note that optimization is performed to maximize the contrast calculated from an image intensity distribution at a defocus amount of ±1 μm and in a just-in-focus state with respect to a mask pattern having L/S=0.4 μm. (In addition, the NA of an exposure unit, a coherence factor e, and an exposure light wavelength λ are respectively set to be 0.54, 0.5, and 436 nm.)

FIG. 22 shows a calculation result of focus margins with respect to pattern sizes in exposure with the above-mentioned value $\phi(r)$. In this graph, the short dash curve indicates normal exposure, the solid curve exposure according to the embodiment using a normal Cr mask; and the long dash curve, exposure according to the embodiment using a halftone mask. According to the embodiment, the depth of focus is increased as compared with a normal exposure process. In addition, it is apparent that if the halftone mask is used, the effect is enhanced. In this graph, the solid curve indicates normal exposure; the short dash curve, exposure according to the embodiment using a normal Cr mask; and the long dash curve, exposure according to the embodiment using a halftone mask. As is apparent, according to the embodiment, the depth of focus is increased as compared with a normal exposure process. In addition, it is found that if the halftone mask is used, the effect is enhanced. According to the G8 embodiment, since the amplitude transmittance of the pupil function is 100%, the apparatus is free from one of the conventional problems posed in the conventional superflex method, i.e., the problem that the filter absorbs exposure light to generate heat, and thermal expansion of the optical system occurs, resulting in a deterioration in transfer precision. With the above-mentioned NA and exposure light wavelength, since the line width defined by L/S=0.4 µm is close to the resolution limit, if optimization is performed to maximize the depth of focus of this line width, the limit resolving power is also increased.

(G9 Embodiment as Fifth Modification)

In the 9 embodiment, if the radius of the pupil in the G6 embodiment is represented by H, a radial coordinate r of the pupil is a pupil function in which a region which causes a relative delay or advance of 130° or more in phase with respect to light passing through a region other than a region defined by $0 \leq r < H/7$ and $H/7 < r$ exists within the range defined by $0 \leq r < H/7$ and $H/7 < r$.

Figure 23:
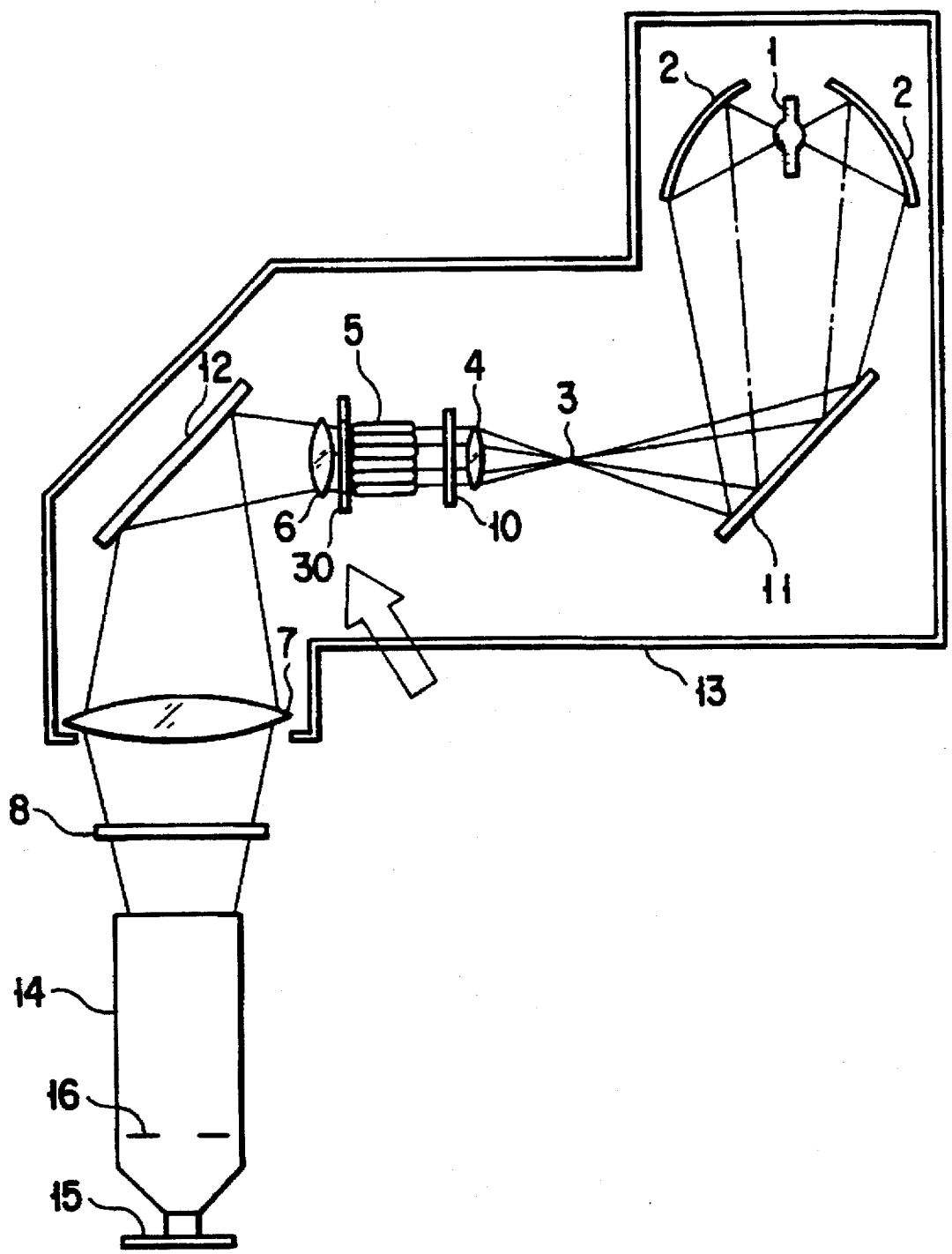
FIG. 23 is a graph showing an optimized function φ(r) according to the G9 embodiment.
Figure 31:
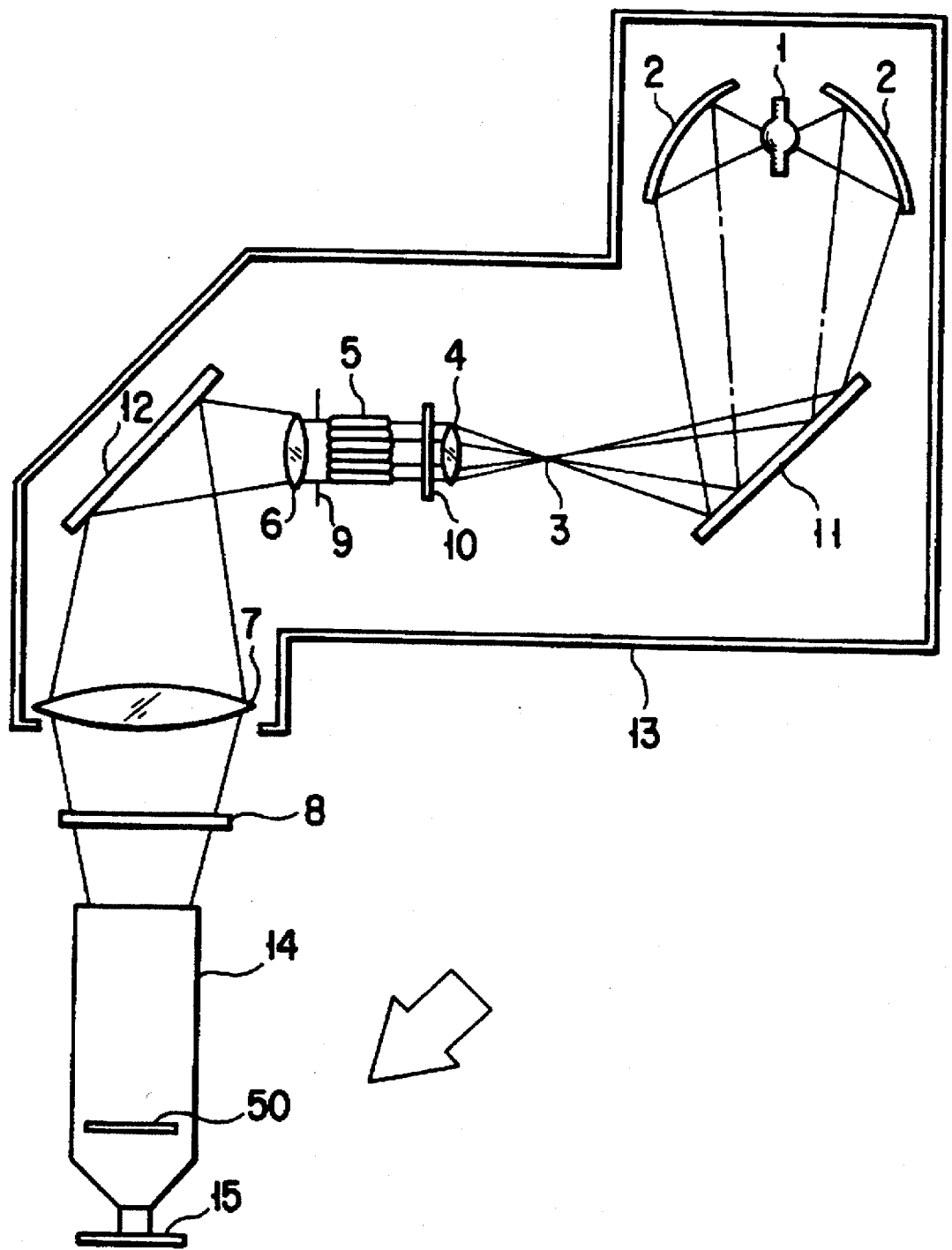
FIGS. 31(a) to 31(c) are views showing the typical cross-sectional structure of a shifter edge type phase shift mask.

FIGS. 23 and 24 show the effects of this embodiment. FIG. 23 shows $\phi(r)$ optimized by using the above-described method. A value t(r) is set to be 1 (constant). Note that optimization is performed to cause dark portions of an image intensity distribution at a defocus amount of ±1 and in a just-in-focus state with respect to a mask pattern having an L/S=0.4 µm to approximate to 0. The approximation of the dark portion of this image intensity distribution to 0 is almost equivalent to maximization of the contrast. (In addition, the NA of an exposure unit, a coherence factor e, and an exposure light wavelength $\lambda$ are respectively set to be 0.54, 1.0, and 436 nm.)

FIG. 24 shows a calculation result of focus margins with respect to pattern sizes in exposure with the above-mentioned value $\phi(r)$. In this graph, the short dash curve indicates normal exposure; the solid curve, exposure according to the embodiment using a normal Cr mask; and the alternate long and short dash curve, exposure according to the embodiment using a halftone mask. According to the embodiment, the depth of focus is increased as compared with a normal exposure process. In addition, it is apparent that if the halftone mask is used, the effect is enhanced.

According to the G8 embodiment, since the amplitude transmittance of the pupil function is 100%, the apparatus is free from one of the conventional problems posed in the conventional superflex method, i.e., the problem that the filter absorbs exposure light to generate heat, and thermal expansion of the optical system occurs, resulting in a deterioration in transfer precision. With the above-mentioned NA and exposure light wavelength, since the line width defined by L/S=0.4 µm is close to the resolution limit, if optimization is performed to maximize the depth of focus of this line width, the limit resolving power is also increased.

In the respective embodiments, in order to increase the depth of focus, the light source intensity distribution and the pupil function are optimized. In addition to this purpose, optimization can be performed to increase other estimation values such as the limit resolving power and the dimensional precision.

In the above embodiments, the simulated annealing method is used as an optimization algorithm. However, the present invention is not limited to this. Any proper optimization algorithm, e.g., a DLS (Dumpedleast Square) method, a GA (Genetic Algorithm), or a Simplex method, may be used.

In the above embodiments, the radial intensity distribution S(r) of the secondary source and the pupil function radial complex amplitude transmittance distributions t(r) and $\phi(r)$ are optimized after the NA (numerical aperture) of the projection optical system and the e value (coherence factor) of the illumination system are determined. However, the NA of the projection optical system, the $\sigma$ value of the illumination system, and the complex amplitude transmittance distribution of a reticle pattern may be additionally optimized. In addition, as a mask, a phase shift mask such as a Levenson type phase shift mask, a halftone mask, or a self-alignment type phase shift mask may be used.

The method of the present invention based on the above-described embodiments can improve not only the transfer performance of a projection optical system used for the manufacture of semiconductor devices but also the performance of all types of optical apparatuses such as an optical microscope and an optical drawing apparatus, which are mainly constituted by partial coherent optical systems.

(Additional Embodiment)

(X Embodiment)

Figure 68:
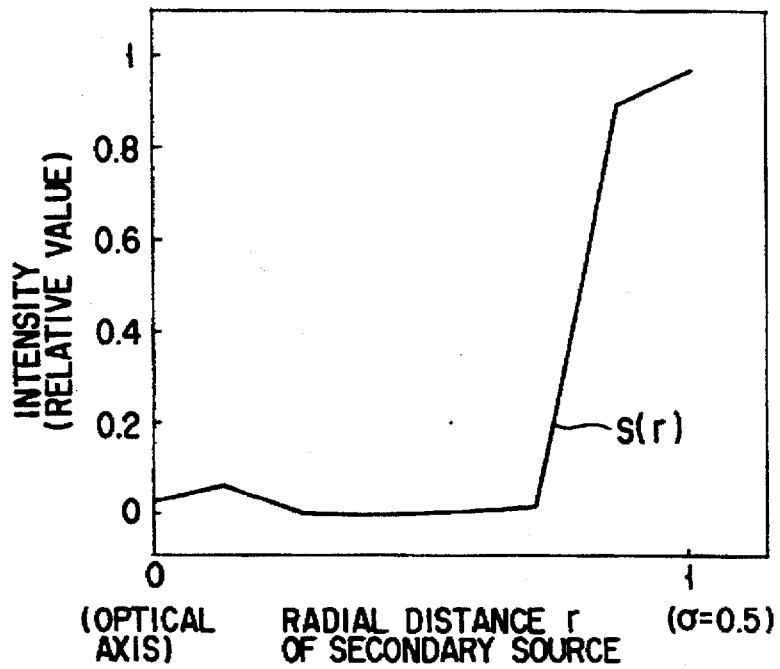
FIG. 68 is a schematic view showing the arrangement of a projection exposure apparatus according to the X embodiment.
Figure 73:
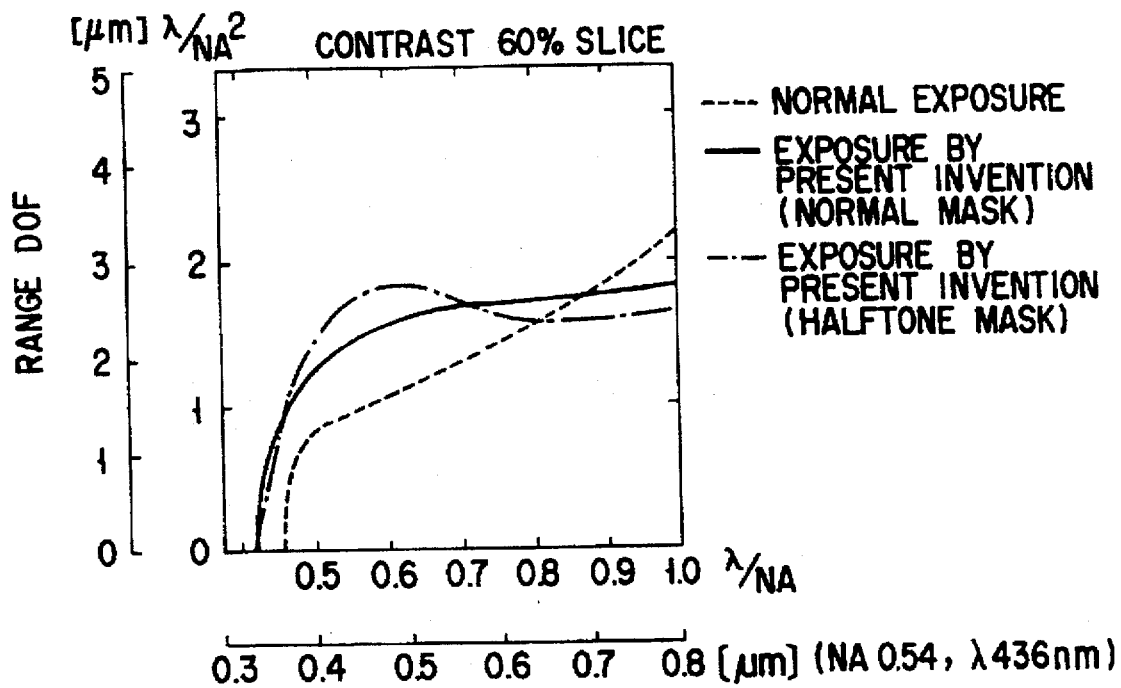
FIG. 73 is a graph showing the relationship between the pattern size and the depth of focus in the first conventional scheme.
Figure 74:
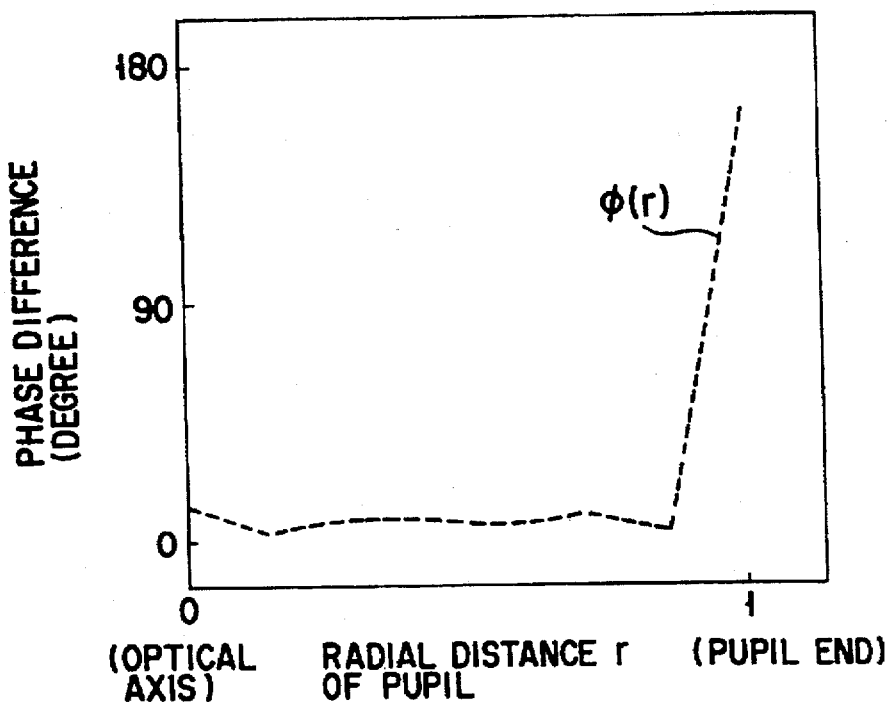
FIG. 74(a) and 74(b) are schematic view showing a conventional light source modulation filter and a graph showing the transmittance distribution in the radial direction of the filter.
Figure 75:
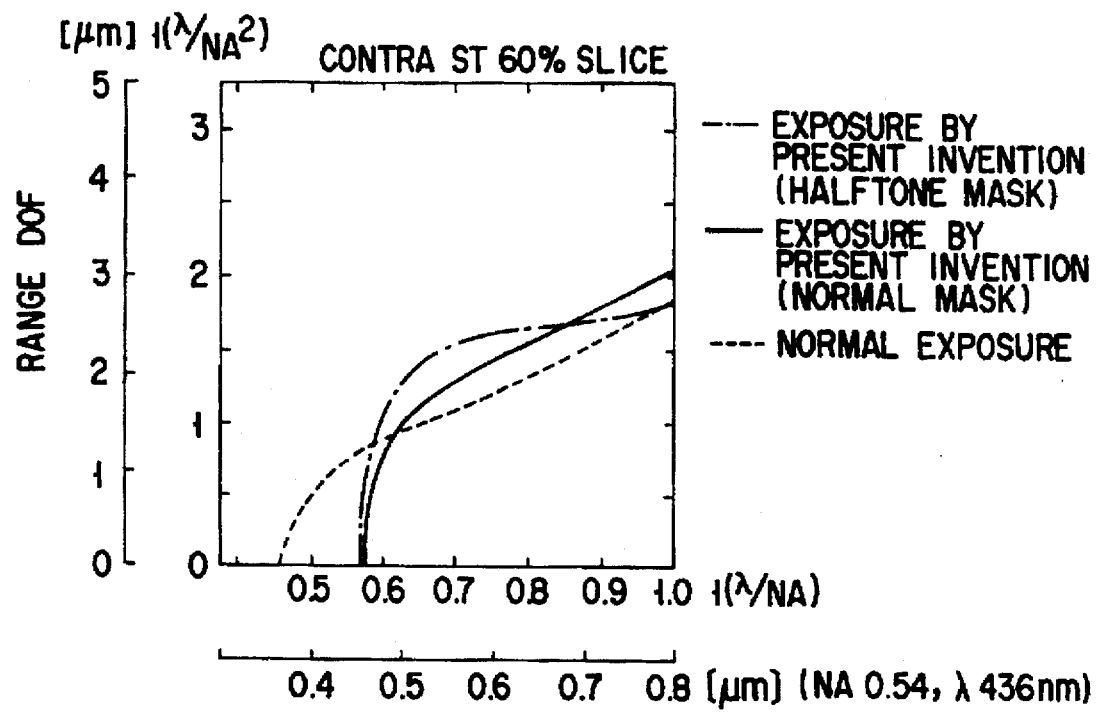
FIG. 75 is a graph showing the dependence of the DOF value of an L/S pattern on the σ and ε values.
Figure 76:
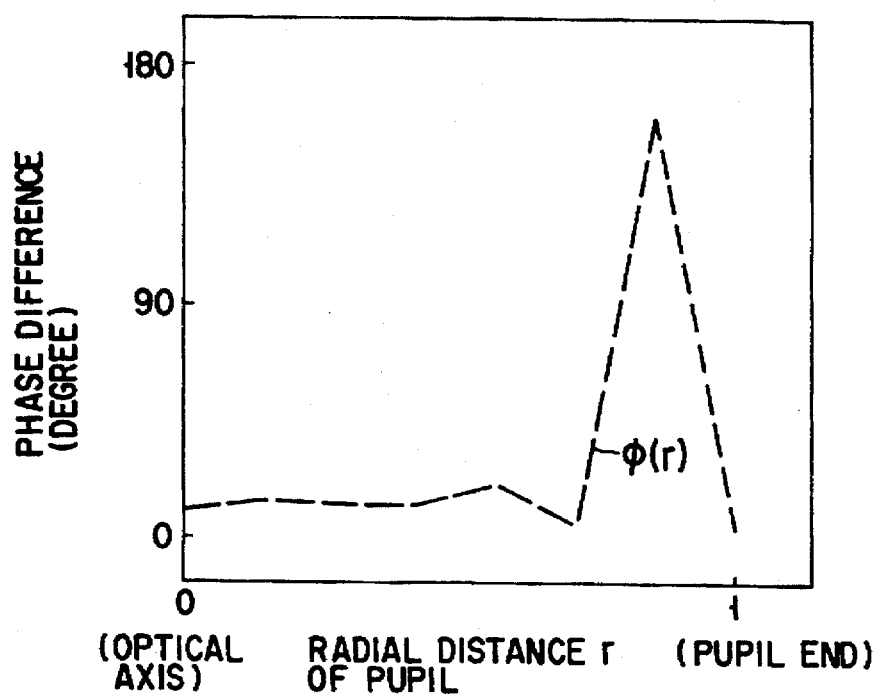
FIG. 76 is a graph showing the dependence of the DOF value of an isolated positive pattern on the σ and ε values.
Figure 79:
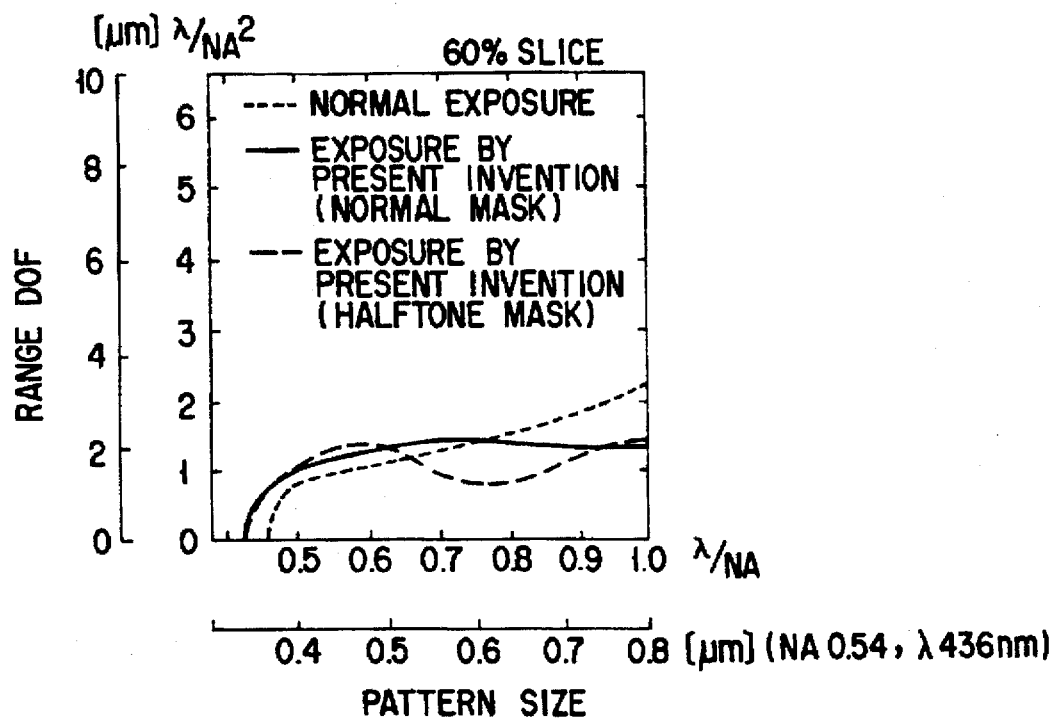
FIG. 79 is a graph showing the relationship between the pattern size and the depth of focus in the conventional apparatus.
Figure 80:
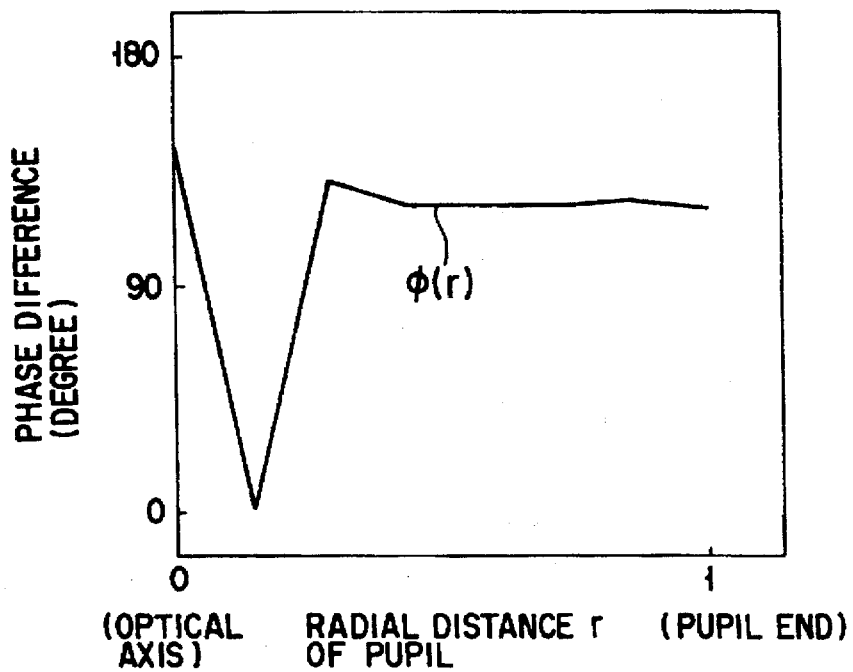
FIG. 80 is a view showing the relationship between a four-eye filter and the direction of an L/S pattern.

FIG. 68 shows the arrangement of a main part of a projection exposure apparatus according to the X embodiment of the present invention. As shown in FIG. 68, the main part of this apparatus is constituted by a lamp (light source) 1, an elliptic reflecting mirror 2, cold mirrors 11 and 12, an input lens 4, an optical integrator 5, an output lens 6, a collimation lens 7, a reticle 8, light source modulation filters 9, a revolver type holder 21 on which the filters 9 are mounted, projection optical lenses 14, a pupil 22 of a projection optical system, a wafer 15 on which an image of the reticle 8 is transferred, spatial frequency filters (pupil filters) 23, a revolver type holder 17 on which the pupil filters 23 are mounted, a read unit 27 for reading information (e.g., bar code information 28) through an optimal one of the light source modulation filters 9 and an optimal one of the pupil filters 23 for the transfer of the reticle pattern, a drive portion 24 for exchanging the light source modulation filters 9, a drive portion 25 for exchanging the pupil filters 23, and a filter selection operating means 26 for generating switching commands to the drive portions 24 and 25 to set optimal filters on the basis of a signal from the read unit 17. The arrangement of the projection exposure apparatus is characterized by the projection optical system (14, 21, 22, ...). More specifically, the pupil 22 of the projection optical system is arranged outside the projection optical lenses 14 so as to allow one of the pupil filters 23 to be set at the pupil position. If, for example, the resolving power and the depth of focus required for the reticle 8 are to be selected to maximize the depth of focus at L/S=0.743 (a size normalized by ramuda/NA), filters which form a secondary source intensity distribution and a pupil phase distribution shown in FIG. 63 may be set. If a reticle demands a resolving power up to L/S=0.5 (a size normalized by ramuda/NA), the light source modulation filter 9 and the pupil filter 23 must be replaced with a normal illumination filter and an aperture stop having a normal NA. In addition, optimal light source modulation filters for a desired pattern size and a pattern type are preferably set upon an exchange operation. In this case, by scanning the filter selection operating means 26, the revolver type holders 21 and 17 are operated to set the light source modulation filter and the pupil filter for a normal exposure state or those optimized for each reticle. In this case, information indicating specific filters used for a specific reticle is recorded as the bar code information 28 or the like in advance so that optimal filters can be automatically set upon replacement of a reticle. With this arrangement, the operation throughput is improved, and hence better effects can be expected. Furthermore, the means for selecting optimal filters is not limited to the bar code scheme, but other identification methods may be used. In the above embodiment, the revolver scheme is exemplified as a filter exchanging means. However, other types of exchanging means such as those shown in FIGS. 69(a) and 69(b) may be used.

As has been described in detail above, according to the X embodiment, there is provided a projection exposure apparatus having a mechanism capable of holding light source modulation filters and spatial frequency filters (pupil filters) and exchanging optimal filters in accordance with a desired pattern, thereby maximizing the depth-of-focus and resolving power increasing effect obtained by light source modulation techniques and pupil modulation techniques such as the PCL exposure method and the superflex method. Consequently, the exposure precision can be improved.

According to the present invention described in detail above, in order to obtain a desired depth of focus with respect to a desired pattern size, at least the secondary source radial intensity distribution of a projection optical system, the radial complex amplitude transmittance distribution of a mask, or the pupil function radial complex amplitude transmittance distribution of the projection optical system is optimized. Therefore, the depth of focus and the pattern resolution performance can be optimized, and the exposure precision can be improved.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A filter manufacturing apparatus for manufacturing a filter to be used in a projection exposure apparatus, said filter manufacturing apparatus comprising:

a holder for holding a substrate;

holder rotating means for rotating said holder;

designate means for designating a radiation portion on a surface of the substrate;

processing means for processing on the radiation portion designated by said designate means; and control means for controlling said designate means in order to form a film thickness distribution a translucent film on the substrate.

2. A filter manufacturing apparatus according to claim 1, wherein the substrate held by said holder is transparent to exposure light, said processing means supplies a sputtered material to the substrate, said designate means includes a shielding member arranged between said substrate and said holder, having an aperture in a portion thereof which transmits the sputtered material, and designed to be movable in a radial direction of said holder, and said control means controls said designating means to form a film thickness distribution of a translucent film on said substrate, which corresponds to a desired transmittance distribution or phase distribution.

3. The filter manufacturing apparatus according to claim 2, further comprising:

film thickness monitor means for monitoring a supply position of the sputtered material supplied to said substrate or a thickness of the translucent film at the same radial position as the radiation position of the energy beam; and film thickness comparing means for comparing a monitored film thickness with a preset film thickness corresponding to a monitored position;

wherein said control means includes variable position setting means for variably setting the supply position or the radiation position on the basis of the comparison result.

4. A filter manufacturing apparatus according to claim 1, wherein the substrate held by said holder is transparent to exposure light, and has a thin film translucent to the exposure light formed thereon, said processing means includes thin film etching means for etching the thin film on said substrate by radiating an energy beam, said designate means includes beam detection for a radiation position of the energy beam in a radial direction of said holder, and said control means controls the radiation position of the energy beam to form a film thickness distribution of a translucent film on said substrate, which corresponds to a desired transmittance distribution or phase distribution.

5. The filter manufacturing apparatus according to claim 4, further comprising:

film thickness monitor means for monitoring a supply position of the sputtered material supplied to said substrate or a thickness of the translucent film at the same radial position as the radiation position of the energy beam, wherein said control means includes variable position setting means for variably setting the supply position or the radiation position on the basis of the comparison result.

* * * * *